(12) United States Patent
Cameron et al.

(10) Patent No.: US 7,464,317 B2
(45) Date of Patent: *Dec. 9, 2008

(54) DECODING LDPC (LOW DENSITY PARITY CHECK) CODE AND GRAPHS USING MULTIPLICATION (OR ADDITION IN LOG-DOMAIN) ON BOTH SIDES OF BIPARTITE GRAPH

(75) Inventors: Kelly Brian Cameron, Irvine, CA (US); Ba-Zhong Shen, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/807,388

(22) Filed: May 29, 2007

(65) Prior Publication Data

US 2007/0260944 A1    Nov. 8, 2007

Related U.S. Application Data

(63) Continuation of application No. 10/865,556, filed on Jun. 10, 2004, now Pat. No. 7,243,287.

(60) Provisional application No. 60/567,571, filed on May 3, 2004.

(51) Int. Cl.
*H03M 13/00* (2006.01)
(52) U.S. Cl. .................... 714/755; 714/796; 714/786; 714/752
(58) Field of Classification Search .......... 714/790–792, 714/796, 786, 752, 755; 375/265, 295, 298, 375/316, 279, 308, 329
See application file for complete search history.

(56) References Cited

U.S. PATENT DOCUMENTS

| 7,243,287 B2 * | 7/2007 | Cameron et al. ............ 714/752 |
| 2003/0074626 A1 * | 4/2003 | Coker et al. ................ 714/752 |
| 2004/0034827 A1 * | 2/2004 | Shen et al. .................. 714/758 |
| 2004/0252791 A1 * | 12/2004 | Shen et al. .................. 375/340 |

OTHER PUBLICATIONS

Hai-Gang Zhang; Dong-Feng Yuan; Pi-Ming Ma; Xiu-Mei Yang, "Low-density parity-check code (LDPC) schemes with BICM," Communication Technology Proceedings, 2003. ICCT 2003. International Conference on vol. 2, Issue , Apr. 9-11, 2003, pp. 1148-1151 vol. 2.

Jian Sun, "An Introduction to Low Density Parity Check (LDPC) Codes," WCRL Seminar Series, West Virginia University, Jun. 3, 2003, pp. 1-21.

* cited by examiner

*Primary Examiner*—Guy J Lamarre
(74) *Attorney, Agent, or Firm*—Garlick Harrison & Markison; Shayne X. Short

(57) ABSTRACT

Decoding LDPC (Low Density Parity Check) code and graphs using multiplication (or addition in log-domain) on both sides of bipartite graph. Decoding of LDPC coded signals is presented whereby edge messages may be updated using only multiplication (or log domain addition). By appropriate modification of the various calculations that need to be performed when updating edge messages, the calculations may be reduced to only performing product of terms functions. When implementing such functionality in hardware within a communication device that is operable to decode LDPC coded signals, this reduction in processing complexity greatly eases the actual hardware's complexity as well. A significant savings in processing resources, memory, memory management concerns, and other performance driving parameters may be made.

20 Claims, 34 Drawing Sheets

HDTV (High Definition Television) communication system

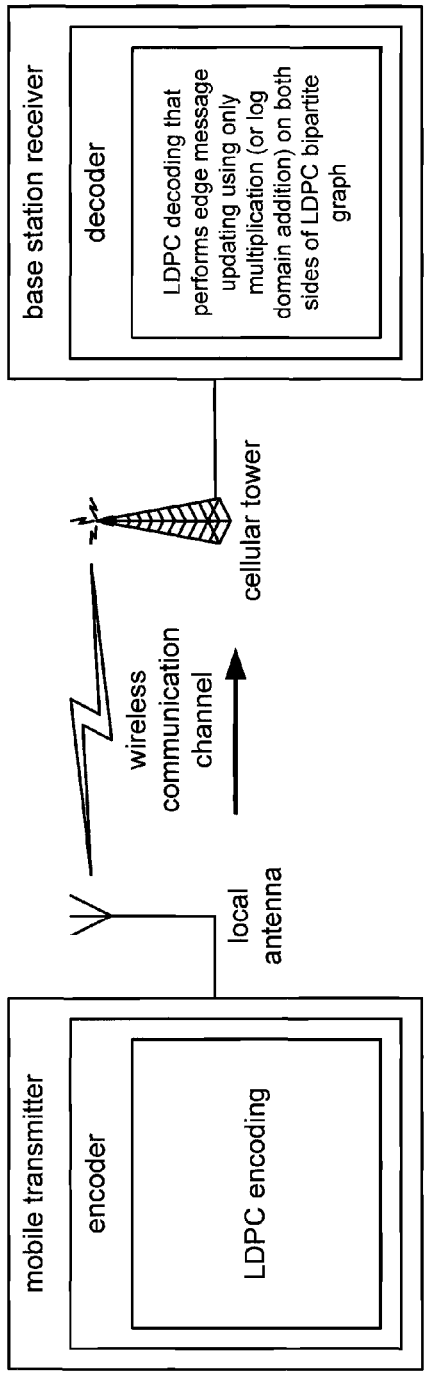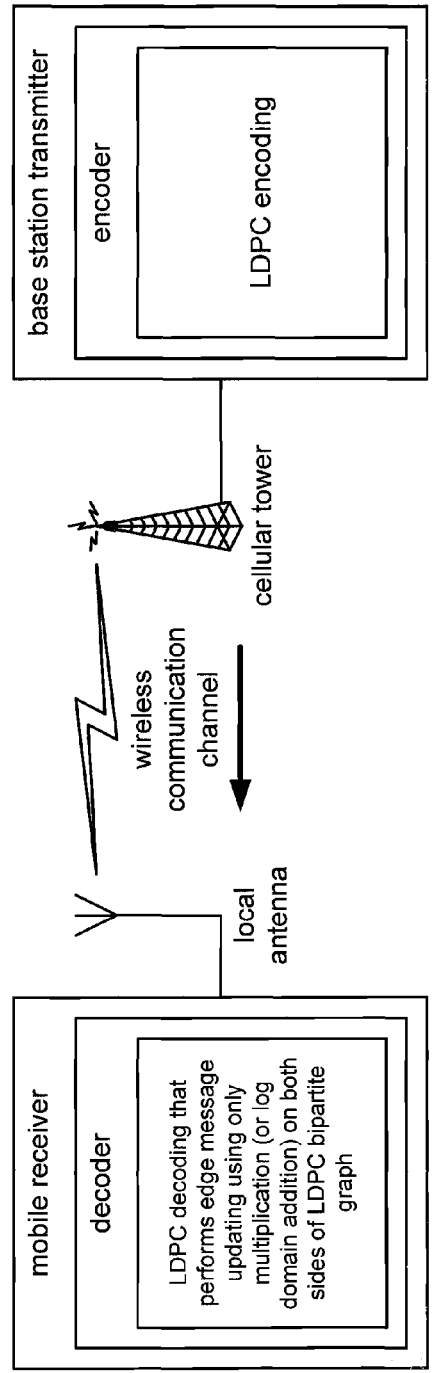

bi-directional cellular communication system uni-directional microwave communication system bi-directional microwave communication system uni-directional point-to-point radio communication system bi-directional point-to-point radio communication system uni-directional communication system bi-directional communication system one to many communication system WLAN (Wireless Local Area Network) communication system DSL (Digital Subscriber Line) communication system fiber-optic communication system satellite receiver STB (Set Top Box) system communication system wireless communication device LDPC (Low Density Parity Check) code bipartite graph LDPC (Low Density Parity Check) decoding functionality using bit metric alternative LDPC decoding functionality using bit metric (when performing n number of iterations)

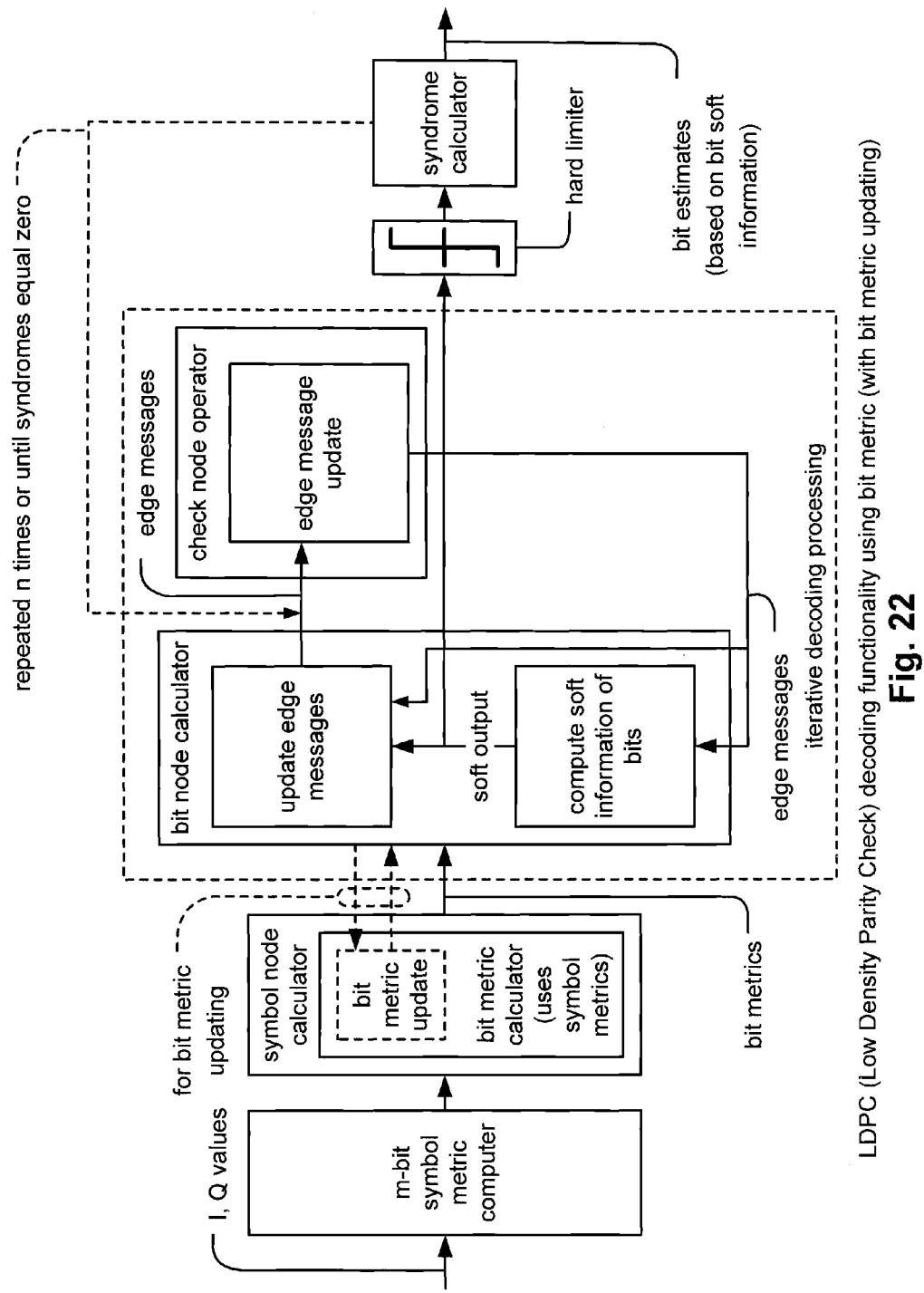

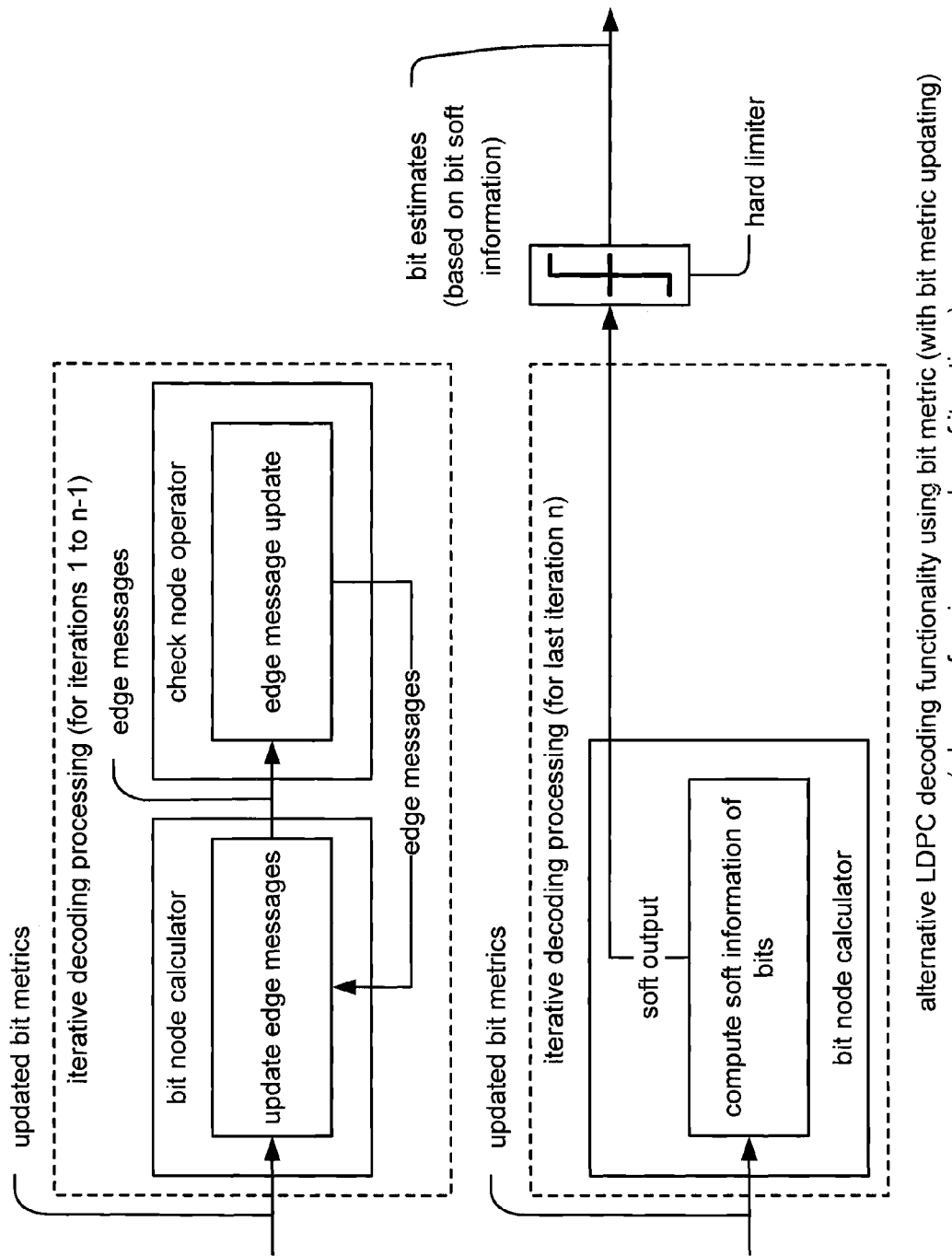
Fig. 23 alternative LDPC decoding functionality using bit metric (with bit metric updating) (when performing n number of iterations)

check node and bit node estimation functionality (employing likelihood decoding at check node side)

LDPC decoding functionality (employing likelihood processing on both check nodes and bit nodes)

LDPC decoding functionality (employing LR (Likelihood Ratio) processing on bit nodes) implemented in log domain check node and bit node estimation functionality (employing LR (Likelihood Ratio) decoding at check node side)

LDPC decoding functionality (employing LLR (Log Likelihood Ratio) processing)

check node processing functionality employing function L (shown using LDPC decoding employing LLR processing)

separate check node processing and bit node processing functional blocks single functional block operable to perform calculations of both check node processing and bit node processing

US 7,464,317 B2

DECODING LDPC (LOW DENSITY PARITY CHECK) CODE AND GRAPHS USING MULTIPLICATION (OR ADDITION IN LOG-DOMAIN) ON BOTH SIDES OF BIPARTITE GRAPH

CROSS REFERENCE TO RELATED PATENTS/PATENT APPLICATIONS

Continuation priority claim, 35 U.S.C. § 120

The present U.S. Utility Patent Application claims priority pursuant to 35 U.S.C. § 120, as a continuation, to the following U.S. Utility Patent Application which is hereby incorporated herein by reference in its entirety and made part of the present U.S. Utility Patent Application for all purposes:

1. U.S. Utility application Ser. No. 10/865,556, entitled "Decoding LDPC (Low Density Parity Check) code and graphs using multiplication (or addition in log-domain) on both sides of bipartite graph," filed Jun. 10, 2004, now U.S. Pat. No. 7,243,287 B2, issued on Jul. 10, 2007, which claims priority pursuant to 35 U.S.C. § 119(e) to the following U.S. Provisional Patent Application which is hereby incorporated herein by reference in its entirety and made part of the present U.S. Utility Patent Application for all purposes:"

"With this appropriately defined map, (EQ 5) is then transformed to the following:"

a. U.S. Provisional Application Ser. No. 60/567,571, "Decoding LDPC (Low Density Parity Check) code and graphs using multiplication (or addition in log-domain) on both sides of bipartite graph," filed Jun. 03, 2004.

BACKGROUND OF THE INVENTION

1. Technical Field of the Invention

The invention relates generally to communication systems; and, more particularly, it relates to decoding of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Typical encoding of LDPC coded modulation signals is performed by generating a signal that includes symbols each having a common code rate and being mapped to a singular modulation. That is to say, all of the symbols of such an LDPC coded modulation signal have the same code rate and the same modulation (the same constellation having a singular mapping). Oftentimes, such prior art encoding designs are implemented as to maximize the hardware and processing efficiencies of the particular design employed to generate the LDPC coded modulation signal having the single code rate and single modulation for all of the symbols generated therein.

With respect to decoding of such LDPC coded modulation signals, decoding is most commonly performed based on a bipartite graph of a given LDPC code such that the graph includes both bit nodes and check nodes. The I, Q (In-phase, Quadrature) values associated with received symbols are associated with a symbol node, and that symbol node is associated with corresponding bit nodes. Bit metrics are then calculated for the individual bits of the corresponding symbols, and those bit metrics are provided to the bit nodes of the bipartite graph of the given LDPC code. Edge information corresponding to the edges (e.g., edge messages) that interconnect the bit nodes and the check nodes is calculated, and appropriately updated, and communicated back and forth between the bit nodes and the check nodes during iterative decoding of the LDPC coded signal.

A common approach to performing bit decoding of such LDPC coded signals is to use the prior art a posteriori probability (APP) decoding approach of a graph code using so-called sum product algorithm (SPA). The following references described this prior art SPA decoding approach.

[1] R. Gallager, *Low-Density Parity-Check Codes*, Cambridge, Mass.: MIT Press, 1963.

[2] M. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

[3] D. J. C. MacKay, "Good error correcting codes based on very sparse matrices," *IEEE Trans. Inform. Theory*, Vol. 45, pp. 399-431, March 1999.

[4] G. D. Forney, "Codes on graphs: normal realizations," *IEEE Trans. Inform. Theory*, Vol. 47, pp. 520-548, February 2001.

Using the prior art SPA approach to decoding LDPC coded signals, the check node is estimated with a sum and a product of the estimation that is obtained from bit nodes. This combination of the sum and product terms is why this prior art approach is commonly referred to as the SPA approach (e.g., sum and product). Within this most common prior art SPA approach to bit decoding of LDPC coded signals, the approach operates by calculating APP of the LDPC graph code. This involves employing a number of different sum of terms functions (e.g., $\Sigma$), and then multiplying each of those respective sum of terms functions together using a product of terms functions (e.g., $\Pi$). This combination of performing the sum of terms functions and product of terms functions during each and every edge message updating iteration is extraordinarily computationally intensive. When implementing this approach to decoding LDPC coded signals, the hardware required to support and perform this combination of sum of terms functions and product of terms functions is very costly in terms of processing resources, memory, memory management concerns, etc.

In the following, a brief introduction of this SPA approach to decoding LDPC coded signals is presented.

Define the metric of bit node i by $metric_i(a)=Pr(y_i|v_i=a)$. To initialize the decoding processing, define $$bit_e^0(a) = metric_{b(e)}(a).$$

Then the check node estimate and the bit node estimate are performed as follows:

1. Check estimate: for every edge compute $$check_e^n(a) = \tag{EQ 1}$$
$$Pr(c_{c(e)} = 0 \mid v_{b(e)} = a, y) = \sum_{u \in U_e(a)} \prod_{f \in E_c(c(e))\setminus\{e\}} bit_{e'}^{n-1}(u_{b(f)});$$

where $$U_e(a) = \left\{ u_1 \in \{0,1\}, (t, c(e) \in E_c(e)) \setminus \{e\} \;\middle|\; \sum_t u_t = a \right\}.$$

2. Bit estimate: For every edge e compute $$bit_e^n(a) = Pr(v_{b(e)} = a \mid c_{c(e')} = 0, f \in E_v(b(e))\setminus\{e\}, y) \tag{EQ 2}$$

$$bit_e^n(a) = metric_{b(e)}(a) \prod_{f \in E_v(b(e))\setminus\{e\}} check_f^n(a)$$

The estimate at the n-th iteration is as follows:

$$P^{(n)}(b_i = a \mid y) = metric_i(a) \prod_{e \in E_b(i)} check_e^n(a).$$

In the application of graph codes on a communication system, the operation of the decoding is oftentimes actually implemented in the logarithm domain (e.g., the log domain). Multiplications may be implemented in the log domain using addition, and divisions may be implemented in the log domain using subtraction. Therefore, when using SPA approach to decoding LDPC coded signals, the logarithm of the sum of several values has to be carried out. This computational processing of summing over several values, when implemented in the log domain, may significantly increase the complexity of the hardware that is employed to implement a decoder that performs this SPA approach.

As can clearly be seen, there is a need in the art to provide a new means by which LDPC coded signals may be decoded that is less computationally intensive. As such, a less computationally intensive approach could potentially be implemented more simplistically in hardware. If a less computationally intensive approach could be achieved, then a device implementing such approach could provide for a significant degree of savings in many measurable operational parameters including processing resources, memory, memory management concerns, etc.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 3A and FIG. 3B are system diagrams illustrating embodiment of uni-directional cellular communication systems that are built according to the invention.

FIG. 22 is a diagram illustrating an alternative embodiment of LDPC (Low Density Parity Check) decoding functionality using bit metric (with bit metric updating) according to the invention.

FIG. 23 is a diagram illustrating an alternative embodiment of LDPC decoding functionality using bit metric (with bit metric updating) according to the invention (when performing n number of iterations).

DETAILED DESCRIPTION OF THE INVENTION

Figure 1:
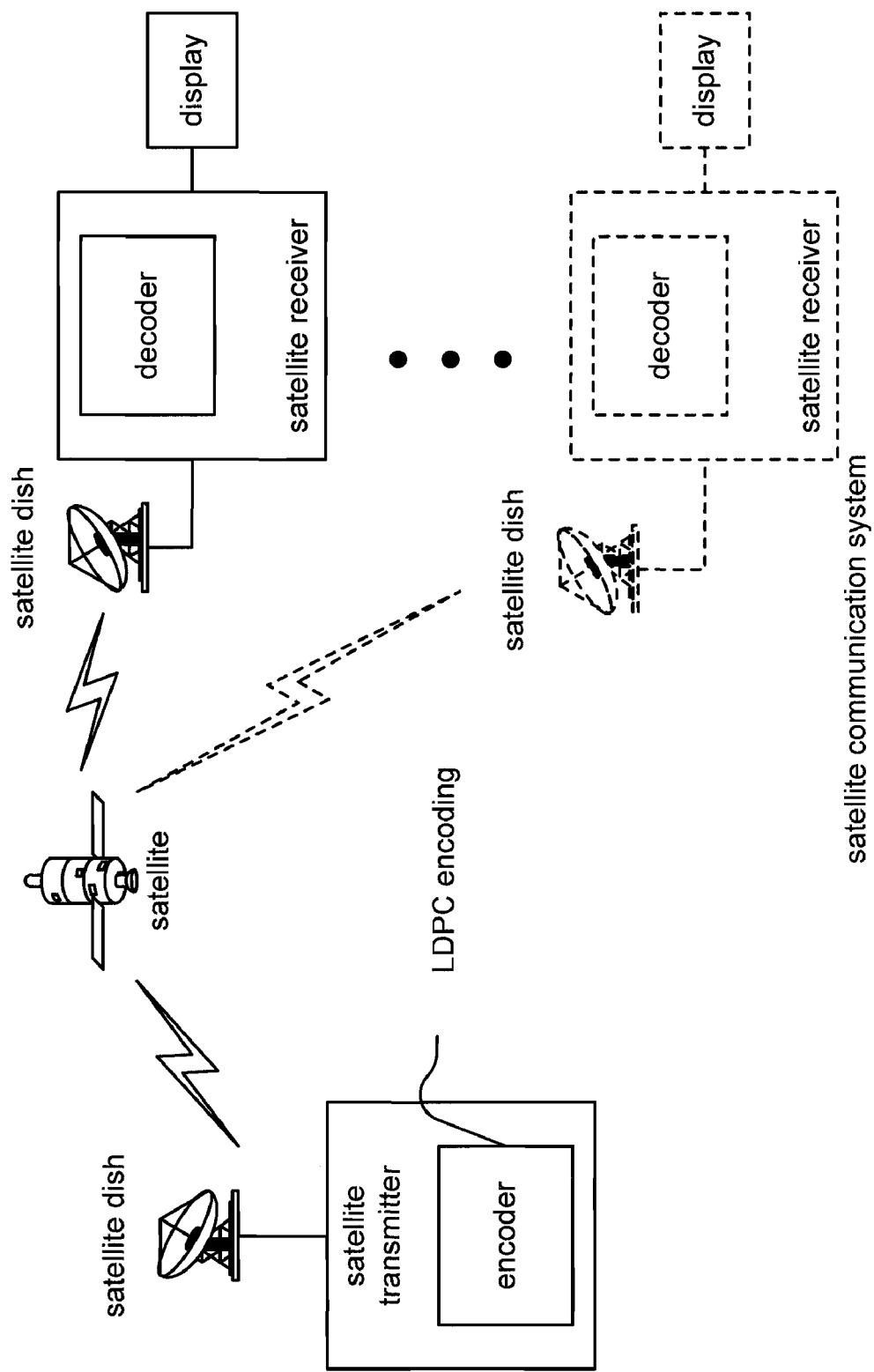
FIG. 1 is a system diagram illustrating an embodiment of a satellite communication system that is built according to the invention.

Various decoding aspects of the invention may be found in devices that perform decoding of LDPC (Low Density Parity Check) coded signals such that the updating of edge messages (in the context of the iterative decoding processing) can be performed using more simplified calculations as opposed to the prior art approaches that include using the prior art SPA (sum product algorithm) decoding approach. In contradistinction to the prior art SPA decoding approach that involves calculating the relatively cumbersome and complex calculations that employ a number of different sum of terms functions (e.g., $\Sigma$), and then multiplying each of those respective sum of terms functions together using a product of terms functions (e.g., $\Pi$), one aspect of the invention involves reducing this computational complex processing (e.g., involving both number of different sum of terms functions (e.g., $\Sigma$) and product of terms functions (e.g., $\Pi$)) down to a straightforward product of terms function (e.g., $\Pi$).

For example, when performing the iterative decoding processing in accordance with the LDPC decoding performed according to the invention, the updating of each edge message with respect to the check nodes may be performed by calculating a product of terms function such that the terms of that function include each of the corresponding edge messages with respect the plurality of bit nodes. That is to say, the updating of each edge message with respect to the check nodes involves a straightforward product of terms function (e.g., $\Pi$) operating on the terms of the corresponding edge messages with respect the plurality of bit nodes (e.g., corresponding to those edges that communicatively couple the check node of interest to its corresponding bit nodes). That is to say, this current check node of interest includes at least one edge that communicatively couples from this check node to at least one bit node. The updating of the edge messages corresponding to this check node involves a straightforward product of terms function (e.g., $\Pi$) that operates on the corresponding edge messages corresponding to these particular bit nodes. This novel decoding approach is a significant departure from the prior art approaches to performing the SPA decoding approach, in that, the combination of performing multiple sum of terms functions (e.g., $\Sigma$) and then performing a product of terms function (e.g., $\Pi$) of those sum of term results need not be performed during each decoding iteration. This can provide a significant reduction in computational complexity and the resources needed to support and perform such cumbersome calculations.

It is also noted that any of the product of terms functions (e.g., $\Pi$) that are performed in accordance with the invention may alternatively be implemented to be sum of terms functions (e.g., $\Sigma$) when implemented in the log domain. Any of the various embodiments of the invention may be implemented in the base 10 decimal domain or the log domain without departing from the scope and spirit of the invention. In some instances, the implementation is easier when implementing in the log domain. When performing the iterative decoding processing in the log domain, the calculations may also involve calculating various sign functions as well. For example, when implementing the calculations in the log domain (where multiplications may be performed as additions), there may also be a need to calculate appropriate corresponding sign functions.

As is described in greater detail below, an appropriately implemented mapping may be employed so that the updating of the edge messages can be performed using only a product of terms function (or an equivalent log domain sum of terms function) for the check nodes (as opposed to the SPA processing of the prior art). By eliminating this first need to perform each of the different sum of terms functions and then perform a product of terms functions of each of the results of those different sum of terms functions, a significant savings in processing is achieved when updating the edge messages employing within the decoding processing of LDPC coded signals Generally speaking, various aspects of the invention may be found in any number of devices that perform decoding of LDPC coded signals. Sometimes, these devices support bi-directional communication and are implemented to perform both encoding and decoding of LDPC coded signals. Moreover, in some embodiments, encoding may be performed by combining LDPC encoding and modulation encoding to generate an LDPC coded signal. In some instances of the invention, the LDPC encoding is combined with modulation encoding in such a way as to generate a variable modulation signal whose modulation may vary as frequently as on a symbol by symbol basis. That is to say, the constellation and/or mapping of the symbols of an LDPC coded variable modulation signal may vary as frequently as on a symbol by symbol basis. In addition, the code rate of the symbols of the coded signal may also vary as frequently as on a symbol by symbol basis. In general, an LDPC signal generated according these encoding aspects may be characterized as a variable code rate and/or modulation signal.

The novel approaches to decoding of LDPC coded signals that is presented herein, can be applied to any of these various types of LDPC coded signals (e.g., straight-forward LDPC coded signals, LDPC coded modulation signals, LDPC variable modulation signal, LDPC variable code rate signals, and so on). The simplified calculations required to perform iterative decoding processing of LDPC coded signals are significantly reduced in complexity by various aspects of the invention.

Various communication devices and communication system embodiments are described below in which many of the various aspects of the invention may be implemented. In general, any communication device that performs encoding and/or decoding of LDPC coded signals may benefit from the invention; the LDPC decoding performs updating of edge messages using only multiplication (or log domain addition) on both sides of LDPC bipartite graph. Also, this encoding and/or decoding may also include processing those LDPC coded signals that have variable code rate and/or modulation as well as those that include combined LDPC coding and modulation coding.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) in a manner in accordance with the functionality and/or processing of at least some of the various aspects of the invention to assist in generating a signal that is to be launched into the communication channel coupling the satellite transmitter and the satellite receiver. The satellite receiver is operable to decode a signal (using a decoder) received from the communication channel in a manner in accordance with the functionality and/or processing of at least some of the various aspects of the invention. This diagram shows one embodiment where one or more of the various aspects of the invention may be found.

Figure 2:
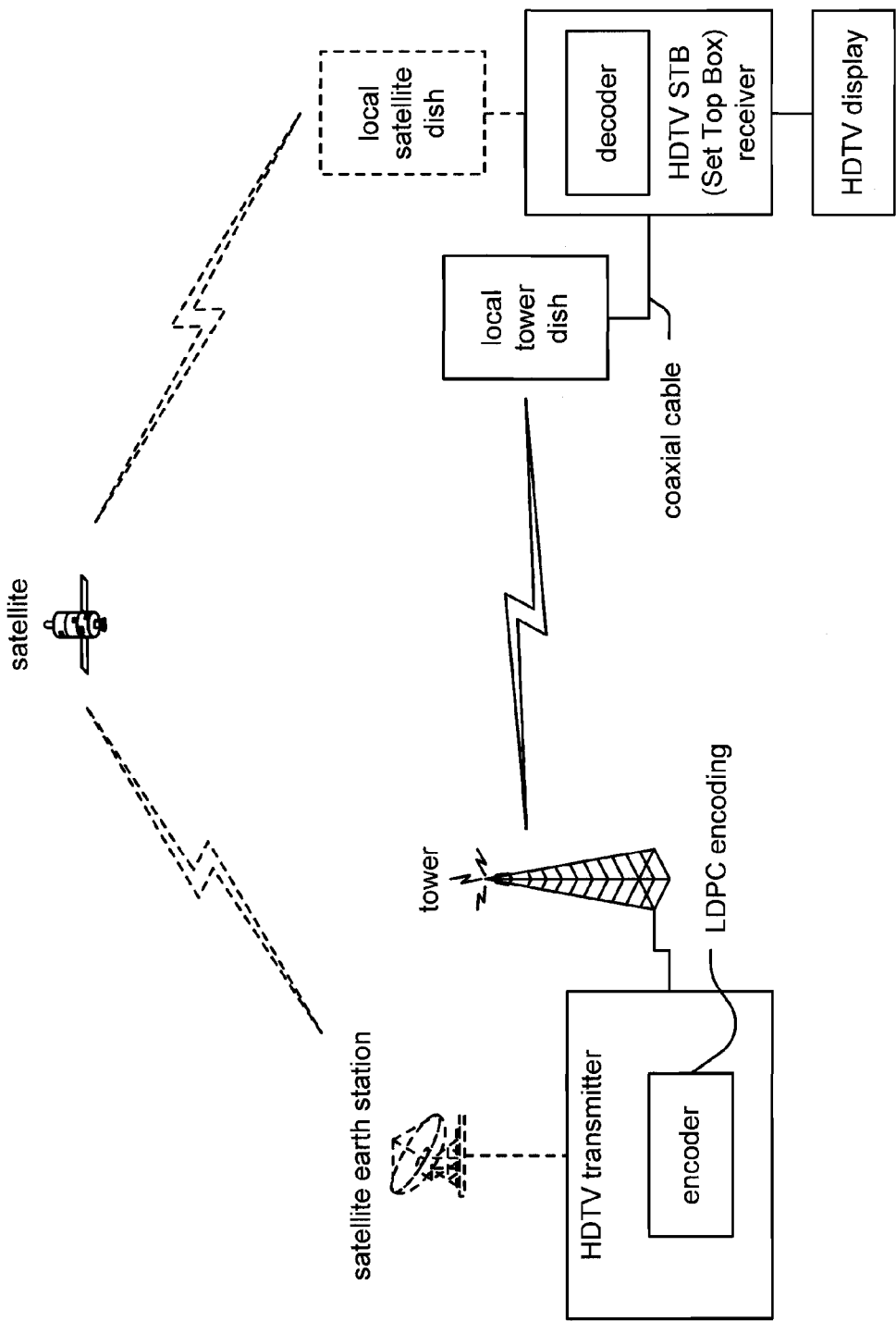
FIG. 2 is a system diagram illustrating an embodiment of an HDTV (High Definition Television) communication system that is built according to the invention.

FIG. 2 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish. This functionality may include any transformation and/or down-converting that may be needed to accommodate for any up-converting that may have been performed before and during transmission of the signal from the HDTV transmitter and its corresponding tower to transform the signal into a format that is compatible with the communication channel across which it is transmitted. For example, certain communication systems step a signal that is to be transmitted from a baseband signal to an IF (Intermediate Frequency) signal, and then to a carrier frequency signal before launching the signal into a communication channel. Alternatively, some communication systems perform a conversion directly from baseband to carrier frequency before launching the signal into a communication channel. In whichever case is employed within the particular embodiment, the HDTV STB receiver is operable to perform any down-converting that may be necessary to transform the received signal to a baseband signal that is appropriate for demodulating and decoding to extract the information there from.

The HDTV STB receiver is also communicatively coupled to an HDTV display that is able to display the demodulated and decoded wireless transmitted signals received by the HDTV STB receiver and its local tower dish. The HDTV STB receiver may also be operable to process and output standard definition television signals as well. For example, when the HDTV display is also operable to display standard definition television signals, and when certain video/audio is only available in standard definition format, then the HDTV STB receiver is operable to process those standard definition television signals for use by the HDTV display.

The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is ultimately destined for the HDTV STB receiver. For example, another satellite earth station may first transmit a signal to the satellite from another location, and the satellite may relay this signal to the satellite earth station that is communicatively coupled to the HDTV transmitter. In such a case the HDTV transmitter include transceiver functionality such that it may first perform receiver functionality and then perform transmitter functionality to transmit this received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and by whichever signal path the HDTV transmitter employs to communicate with the HDTV STB receiver, the HDTV STB receiver is operable to receive communication transmissions from the HDTV transmitter and to demodulate and decode them appropriately.

The HDTV transmitter is operable to encode information (using an encoder) in a manner in accordance with the functionality and/or processing of at least some of the various aspects of the invention to assist in generating a signal that is to be launched into the communication channel coupling the HDTV transmitter and the HDTV STB receiver. The HDTV STB receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmission functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) in a manner in accordance with the functionality and/or processing of at least some of the various aspects of the invention to assist in generating a signal that is to be launched into the communication channel coupling the mobile transmitter and the base station receiver. The base station receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) in a manner in accordance with the functionality and/or processing of at least some of the various aspects of the invention to assist in generating a signal that is to be launched into the communication channel coupling the base station transmitter and the mobile receiver. The mobile receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 4:
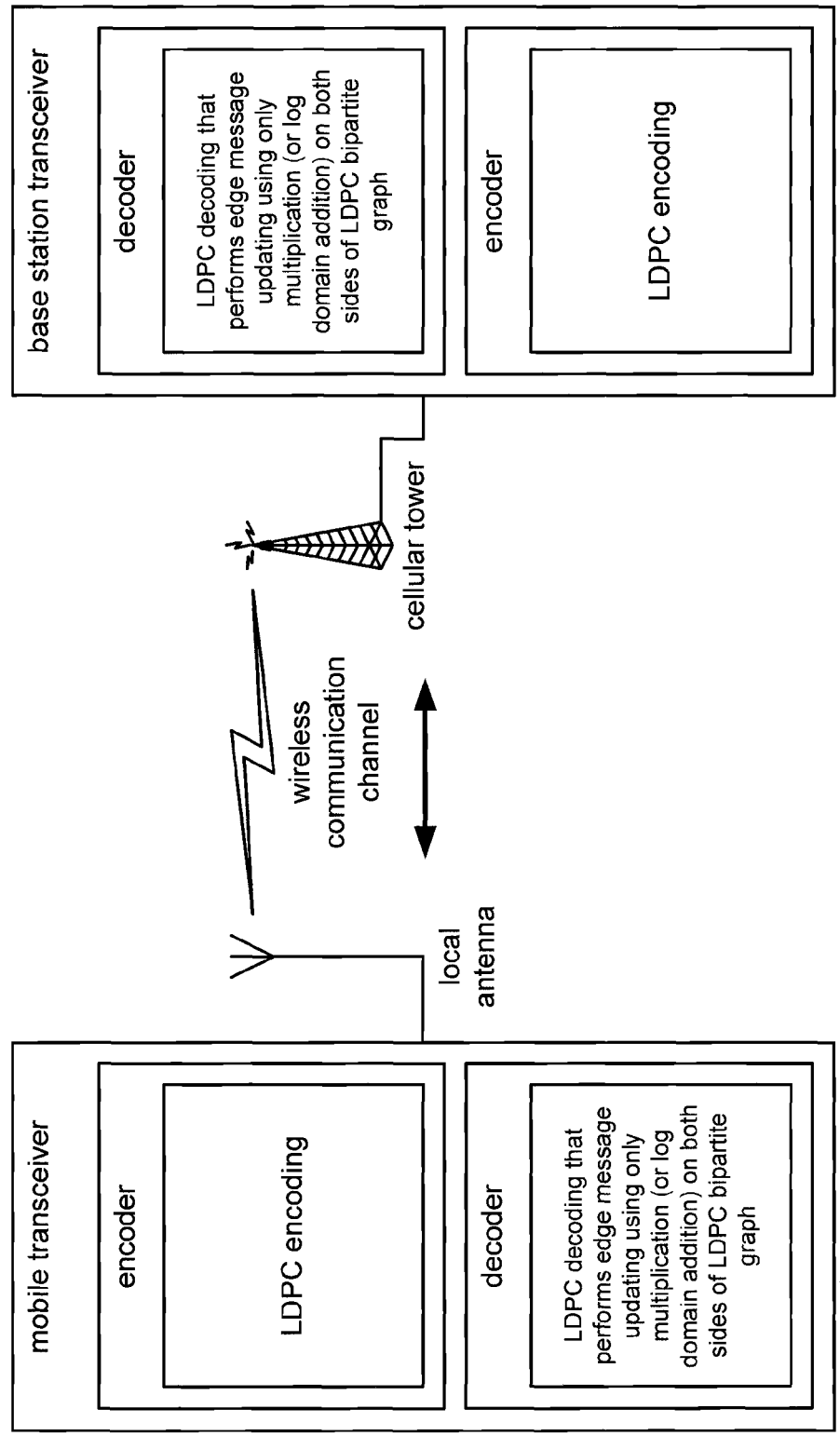
FIG. 4 is a system diagram illustrating an embodiment of a bi-directional cellular communication system that is built according to the invention.

FIG. 4 is a system diagram illustrating an embodiment of a bi-directional cellular communication system, built according to the invention, where the communication can go to and from the base station transceiver and to and from the mobile transceiver via the wireless communication channel.

Referring to the FIG. 4, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceivers including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver. The mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder and a decoder, the encoder of either of the base station transceiver or the mobile transceiver may be implemented to encode information (using its corresponding encoder) in a manner in accordance with the functionality and/or processing of at least some of the various aspects of the invention to assist in generating a signal that is to be launched into the communication channel coupling the base station transceiver and the mobile transceiver. The decoder of either of the base station transceiver or the mobile transceiver may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 5:
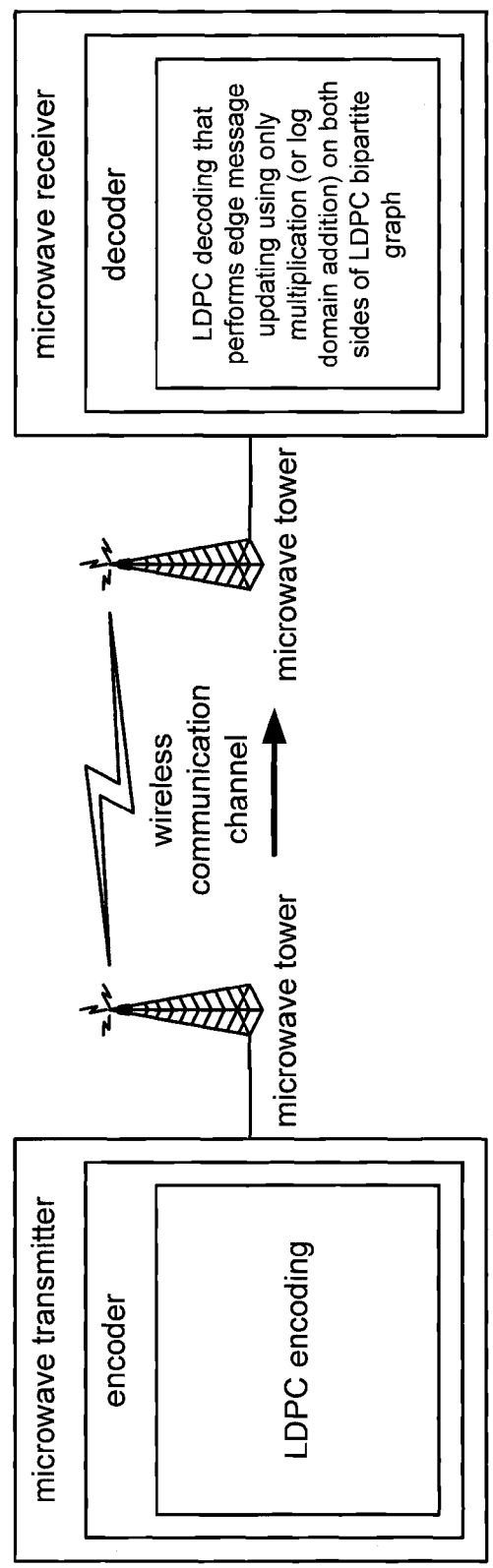
FIG. 5 is a system diagram illustrating an embodiment of a uni-directional microwave communication system that is built according to the invention.

FIG. 5 is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) in a manner in accordance with the functionality and/or processing of at least some of the various aspects of the invention to assist in generating a signal that is to be launched into the communication channel coupling the microwave transmitter and the microwave receiver. The microwave receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 6:
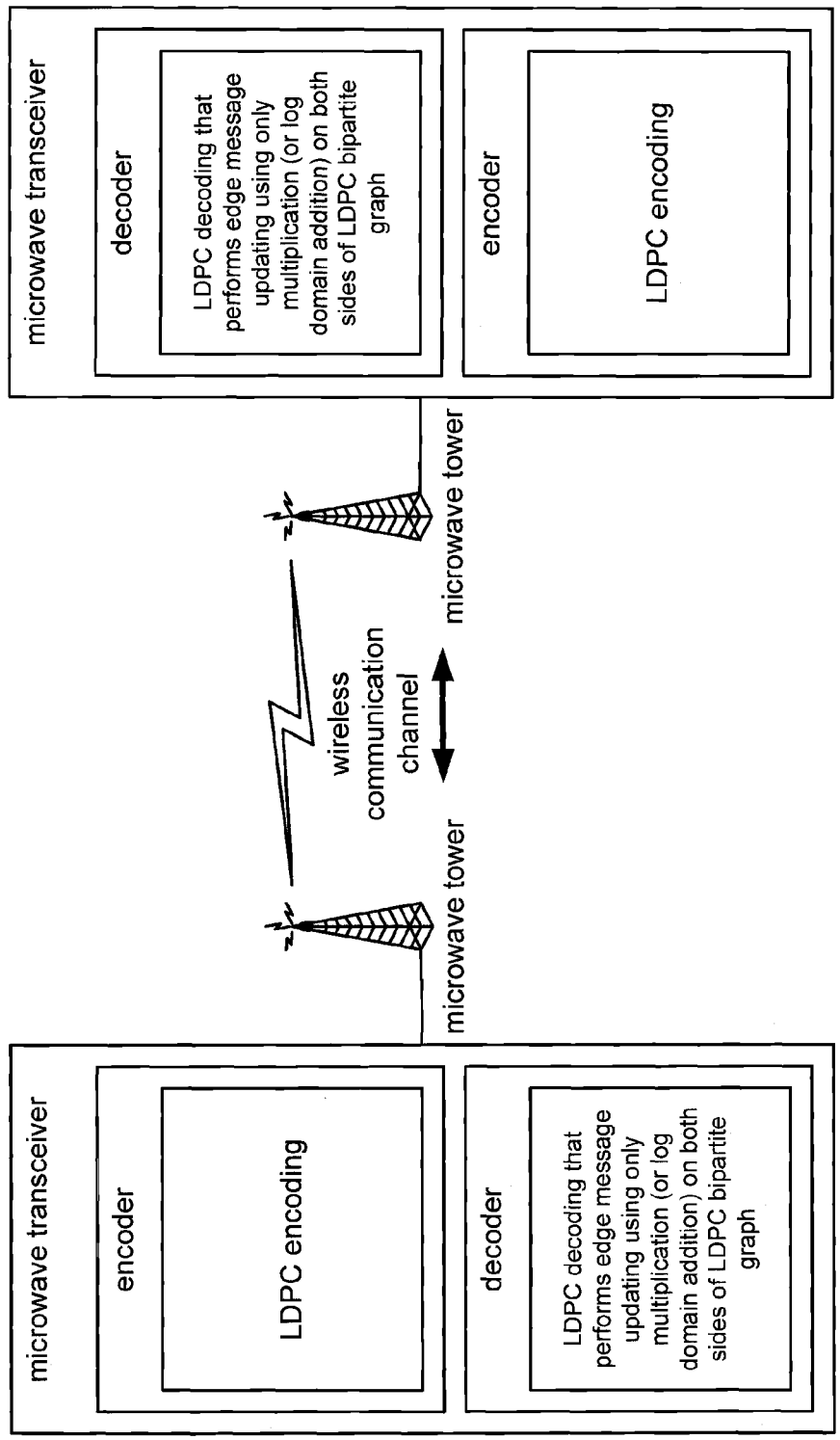
FIG. 6 is a system diagram illustrating an embodiment of a bi-directional microwave communication system that is built according to the invention.

FIG. 6 is a system diagram illustrating an embodiment of a bi-directional microwave communication system that is built according to the invention. Within the FIG. 6, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using its corresponding encoder) that is to be transmitted the other microwave transceiver. Each microwave transceiver is operable to decode the transmitted signal (using its corresponding decoder) that it receives. Each of the microwave transceivers includes an encoder and a decoder.

As within other embodiments that employ an encoder and a decoder, the encoder of either of the microwave transceivers may be implemented to encode information (using its corresponding encoder) in a manner in accordance with the functionality and/or processing of at least some of the various aspects of the invention to assist in generating a signal that is to be launched into the communication channel coupling the microwave transceivers. The decoder of either of the microwave transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 7:
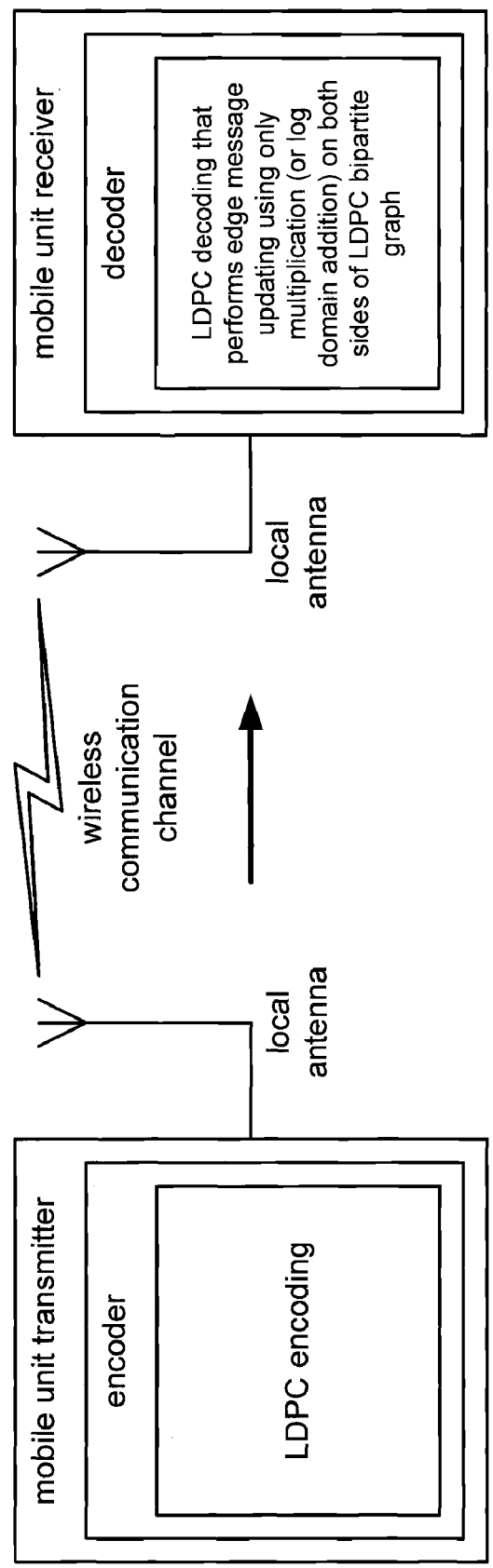
FIG. 7 is a system diagram illustrating an embodiment of a uni-directional point-to-point radio communication system that is built according to the invention.

FIG. 7 is a system diagram illustrating an embodiment of a unidirectional point-to-point radio communication system, built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) in a manner in accordance with the functionality and/or processing of at least some of the various aspects of the invention to assist in generating a signal that is to be launched into the communication channel coupling the mobile unit transmitter and the mobile unit receiver. The mobile unit receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 8:
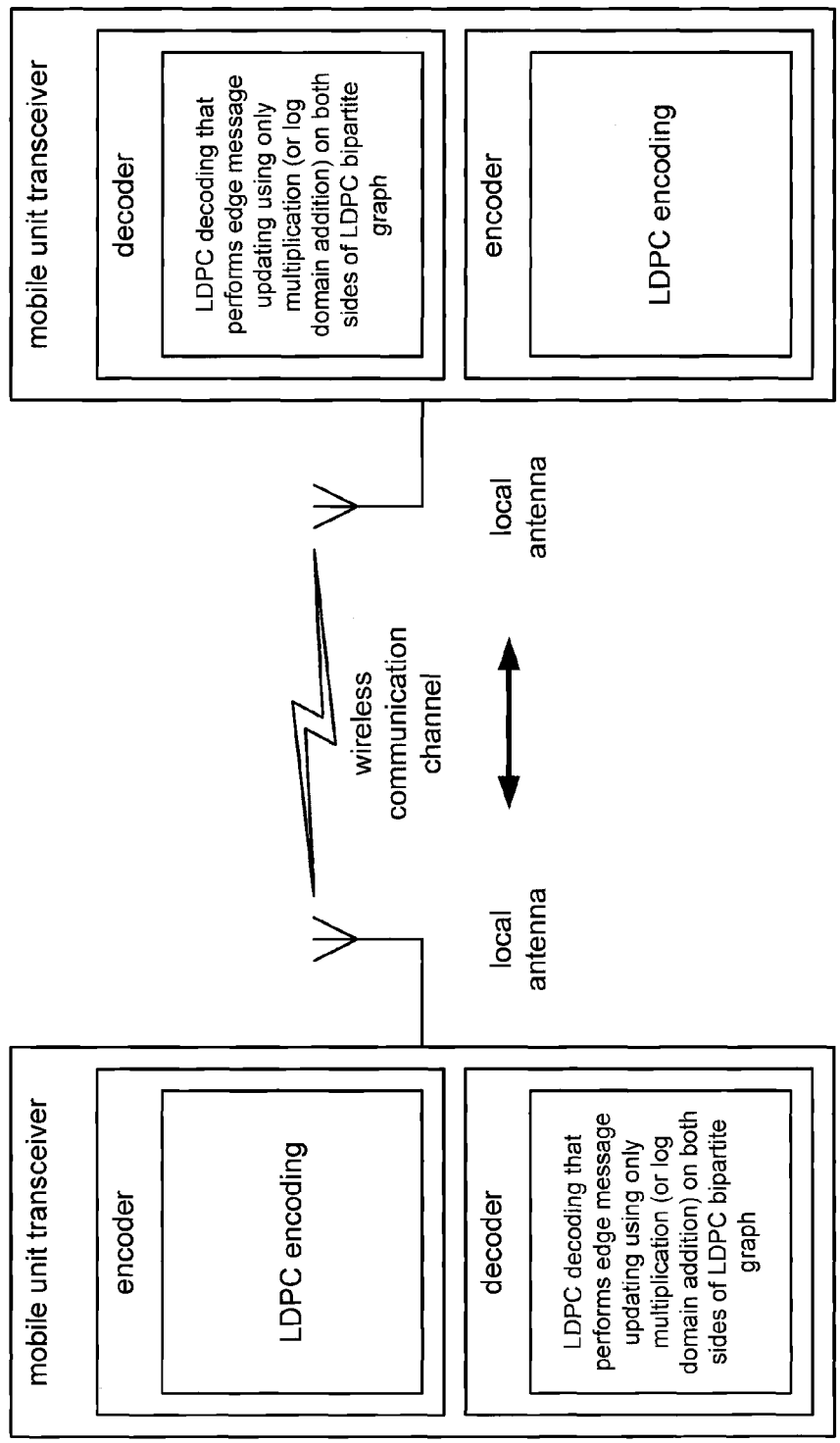
FIG. 8 is a system diagram illustrating an embodiment of a bi-directional point-to-point radio communication system that is built according to the invention.

FIG. 8 is a system diagram illustrating an embodiment of a bi-directional point-to-point radio communication system that is built according to the invention. A first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each of the mobile unit transceivers is operable to encode information (using its corresponding encoder) that is to be transmitted the other mobile unit transceiver. Each mobile unit transceiver is operable to decode the transmitted signal (using its corresponding decoder) that it receives. Each of the mobile unit transceivers includes an encoder and a decoder.

As within other embodiments that employ an encoder and a decoder, the encoder of either of the mobile unit transceivers may be implemented to encode information (using its corresponding encoder) in a manner in accordance with the functionality and/or processing of at least some of the various aspects of the invention to assist in generating a signal that is to be launched into the communication channel coupling the mobile unit transceivers. The decoder of either of the mobile unit transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 9:
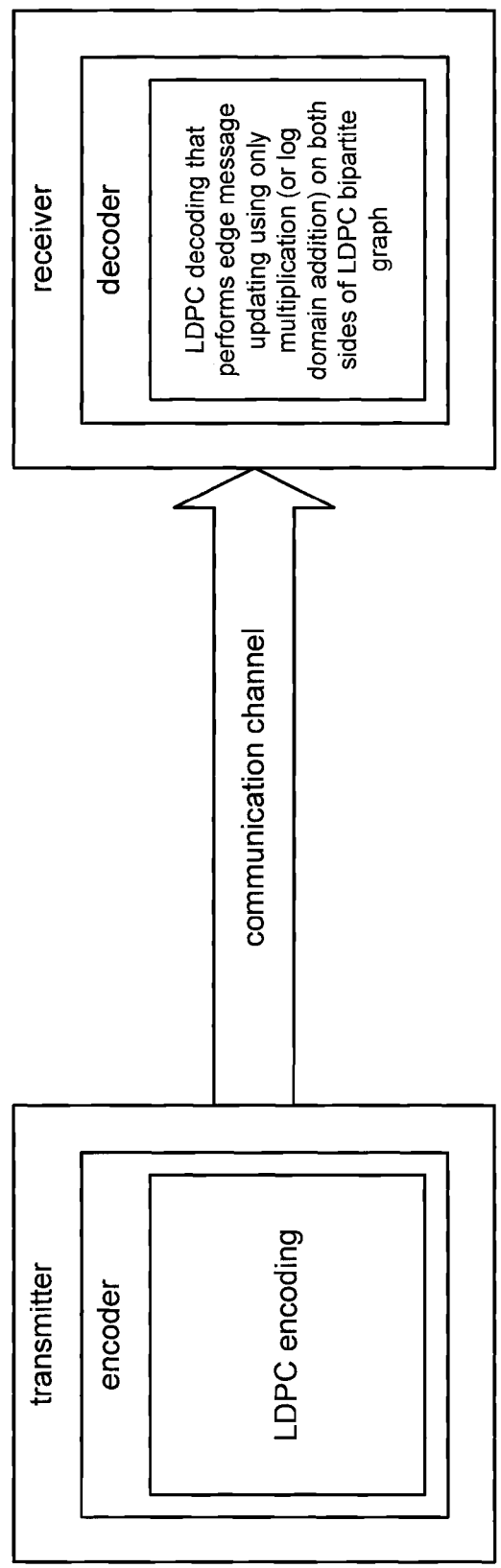
FIG. 9 is a system diagram illustrating an embodiment of a uni-directional communication system that is built according to the invention.

FIG. 9 is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) in a manner in accordance with the functionality and/or processing of at least some of the various aspects of the invention to assist in generating a signal that is to be launched into the communication channel coupling the transmitter and the receiver. The receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 10:
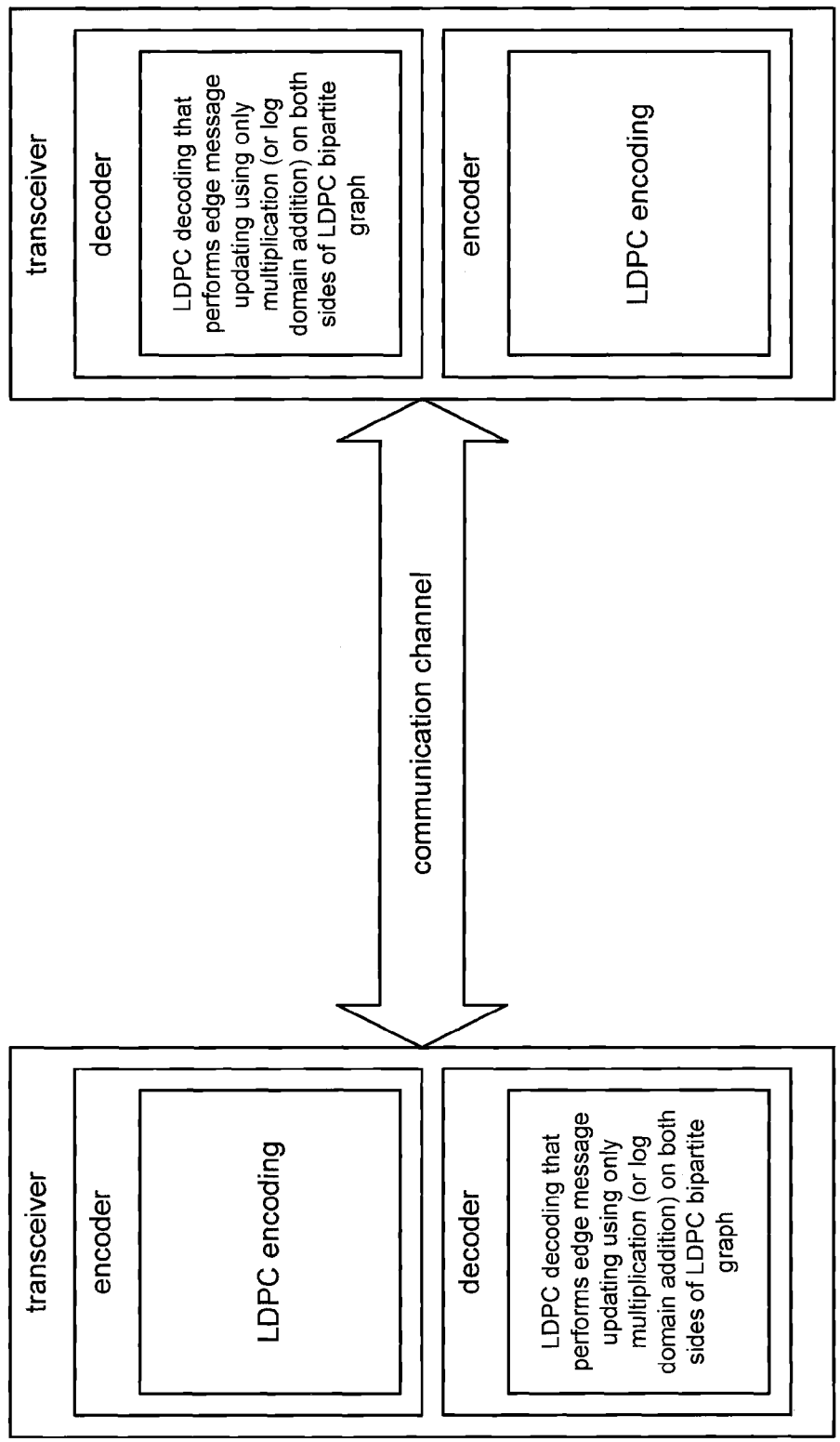
FIG. 10 is a system diagram illustrating an embodiment of a bi-directional communication system that is built according to the invention.

FIG. 10 is a system diagram illustrating an embodiment of a bi-directional communication system that is built according to the invention. A first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted the other transceiver. Each transceiver is operable to decode the transmitted signal (using its corresponding decoder) that it receives. Each of the transceivers includes an encoder and a decoder.

As within other embodiments that employ an encoder and a decoder, the encoder of either of the transceivers may be implemented to encode information (using its corresponding encoder) in a manner in accordance with the functionality and/or processing of at least some of the various aspects of the invention to assist in generating a signal that is to be launched into the communication channel coupling the transceivers. The decoder of either of the transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 11:
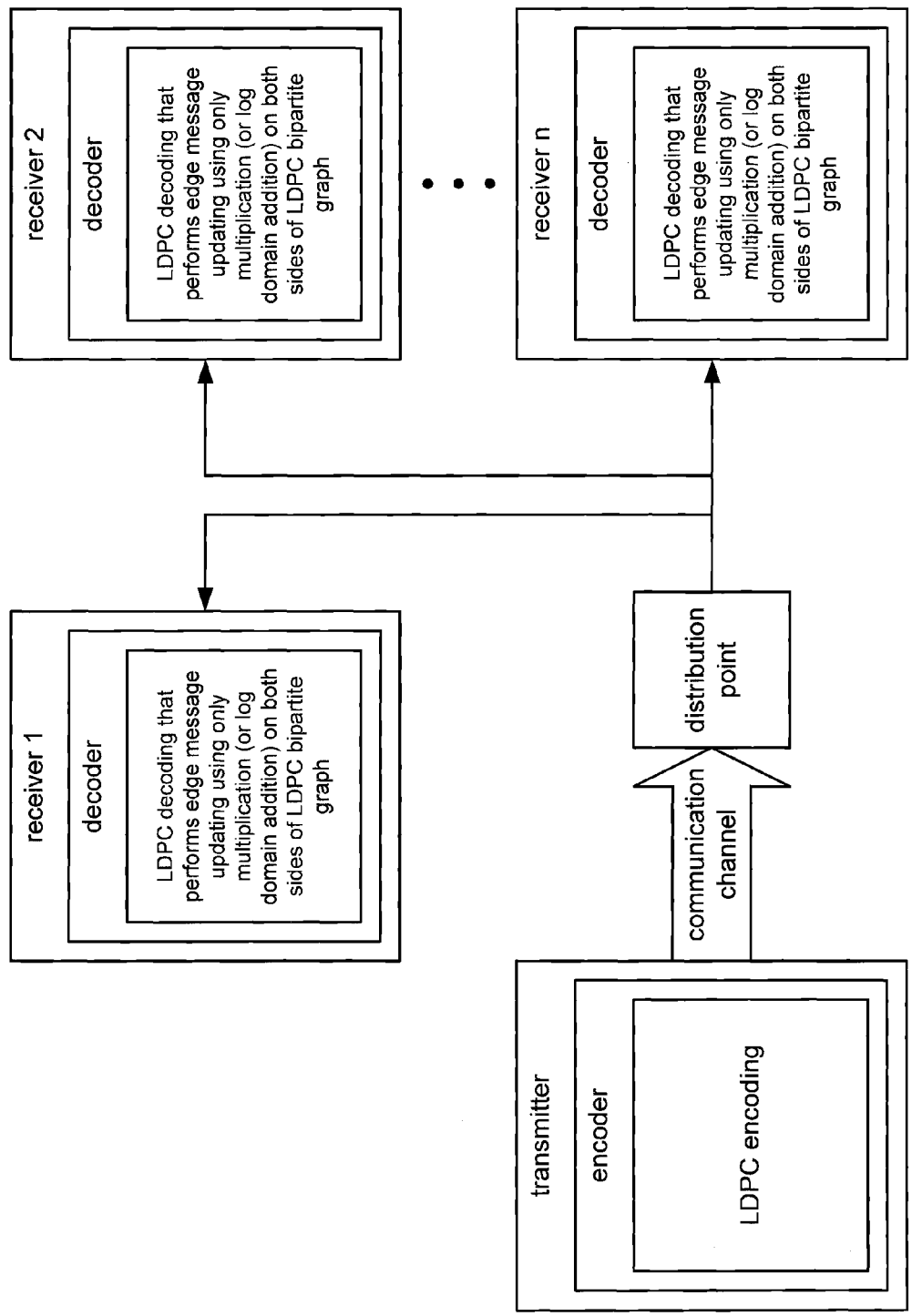
FIG. 11 is a system diagram illustrating an embodiment of a one to many communication system that is built according to the invention.

FIG. 11 is a system diagram illustrating an embodiment of a one to many communication system that is built according to the invention. A transmitter is able to communicate, via broadcast in certain embodiments, with a number of receivers, shown as receivers 1, 2, . . . , n via a uni-directional communication channel. The uni-directional communication channel may be a wireline (or wired) communication channel or a wireless communication channel without departing from the scope and spirit of the invention. The wired media by which the communication channel may be implemented are varied, including coaxial cable, fiber-optic cabling, and copper cabling, among other types of "wiring." Similarly, the wireless manners in which the communication channel may be implemented are varied, including satellite communication, cellular communication, microwave communication, and radio communication, among other types of wireless communication.

A distribution point is employed within the one to many communication system to provide the appropriate communication to the receivers 1, 2, . . . , and n. In certain embodiments, the receivers 1, 2, . . . , and n each receive the same communication and individually discern which portion of the total communication is intended for them.

The transmitter is operable to encode information (using an encoder) in a manner in accordance with the functionality and/or processing of at least some of the various aspects of the invention to assist in generating a signal that is to be launched into the communication channel coupling the transmitter and the receivers 1, 2, . . . , and n. Each of the receivers 1, 2, . . . , and n is operable to decode a signal (using a corresponding decoder) received from the communication channel in a manner in accordance with the functionality and/or processing of at least some of the various aspects of the invention. This diagram shows yet another embodiment where one or more of the various aspects of the invention may be found.

Figure 12:
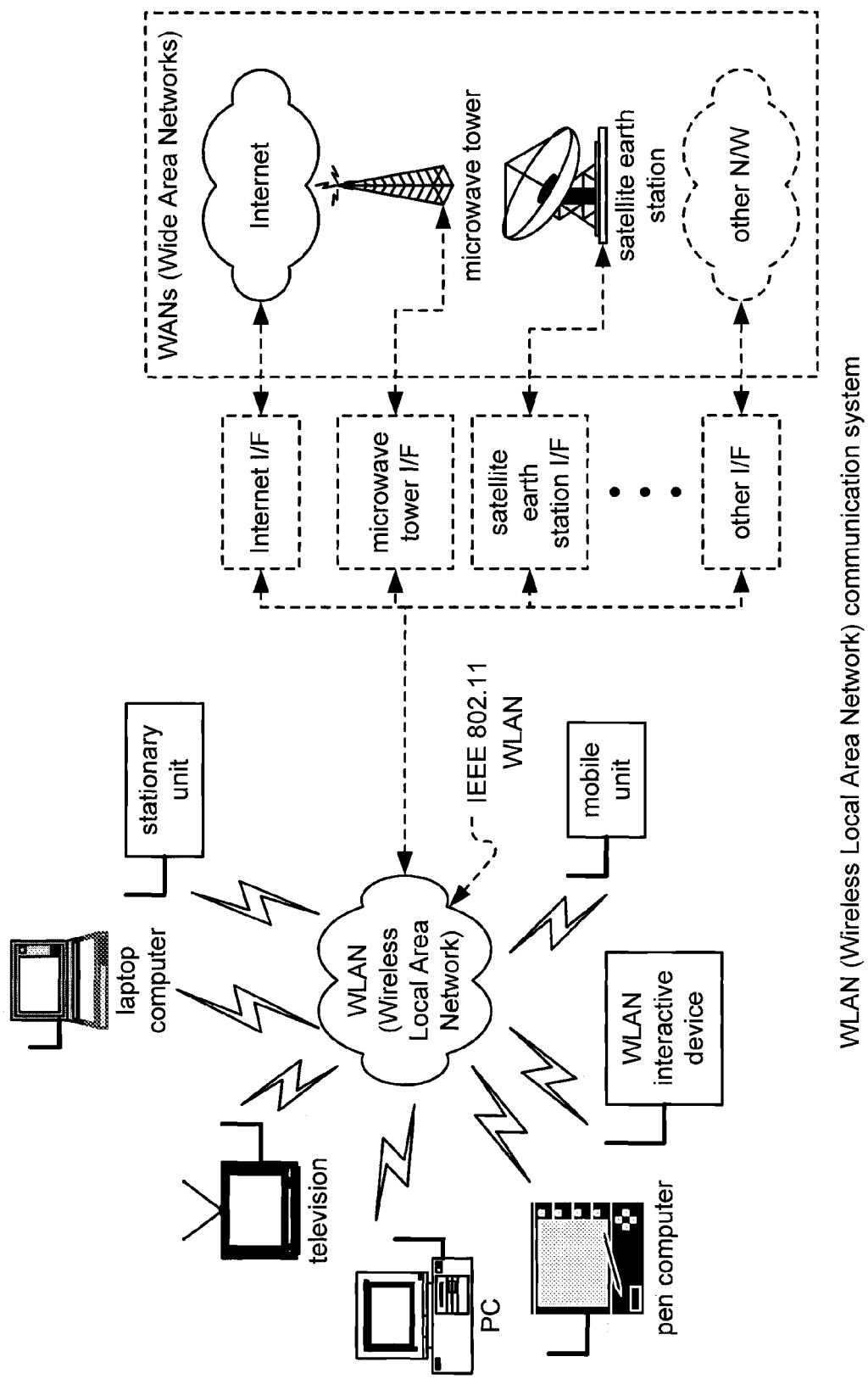
FIG. 12 is a diagram illustrating an embodiment of a WLAN (Wireless Local Area Network) that may be implemented according to the invention.

FIG. 12 is a diagram illustrating an embodiment of a WLAN (Wireless Local Area Network) communication system that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of any of the various WLAN interactive devices may be integrated into the corresponding devices without departing from the scope and spirit of the invention as well.

This illustrated group of devices that may interact with the WLAN is not intended to be an exhaustive list of devices that may interact with a WLAN, and a generic device shown as a WLAN interactive device represents any communication device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs. Again, as within other embodiments that includes bi-directional communication devices having an encoder and a decoder, the encoder of any of these various WLAN interactive devices may be implemented to encode information (using its corresponding encoder) in a manner in accordance with the functionality and/or processing of at least some of the various aspects of the invention to assist in generating a signal that is to be launched into the communication channel that couples to another WLAN interactive device. The decoder of any of the various WLAN interactive devices may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

In general, any one of the WLAN interactive devices may be characterized as being an IEEE (Institute of Electrical & Electronics Engineers) 802.11 operable device. For example, such an IEEE 802.11 operable device may be an IEEE 802.11a operable device, an IEEE 802.11b operable device, or an IEEE 802.11g operable device. Sometimes, an IEEE 802.11 operable device is operable to communicate according to more than one of the standards (e.g., both IEEE 802.11a and IEEE 802.11g in one instance). The IEEE 802.11g specification extends the rates for packet transmission in the 2.4 GHz (Giga-Hertz) frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the IEEE 802.11b standard. The IEEE 802.11a standard uses a different frame format with OFDM (Orthogonal Frequency Division Multiplexing) to transmit at rates up to 54 Mbps with carrier frequencies in the 5 GHz range. The IEEE 802.11g specification allows for such OFDM frames to coexist with DSSS/CCK frames at 2.4 GHz.

Figure 13:
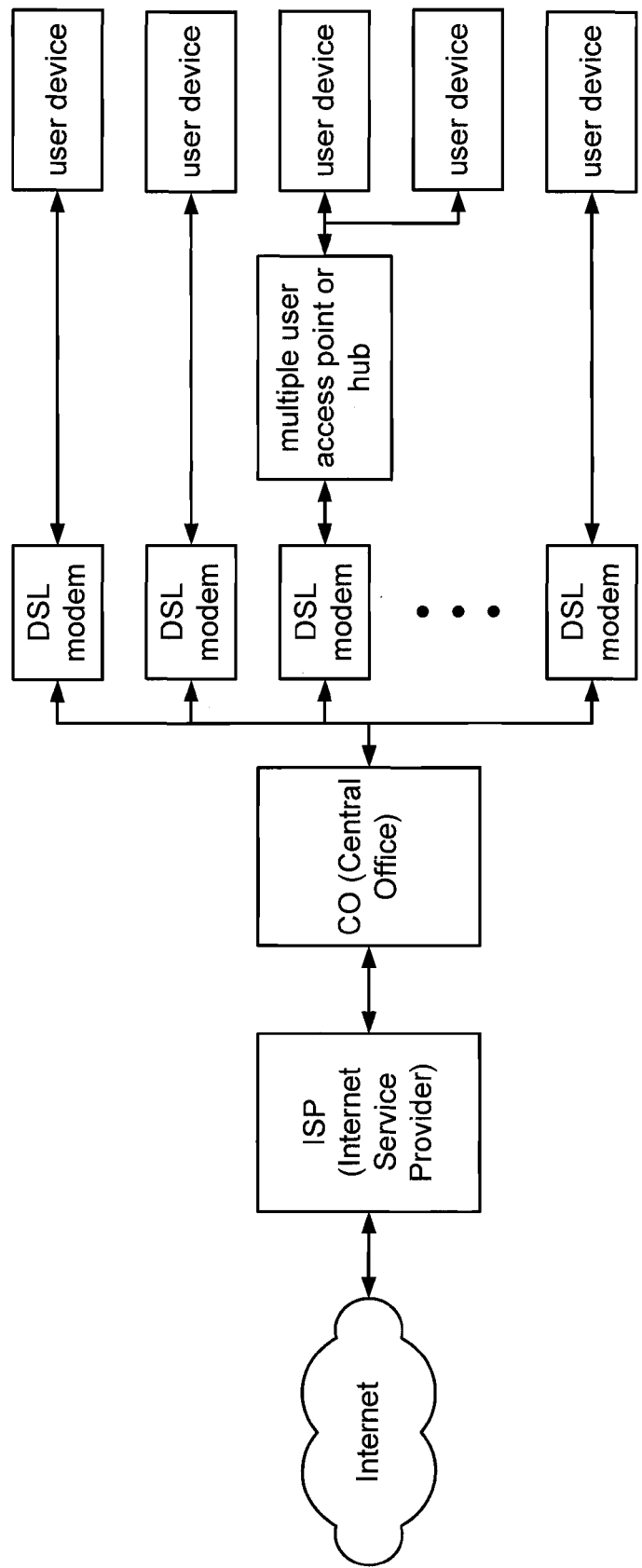
FIG. 13 is a diagram illustrating an embodiment of a DSL (Digital Subscriber Line) communication system that may be implemented according to the invention.

FIG. 13 is a diagram illustrating an embodiment of a DSL (Digital Subscriber Line) communication system that may be implemented according to the invention. The DSL communication system includes an interfacing to the Internet (or some other WAN). In this diagram, the Internet itself is shown, but other WANs may also be employed without departing from the scope and spirit of the invention. An ISP (Internet Service Provider) is operable to communicate data to and from the Internet. The ISP communicatively couples to a CO (Central Office) that is typically operated by a telephone services company. The CO may also allow for the providing of telephone services to one or more subscribers. However, the CO may also be implemented to allow interfacing of Internet traffic to and from one or more users (whose interactive devices are shown as user devices). These user devices may be any device within a wide variety of devices including desk-top computers, laptop computers, servers, and/or hand held devices without departing from the scope and spirit of the invention. Any of these user devices may be wired or wireless type devices as well. Each of the user devices is operably coupled to the CO via a DSL modem. The DSL modem may also be communicatively coupled to a multiple user access point or hub to allow more than one user device to access the Internet.

The CO and the various DSL modems may also be implemented to include an encoder and a decoder to allow bi-directional communication therein. For example, the CO is operable to encode and decode data when communicating to and from the various DSL modems and the ISP. Similarly, each of the various DSL modems is operable to encode and decode data when communicating to and from the CO and its respective one or more user devices.

As within other embodiments that employ an encoder and a decoder, the encoder of any of the CO and the various DSL modems may be implemented to encode information (using its corresponding encoder) in a manner in accordance with the functionality and/or processing of at least some of the various aspects of the invention to assist in generating a signal that is to be launched into the communication channel coupling the CO and the various DSL modems. The decoder of any of the CO and the various DSL modems may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 14:
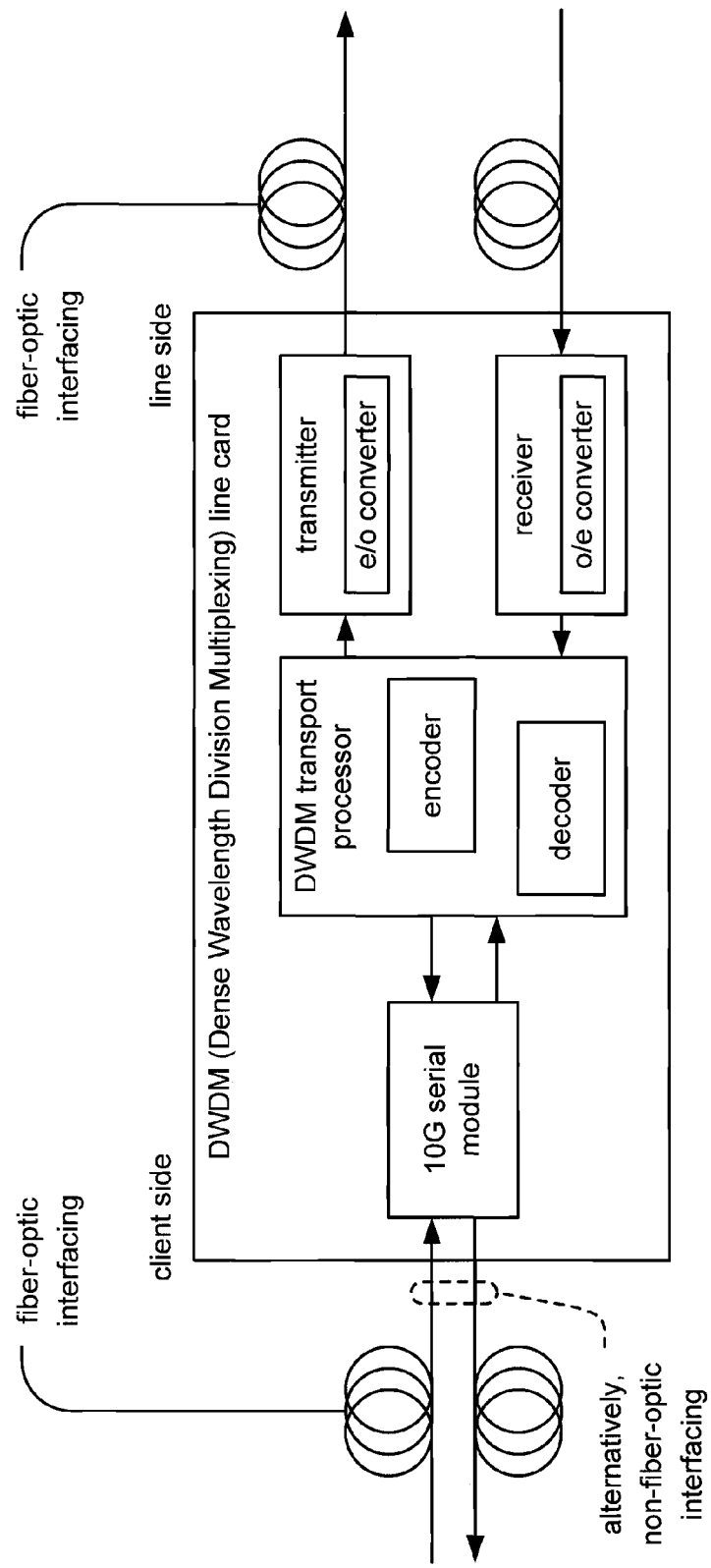
FIG. 14 is a system diagram illustrating an embodiment of a fiber-optic communication system that is built according to the invention.

FIG. 14 is a system diagram illustrating an embodiment of a fiber-optic communication system that is built according to the invention. The fiber-optic communication system includes a DWDM (Dense Wavelength Division Multiplexing, within the context of fiber optic communications) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantages of DWDM can be summarized as follows:

1. The transparency of DWDM: Because DWDM is a PHY (PHYsical layer) architecture, it can transparently support both TDM (Time Division Multiplexing) and data formats such as ATM (Asynchronous Transfer Mode), Gigabit Ethernet, ESCON (Enterprise System CONnection), and Fibre Channel with open interfaces over a common physical layer.

2. The scalability of DWDM: DWDM can leverage the abundance of dark fiber in many metropolitan area and enterprise networks to quickly meet demand for capacity on point-to-point links and on spans of existing SONET/SDH (Synchronous Optical NETwork)/(Synchronous Digital Hierarchy) rings.

3. The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10 G serial module that is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder and a decoder, the encoder is operable to encode information in a manner in accordance with the functionality and/or processing of at least some of the various aspects of the invention to assist in generating a signal that is to be launched into the communication channel to which the DWDM line card is coupled. The decoder is operable to decode a signal received from the communication channel in a manner in accordance with the functionality and/or processing of at least some of the various aspects of the invention. This diagram shows yet another embodiment where one or more of the various aspects of the invention may be found.

Figure 15:
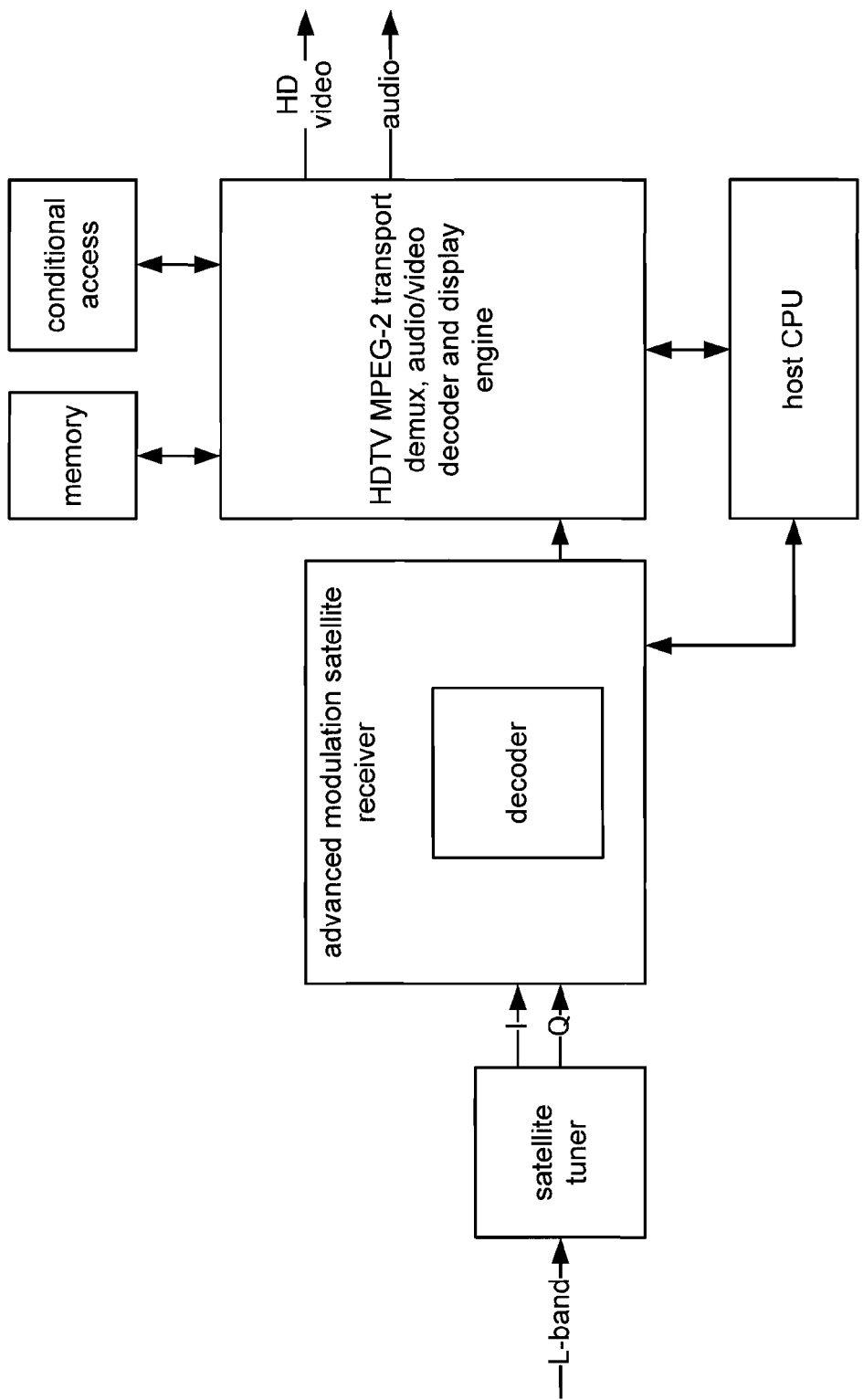
FIG. 15 is a system diagram illustrating an embodiment of a satellite receiver STB (Set Top Box) system that is built according to the invention.

FIG. 15 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band (e.g., within the frequency range between 390-1550 MHz (Mega-Hertz) in the ultrahigh radio frequency range). The satellite tuner extracts I, Q (In-phase, Quadrature) components from a signal received from the L-band and provides them to the advanced modulation satellite receiver. The advanced modulation satellite receiver includes a decoder.

As within other embodiments that employ a decoder, the decoder is operable to decode a signal received from a communication channel to which the advanced modulation satellite receiver is coupled in a manner in accordance with the functionality and/or processing of at least some of the various aspects of the invention. This diagram shows yet another embodiment where one or more of the various aspects of the invention may be found.

The advanced modulation satellite receiver may be implemented to communicatively couple to an HDTV MPEG-2 (Motion Picture Expert Group, level 2) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that operates in a manner in accordance with the functionality and/or processing of at least some of the various aspects of the invention. The advanced modulation satellite receiver is operable to receive communication provided to it from a transmitter device that includes an encoder as well.

Figure 16:
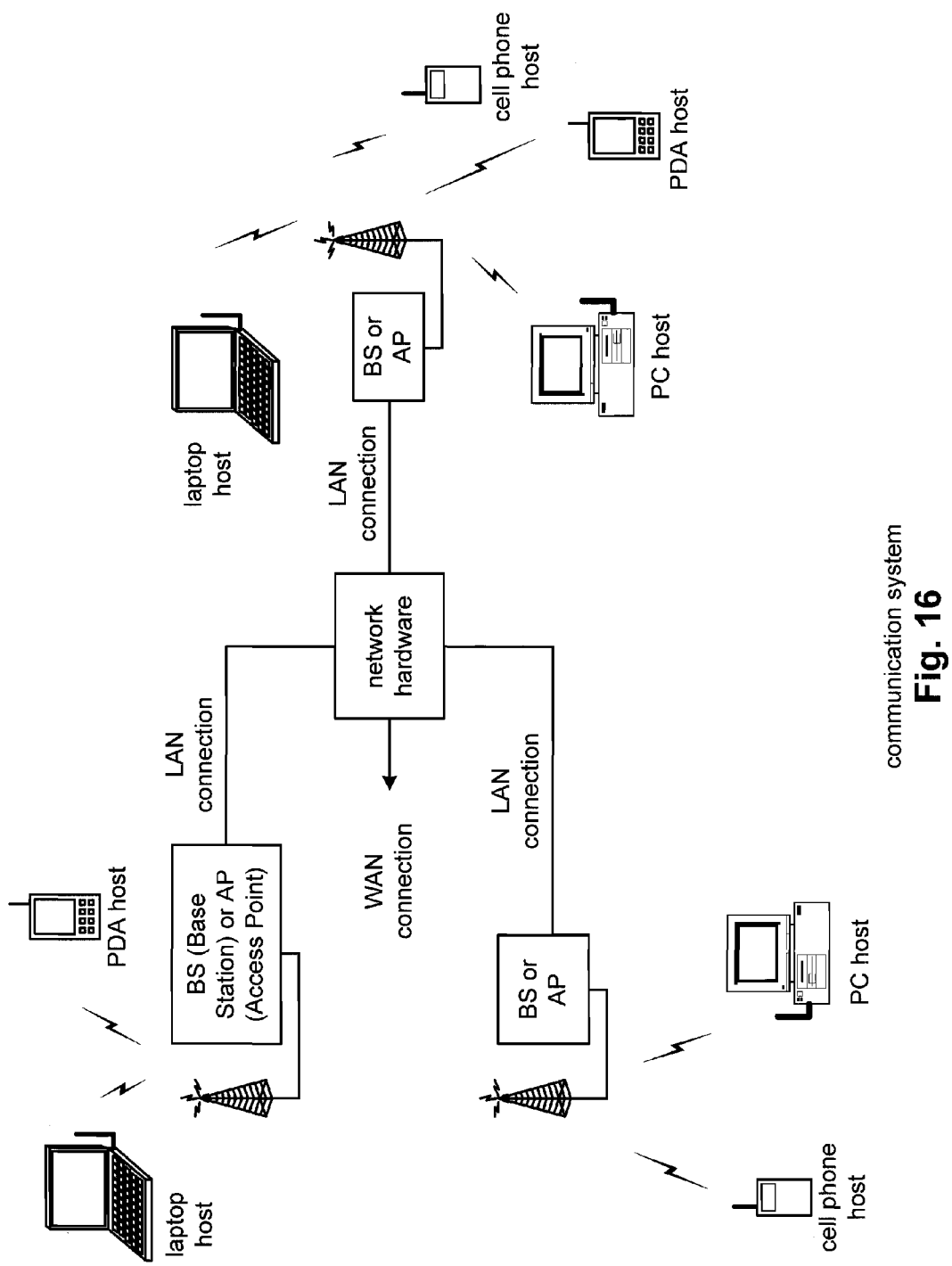
FIG. 16 is a schematic block diagram illustrating a communication system that includes a plurality of base stations and/or access points, a plurality of wireless communication devices and a network hardware component in accordance with certain aspects of the invention.

FIG. 16 is a schematic block diagram illustrating a communication system that includes a plurality of base stations and/or access points, a plurality of wireless communication devices and a network hardware component in accordance with certain aspects of the invention. The wireless communication devices may be laptop host computers, PDA (Personal Digital Assistant) hosts, PC (Personal Computer) hosts and/or cellular telephone hosts. The details of any one of these wireless communication devices is described in greater detail with reference to FIG. 17 below.

The BSs (Base Stations) or APs (Access Points) are operably coupled to the network hardware via the respective LAN (Local Area Network) connections. The network hardware, which may be a router, switch, bridge, modem, system controller, et cetera, provides a WAN (Wide Area Network) connection for the communication system. Each of the BSs or APs has an associated antenna or antenna array to communicate with the wireless communication devices in its area. Typically, the wireless communication devices register with a particular BS or AP to receive services from the communication system. For direct connections (i.e., point-to-point communications), wireless communication devices communicate directly via an allocated channel.

Typically, BSs are used for cellular telephone systems and like-type systems, while APs are used for in-home or in-building wireless networks. Regardless of the particular type of communication system, each wireless communication device includes a built-in radio and/or is coupled to a radio. The radio includes a highly linear amplifier and/or programmable multi-stage amplifier to enhance performance, reduce costs, reduce size, and/or enhance broadband applications.

Figure 17:
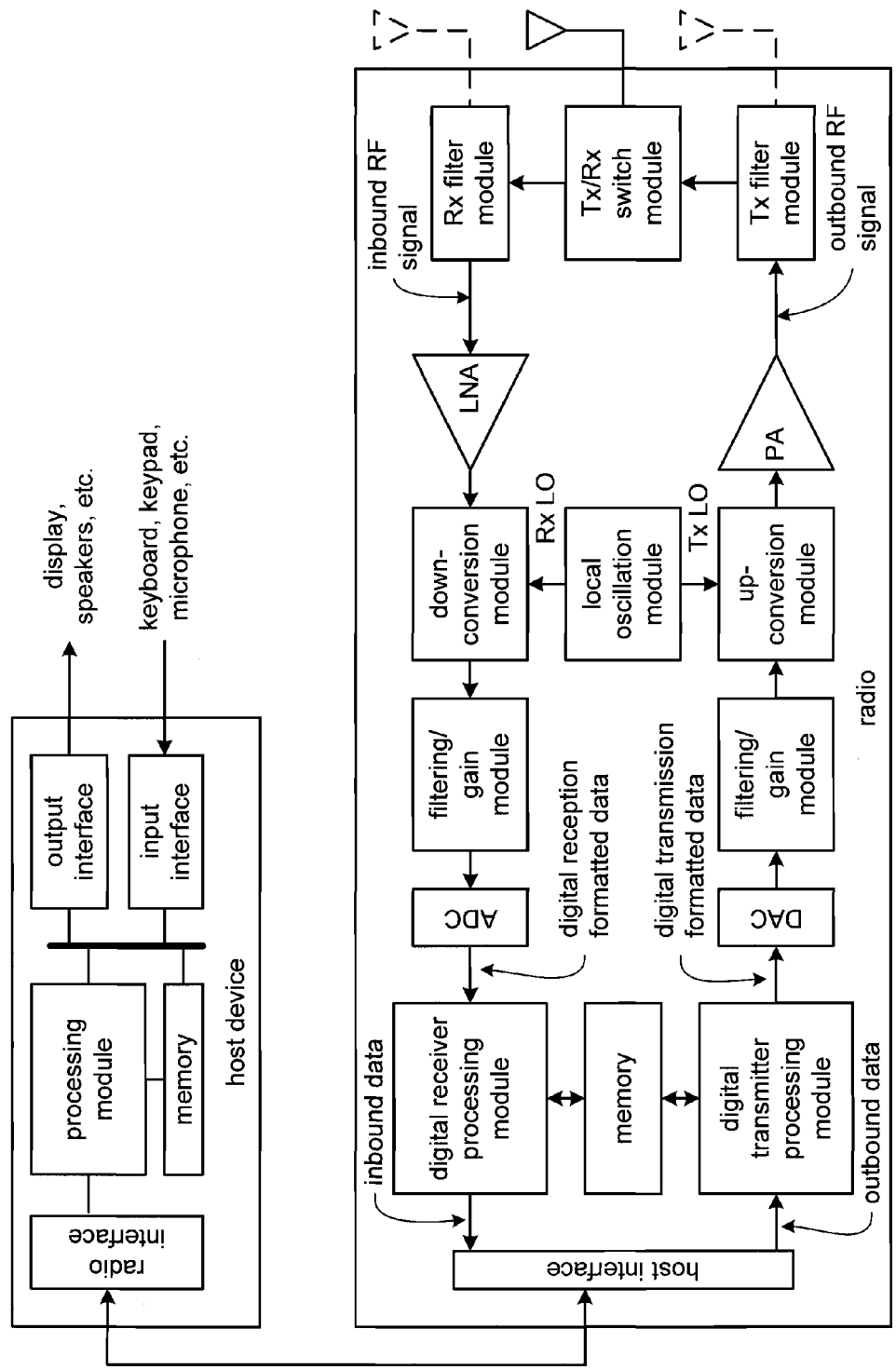
FIG. 17 is a schematic block diagram illustrating a wireless communication device that includes the host device and an associated radio in accordance with certain aspects of the invention.

FIG. 17 is a schematic block diagram illustrating a wireless communication device that includes the host device and an associated radio in accordance with certain aspects of the invention. For cellular telephone hosts, the radio is a built-in component. For PDA (Personal Digital Assistant) hosts, laptop hosts, and/or personal computer hosts, the radio may be built-in or an externally coupled component.

As illustrated, the host device includes a processing module, memory, radio interface, input interface and output interface. The processing module and memory execute the corresponding instructions that are typically done by the host device. For example, for a cellular telephone host device, the processing module performs the corresponding communication functions in accordance with a particular cellular telephone standard or protocol.

The radio interface allows data to be received from and sent to the radio. For data received from the radio (e.g., inbound data), the radio interface provides the data to the processing module for further processing and/or routing to the output interface. The output interface provides connectivity to an output display device such as a display, monitor, speakers, et cetera, such that the received data may be displayed or appropriately used. The radio interface also provides data from the processing module to the radio. The processing module may receive the outbound data from an input device such as a keyboard, keypad, microphone, et cetera, via the input interface or generate the data itself. For data received via the input interface, the processing module may perform a corresponding host function on the data and/or route it to the radio via the radio interface.

The radio includes a host interface, a digital receiver processing module, an ADC (Analog to Digital Converter), a filtering/gain module, an IF (Intermediate Frequency) mixing down conversion stage, a receiver filter, an LNA (Low Noise Amplifier), a transmitter/receiver switch, a local oscillation module, memory, a digital transmitter processing module, a DAC (Digital to Analog Converter), a filtering/gain module, an IF mixing up conversion stage, a PA (Power Amplifier), a transmitter filter module, and an antenna. The antenna may be a single antenna that is shared by the transmit and the receive paths as regulated by the Tx/Rx (Transmit/Receive) switch, or may include separate antennas for the transmit path and receive path. The antenna implementation will depend on the particular standard to which the wireless communication device is compliant.

The digital receiver processing module and the digital transmitter processing module, in combination with operational instructions stored in memory, execute digital receiver functions and digital transmitter functions, respectively. The digital receiver functions include, but are not limited to, digital IF (Intermediate Frequency) to baseband conversion, demodulation, constellation de-mapping, decoding, and/or descrambling. The digital transmitter functions include, but are not limited to, scrambling, encoding, constellation mapping, modulation, and/or digital baseband to IF conversion.

Similarly to other embodiments that employ an encoder and a decoder (or perform encoding and decoding), the encoding operations that may be performed by the digital transmitter processing module may be implemented in a manner in accordance with the functionality and/or processing of at least some of the various aspects of the invention to assist in generating a signal that is to be launched into the communication channel coupling to the wireless communication device. Analogously, the decoding operations of the operations that may be performed by the digital transmitter processing module may be implemented in a manner in accordance with the functionality and/or processing of at least some of the various aspects of the invention. For example, the encoding operations performed by the digital transmitter processing module may be performed using LDPC coding as described and presented herein, and the decoding operations that may be performed by the digital receiver processing module may be performed using the simultaneous and parallel approach to updating of edge messages.

The digital receiver and transmitter processing modules may be implemented using a shared processing device, individual processing devices, or a plurality of processing devices. Such a processing device may be a microprocessor, micro-controller, DSP (Digital Signal Processor), microcomputer, CPU (Central Processing Unit), FPGA (Field Programmable Gate Array), programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a ROM (Read Only Memory), RAM (Random Access Memory), volatile memory, non-volatile memory, static memory, dynamic memory, flash memory, and/or any device that stores digital information. It is noted that when either of the digital receiver processing module or the digital transmitter processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio receives outbound data from the host device via the host interface. The host interface routes the outbound data to the digital transmitter processing module, which processes the outbound data in accordance with a particular wireless communication standard (e.g., IEEE 802.11, Bluetooth®, et cetera) to produce digital transmission formatted data. The digital transmission formatted data is a digital base-band signal or a digital low IF signal, where the low IF typically will be in the frequency range of one hundred kHz (kilo-Hertz) to a few MHz (Mega-Hertz).

The DAC converts the digital transmission formatted data from the digital domain to the analog domain. The filtering/gain module filters and/or adjusts the gain of the analog signal prior to providing it to the IF mixing stage. The IF mixing stage converts the analog baseband or low IF signal into an RF signal based on a transmitter local oscillation provided by local oscillation module. The PA amplifies the RF signal to produce outbound RF signal, which is filtered by the transmitter filter module. The antenna transmits the outbound RF signal to a targeted device such as a base station, an access point and/or another wireless communication device.

The radio also receives an inbound RF signal via the antenna, which was transmitted by a BS, an AP, or another wireless communication device. The antenna provides the inbound RF signal to the receiver filter module via the Tx/Rx switch, where the Rx filter bandpass filters the inbound RF signal. The Rx filter provides the filtered RF signal to the LNA, which amplifies the signal to produce an amplified inbound RF signal. The LNA provides the amplified inbound RF signal to the IF mixing module, which directly converts the amplified inbound RF signal into an inbound low IF signal or baseband signal based on a receiver local oscillation provided by local oscillation module. The down conversion module provides the inbound low IF signal or baseband signal to the filtering/gain module. The filtering/gain module filters and/or gains the inbound low IF signal or the inbound baseband signal to produce a filtered inbound signal.

The ADC converts the filtered inbound signal from the analog domain to the digital domain to produce digital reception formatted data. In other words, the ADC samples the incoming continuous time signal thereby generating a discrete time signal (e.g., the digital reception formatted data). The digital receiver processing module decodes, descrambles, demaps, and/or demodulates the digital reception formatted data to recapture inbound data in accordance with the particular wireless communication standard being implemented by radio. The host interface provides the recaptured inbound data to the host device via the radio interface.

As one of average skill in the art will appreciate, the wireless communication device of FIG. 17 may be implemented using one or more integrated circuits. For example, the host device may be implemented on one integrated circuit, the digital receiver processing module, the digital transmitter processing module and memory may be implemented on a second integrated circuit, and the remaining components of the radio, less the antenna, may be implemented on a third integrated circuit. As an alternate example, the radio may be implemented on a single integrated circuit. As yet another example, the processing module of the host device and the digital receiver and transmitter processing modules may be a common processing device implemented on a single integrated circuit. Further, the memories of the host device and the radio may also be implemented on a single integrated circuit and/or on the same integrated circuit as the common processing modules of processing module of the host device and the digital receiver and transmitter processing module of the radio.

Figure 18:
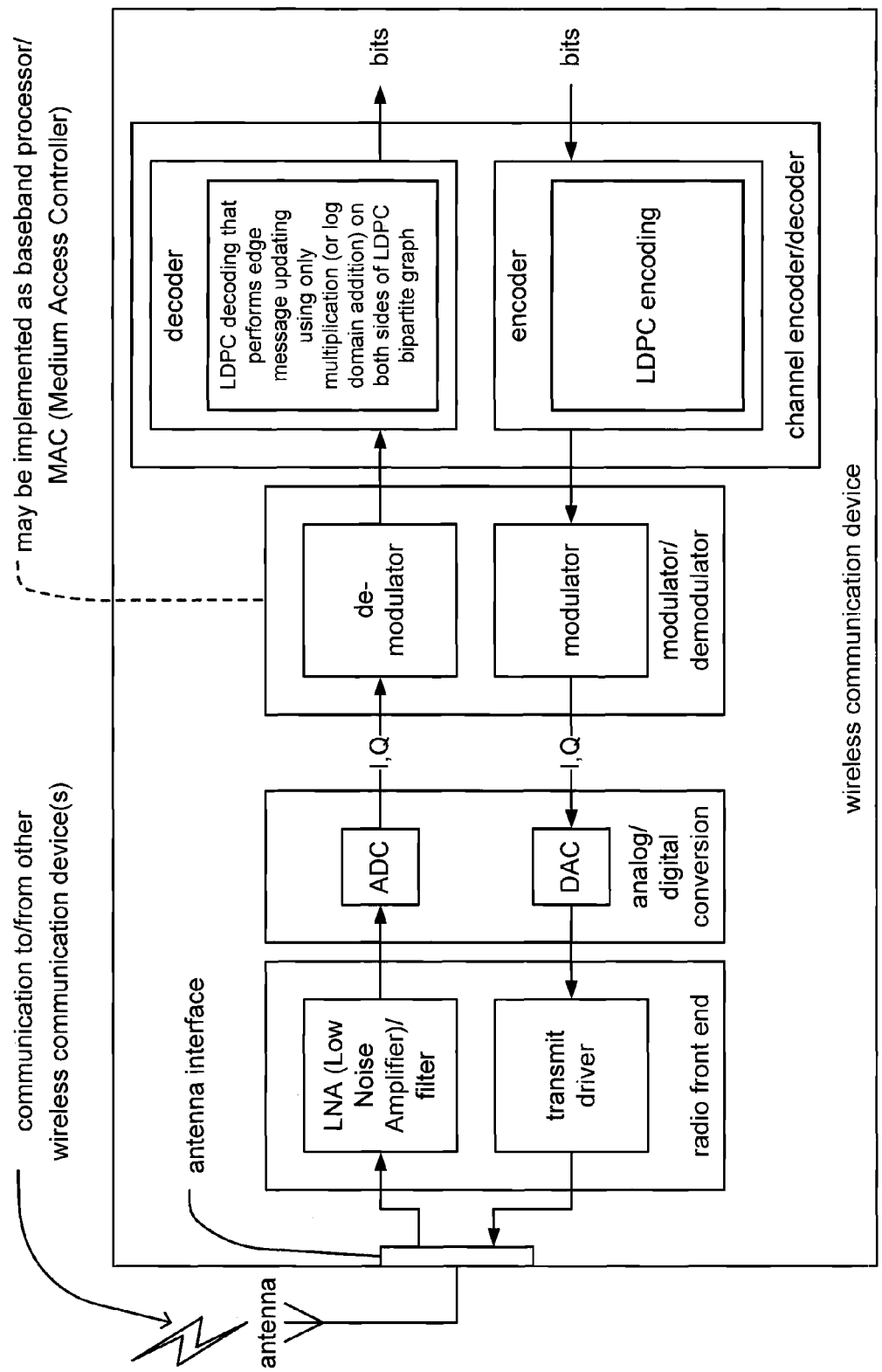
FIG. 18 is a diagram illustrating an alternative embodiment of a wireless communication device that is constructed according to the invention.

FIG. 18 is a diagram illustrating an alternative embodiment of a wireless communication device that is constructed according to the invention. This embodiment of a wireless communication device includes an antenna that is operable to communicate with any 1 or more other wireless communication devices. An antenna interface communicatively couples a signal to be transmitted from the wireless communication device or a signal received by the wireless communication device to the appropriate path (be it the transmit path or the receive path).

A radio front end includes receiver functionality and transmitter functionality. The radio front end communicatively couples to an analog/digital conversion functional block. The radio front end communicatively couples to a modulator/demodulator, and the radio front end communicatively couples to a channel encoder/decoder.

Along the Receive Path:

The receiver functionality of the front end includes a LNA (Low Noise Amplifier)/filter. The filtering performed in this receiver functionality may be viewed as the filtering that is limiting to the performance of the device, as also described above. The receiver functionality of the front end performs any down-converting that may be requiring (which may alternatively include down-converting directly from the received signal frequency to a baseband signal frequency). The general operation of the front end may be viewed as receiving a continuous time signal, and performing appropriate filtering and any down conversion necessary to generate the baseband signal. Whichever manner of down conversion is employed, a baseband signal is output from the receiver functionality of the front end and provided to an ADC (Analog to Digital Converter) that samples the baseband signal (which is also a continuous time signal, though at the baseband frequency) and generates a discrete time signal baseband signal (e.g., a digital format of the baseband signal); the ADC also extracts and outputs the digital I, Q (In-phase, Quadrature) components of the discrete time signal baseband signal.

These I, Q components are provided to a demodulator portion of the modulator/demodulator where any modulation decoding/symbol mapping is performed where the I, Q components of the discrete time signal baseband signal. The appropriate I, Q components are then mapped to an appropriate modulation (that includes a constellation and corresponding mapping). Examples of such modulations may include BPSK (Binary Phase Shift Key), QPSK (Quadrature Phase Shift Key), 8 PSK (8 Phase Shift Key), 16 QAM (16 Quadrature Amplitude Modulation), and even higher order modulation types. These demodulated symbols are then provided to a decoder portion of the channel encoder/decoder where best estimates of the information bits contained within the originally received continuous time signal are made.

Along the Transmit Path:

Somewhat analogous and opposite processing is performed in the transmit path when compared to the receive path. Information bits that are to be transmitted are encoded using an encoder of the channel encoder/decoder. These encoded bits are provided to a modulator of the modulator/demodulator where modulation encoding/symbol mapping may be performed according to the modulation of interest. These now I, Q components of the symbols are then passed to a DAC (Digital to Analog Converter) of the analog/digital conversion functional block to transform the I, Q components into a continuous time transmit signal (e.g., an analog signal). The now continuous time transmit signal to be transmitted is then passed to a transmit driver that performs any necessary up-converting/modification to the continuous time transmit signal (e.g., amplification and/or filtering) to comport it to the communication channel over which the signal is to be transmitted to another device via the antenna.

As within other embodiments that employ an encoder and a decoder, the encoder of this wireless communication device may be implemented to encode information in a manner in accordance with the functionality and/or processing of at least some of the various aspects of the invention to assist in generating a signal that is to be launched into the communication channel coupling to the wireless communication device. The decoder of the wireless communication device may be implemented to decode a received signal in a manner in accordance with the functionality and/or processing of at least some of the various aspects of the invention. This diagram shows yet another embodiment where one or more of the various aspects of the invention may be found.

In addition, several of the following Figures describe particular embodiments (in more detail) that may be used to implement some of the various aspects of invention that include LDPC decoding that performs updating of edge messages using only multiplication (or log domain addition) on both sides of LDPC bipartite graph. Several details of these various aspects are provided below. Initially, a general description of LDPC codes is provided.

Figure 19:
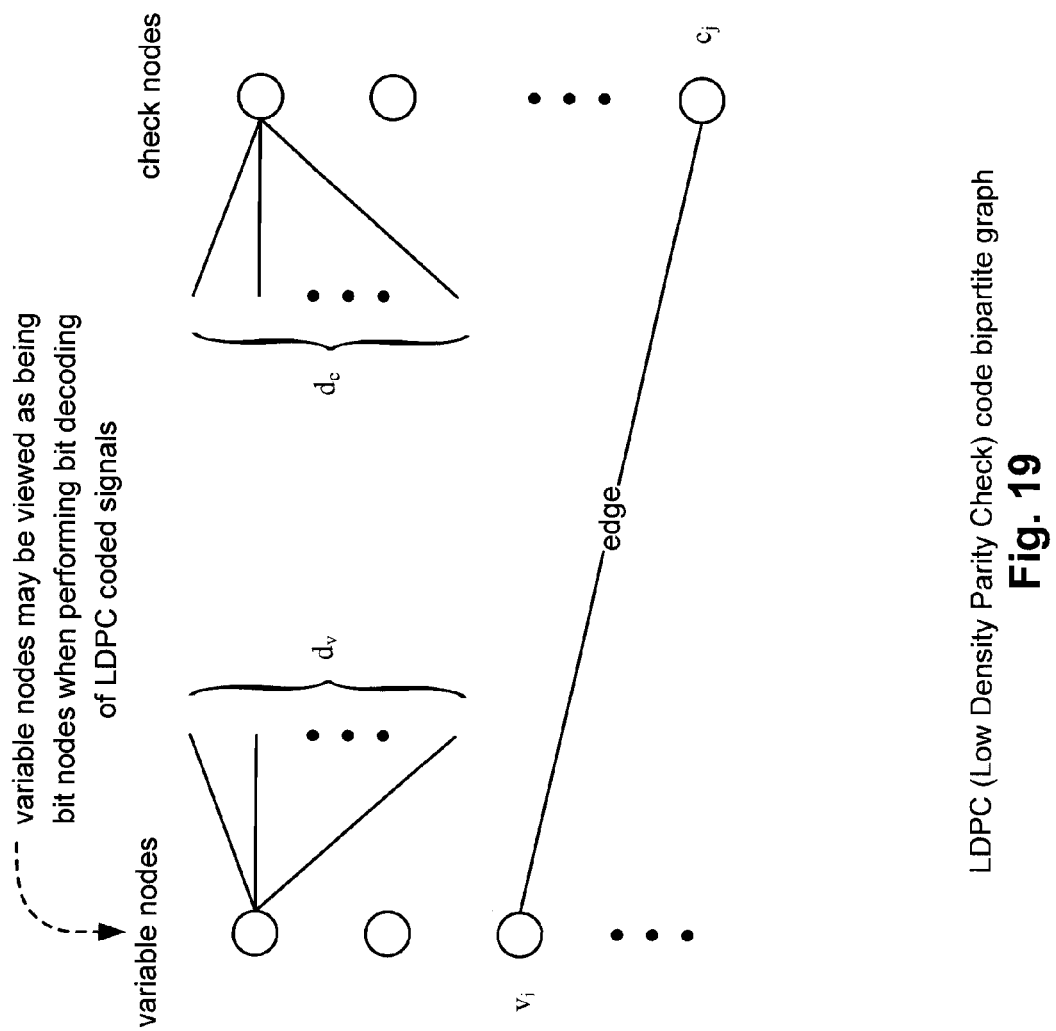
FIG. 19 is a diagram illustrating an embodiment of an LDPC (Low Density Parity Check) code bipartite graph.

FIG. 19 is a diagram illustrating an embodiment of an LDPC (Low Density Parity Check) code bipartite graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced above and by M. Lugy et al. in [2] also referenced above.

A regular LDPC code can be represented as a bipartite graph by its parity check matrix with left side nodes representing variable of the code bits, and the right side nodes representing check equations. The bipartite graph of the code defined by H may be defined by N variable nodes (e.g., N bit nodes) and M check nodes. Every variable node of the N variable nodes has exactly $d_v(i)$ edges connecting this node to one or more of the check nodes (within the M check nodes). This number of $d_v$ edges may be referred to as the degree of a variable node i. Analogously, every check node of the M check nodes has exactly $d_c(j)$ edges connecting this node to one or more of the variable nodes. This number of $d_c$ edges may be referred to as the degree of the check node j.

An edge between a variable node $v_i$ (or bit node $b_i$) and check node $c_j$ may be defined by $e=(i, j)$. However, on the other hand, given an edge $e=(i, j)$, the nodes of the edge may alternatively be denoted as by $e=(v(e),c(e))$ (or $e=(b(e),c(e))$). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. The reader is referred to the DESCRIPTION OF RELATED ART section above that described the SPA approach by which LDPC coded signals are conventionally decoded.

It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Lugy et al. in [2] referenced above.

In general, with a graph of an LDPC code, the parameters of an LDPC code can be defined by a degree of distribution, as described within M. Lugy et al. in [2] referenced above and also within the following reference:

[5] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that the invention is also operable to accommodate both regular LDPC codes and irregular LDPC codes.

The LLR (Log-Likelihood Ratio) decoding of LDPC codes may be described as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code that is use to check the parity of the received vector. The LLR is the logarithm of the ratio of these two calculated probabilities. This LLR will give a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, with the sent signal having the form of $((-1)^{v_0}, \ldots, (-1)^{v_{N-1}})$, then the metrics of the channel may be defined as $p(y_i|v_i=0)$, $p(y_i|v_i=1)$, $i=0, \ldots, N-1$. The LLR of a metric will then be defined as follows:

$$L_{metric}(i) = \ln \frac{p(y_i | v_i = 0)}{p(y_i | v_i = 1)}$$

For every variable node $v_i$, its LLR information value will then be defined as follows:

$$\ln \frac{p(v_i = 0 | y_i)}{p(v_i = 1 | y_i)} = L_{metric}(i) + \ln \frac{p(v_i = 0)}{p(v_i = 1)}$$

Since the variable node, $v_i$, is in a codeword, then the value of the ratio of these, $$\ln \frac{p(v_i = 0)}{p(v_i = 1)},$$

may be replaced by the following $$\ln$$

$$\ln \frac{p(v_i = 0, vH^T = 0 | y)}{p(v_i = 1, vH^T = 0 | y)} = \sum_{(i,j) \in E_v(i)} \ln \frac{p(v_i = 0, vh_j^T = 0 | y)}{p(v_i = 1, vh_j^T = 0 | y)}$$

where $E_v(i)$ is a set of edges starting with $v_i$ as defined above.

When performing the BP (Belief Propagation) decoding approach in this context, then the value of ln $$\ln \frac{p(v_i = 0, vh_j^T = 0 | y)}{p(v_i = 1, vh_j^T = 0 | y)}$$

may be replaced by the following relationship $$L_{check}(i, j) = \ln \frac{p\left(\sum_{e \in E_c(j) \setminus \{(i,j)\}} v_{v(e)} = 0 | y\right)}{p\left(\sum_{e \in E_c(j) \setminus \{(i,j)\}} v_{v(e)} = 1 | y\right)}$$

$L_{check}(i, j)$ is called the EXT (extrinsic) information of the check node $c_j$ with respect to the edge (i, j). In addition, it is noted that $e \in E_c(j) \setminus \{(i, j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual bit values within a received vector. Also in a BP approach, then the extrinsic information of the variable node $v_i$ with respect to the edge (i, j) may be defined as follows:

$$L_{var}(i, j) = L_{metric}(i) + \sum_{(i,k) \in E_v(i) \setminus \{(i,j)\}} L_{check}(i, k).$$

From certain perspectives, the invention may also be implemented within communication systems that involve combining modulation coding with LDPC coding to generate LDPC coded modulation signals. These LDPC coded modulation signals may be such that they have a code rate and/or modulation (constellation and mapping) that varies as frequently as on a symbol by symbol basis.

Figure 20:
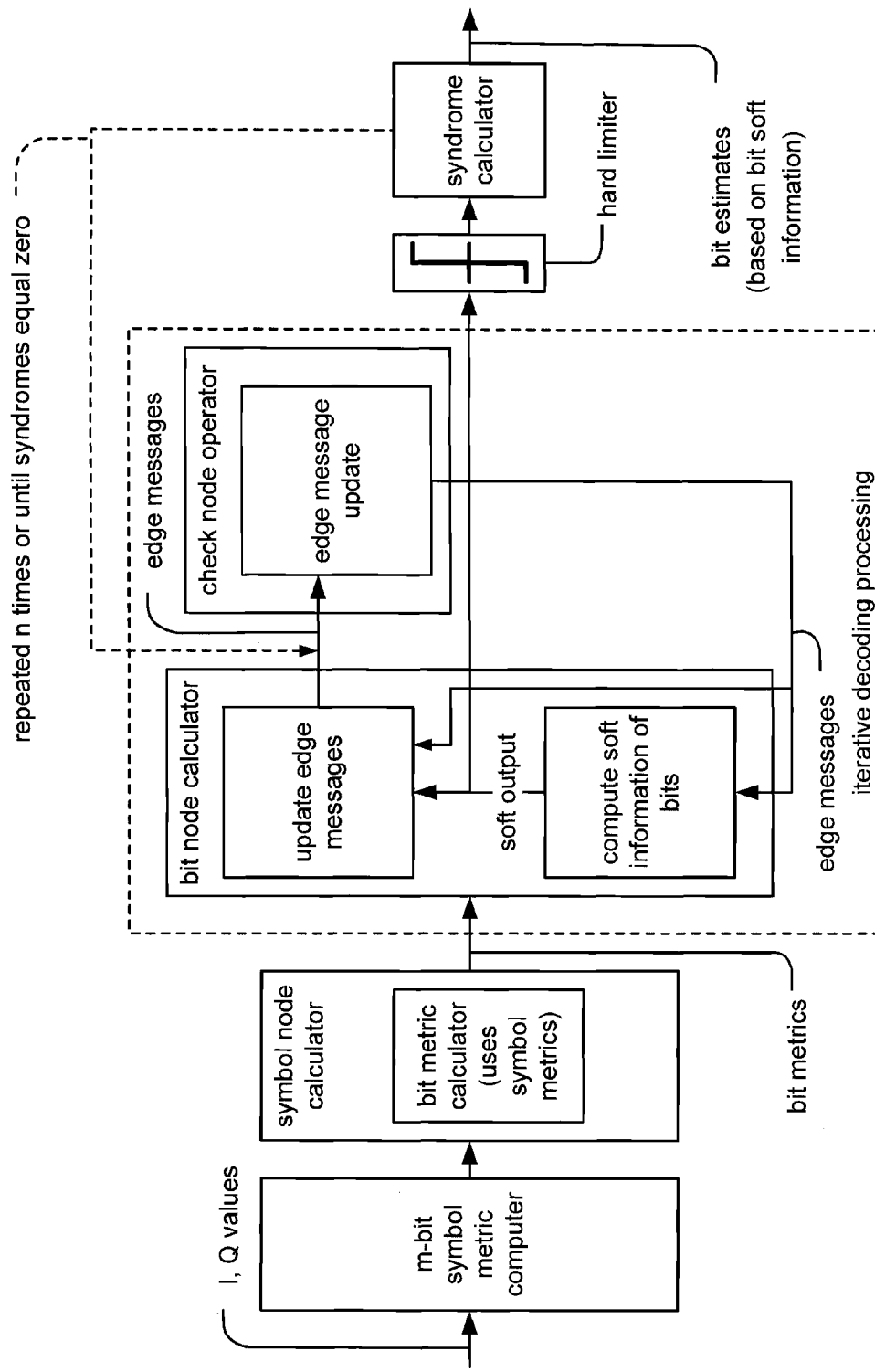
FIG. 20 is a diagram illustrating an embodiment of LDPC (Low Density Parity Check) decoding functionality using bit metric according to the invention.

FIG. 20 is a diagram illustrating an embodiment of LDPC (Low Density Parity Check) decoding functionality using bit metric according to the invention. To perform decoding of an LDPC coded signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. The iterative processing continues between the bit nodes and the check nodes according to the LDPC code bipartite graph that was employed to encode the signal that is being decoded.

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 21:
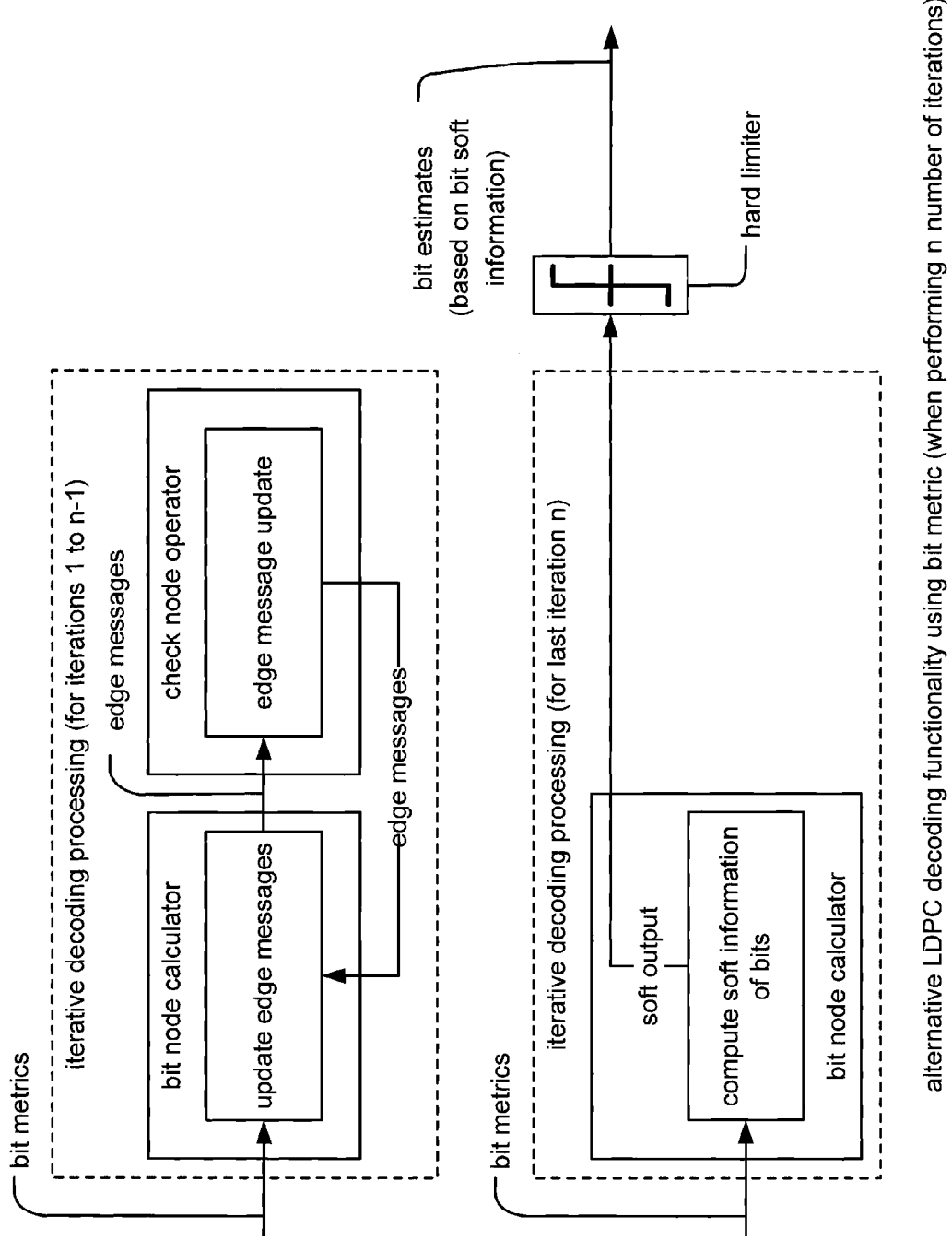
FIG. 21 is a diagram illustrating an alternative embodiment of LDPC decoding functionality using bit metric according to the invention (when performing n number of iterations).

FIG. 21 is a diagram illustrating an alternative embodiment of LDPC decoding functionality using bit metric according to the invention (when performing n number of iterations). This embodiment shows how the iterative decoding processing may be performed when a predetermined number of decoding iterations, shown as n, is performed. If the number of decoding iterations is known beforehand, as in a predetermined number of decoding iterations embodiment, then the bit node calculator functional block may perform the updating of its corresponding edge messages using the bit metrics themselves (and not the soft information of the bits as shown in the previous embodiment and described above). This processing may be performed in all but a final iterative decoding iteration (e.g., for iterations 1 through n−1). However, during the final iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

FIG. 22 is a diagram illustrating an alternative embodiment of LDPC (Low Density Parity Check) decoding functionality using bit metric (with bit metric updating) according to the invention. To perform decoding of an LDPC coded signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes. The symbol node calculator functional block is also operable to perform bit metric updating during subsequent decoding iterations.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. This updating of the edge messages may be performed using the updated bit metrics during subsequent iterations. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. At the same time, as the just calculated soft information of the bits (shown as the soft message) has been calculated, this information may be passed back to the symbol nodes (e.g., to the symbol node calculator functional block) for updating of the bit metrics employed within subsequent decoding iterations. The iterative processing continues between the bit nodes and the check nodes according to the LDPC code bipartite graph that was employed to encode the signal that is being decoded (by also employing the updated bit metrics during subsequent decoding iterations).

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When they are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

FIG. 23 is a diagram illustrating an alternative embodiment of LDPC decoding functionality using bit metric (with bit metric updating) according to the invention (when performing n number of iterations). This embodiment shows how the iterative decoding processing may be performed when a predetermined number of decoding iterations, shown as n, is performed (again, when employing bit metric updating). If the number of decoding iterations is known beforehand, as in a predetermined number of decoding iterations embodiment, then the bit node calculator functional block may perform the updating of its corresponding edge messages using the bit metrics/updated bit metrics themselves (and not the soft information of the bits as shown in the previous embodiment and described above). This processing may be performed in all but a final decoding iteration (e.g., for iterations 1 through n−1). However, during the final iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 24A:
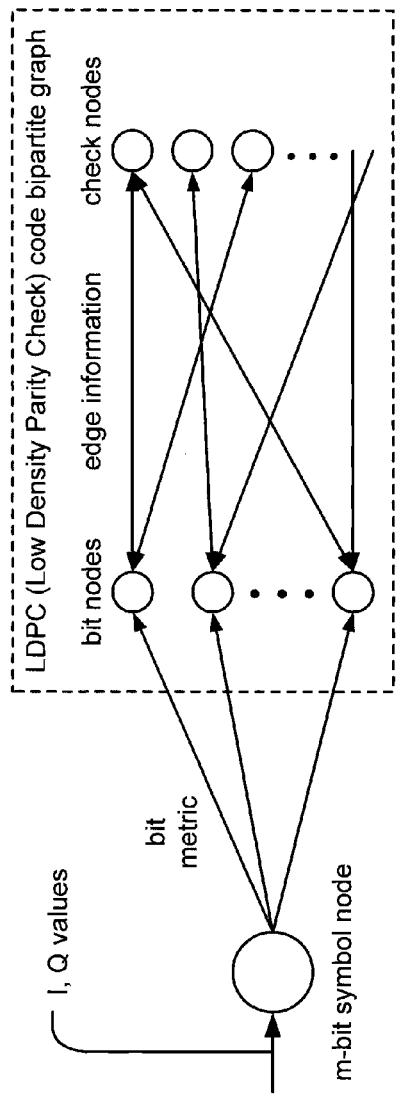
FIG. 24A is a diagram illustrating bit decoding using bit metric (shown with respect to an LDPC (Low Density Parity Check) code bipartite graph) according to the invention.

FIG. 24A is a diagram illustrating bit decoding using bit metric (shown with respect to an LDPC (Low Density Parity Check) code bipartite graph) according to the invention. Generally speaking, after receiving I, Q values of a signal at a symbol nodes, the m-bit symbol metrics are computed. Then, at the symbol nodes, the symbol metric is used to calculate the bit metric. The bit metric is then passed to the bit nodes connected to the symbol nodes. At the bit nodes, the soft messages of the bits are computed, and they are used to update the edge message sent from the check nodes with the bit metric. These edge messages are then passed to the check nodes. At the check nodes, updating of the edge messages sent from the bit nodes is performed, and these values are pass back the bit nodes.

As also described above with respect to the corresponding functionality embodiment, after all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 24B:
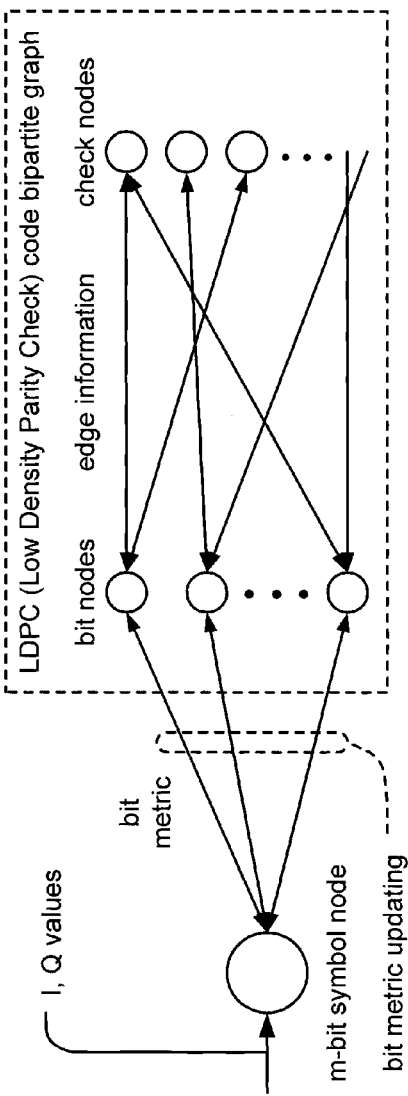
FIG. 24B is a diagram illustrating bit decoding using bit metric updating (shown with respect to an LDPC (Low Density Parity Check) code bipartite graph) according to the invention.

FIG. 24B is a diagram illustrating bit decoding using bit metric updating (shown with respect to an LDPC (Low Density Parity Check) code bipartite graph) according to the invention. With respect to this LDPC code bipartite graph that performs bit metric updating, the decoding processing may be performed as follows:

After receiving the I, Q value of the signal at the symbol nodes, the m-bit symbol metrics are computed. Then, at the symbol nodes, the symbol metrics are used to calculate the bit metrics. These values are then passed to the bit nodes connected to the symbol nodes. At the bit nodes, the edge message sent from the check nodes are updated with the bit metrics, and these edge messages are passed to the check nodes. In addition, at the same time the soft bit information is updated and passed back to the symbol nodes. At the symbol nodes, the bit metrics are updated with the soft bit information sent from the bit nodes, and these values are passed back to the variable nodes. At the check nodes, the edge information sent from the bit nodes is updated, and this information is passed back to the bit nodes.

As also described above with respect to the corresponding functionality embodiment, after all of these iterative decoding processing steps have been performed, then the best estimates of the bits are output based on the bit soft information. Again, it is shown in this embodiment that the bit metric values are not fixed; they are updated for use within subsequent decoding iterations. This is again in contradistinction to the embodiment described above where the bit metric values that are calculated only once and remain fixed values for all of the decoding iterations.

Figure 25:
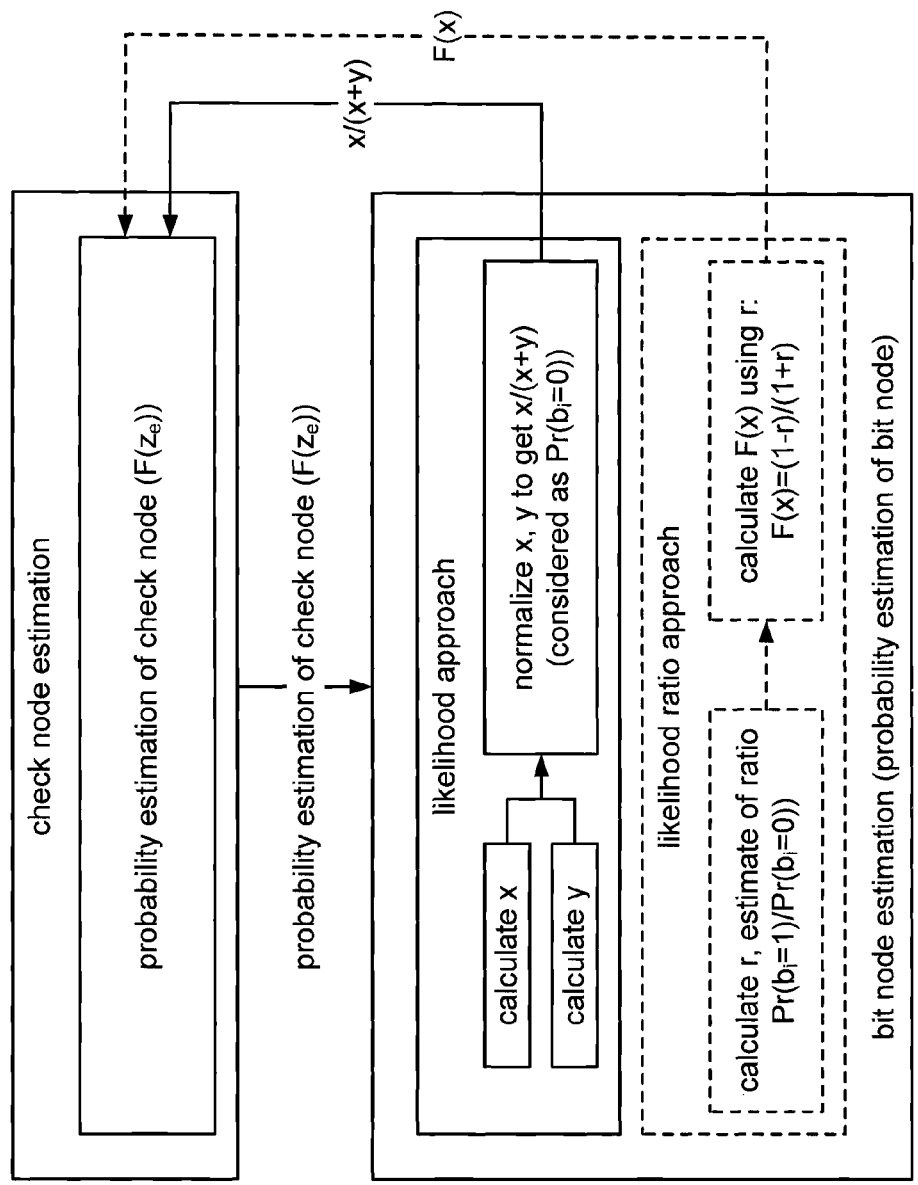
FIG. 25 is a diagram illustrating an embodiment of check node and bit node estimation functionality (employing likelihood decoding at check node side) according to the invention.

FIG. 25 is a diagram illustrating an embodiment of check node and bit node estimation functionality (employing likelihood decoding at check node side) according to the invention. This embodiment shows the functionality employed when estimating the bit node and estimating the check node within the LDPC decoding processing employed according likelihood decoding in accordance with the invention. The check node estimate is initially described below.

This description begins by considering a check node i. The set of edges connecting from this check node i to its corresponding bit nodes may be denoted as $E_c(j)=\{(i_k,j)|k=0, \ldots, n-1\}$. A codeword that is to be decoded may be represented as $b=(b_0,\ldots,b_{N-1})$. Then, by the definition of the parity check according to the LDPC code, the following relationship holds true:

$$\sum_{k=0}^{n-1} b_{i_k} = 0 \qquad (EQ\ 3)$$

For every edge $e \in E_c(j)$ (which may be represented as $e=(i_0, j)$ for convenience), the estimation of the check node may be calculated as follows:

$$z_e = Pr\left(\sum_{k=0}^{n-1} b_{i_k} = 0 \mid b_{i_o} = 0\right) = Pr\left(\sum_{k=1}^{n-1} b_{i_k} = 0\right) \qquad (EQ\ 4)$$

Denote $x_k = Pr(b_{i_k}=0)$. When $n=3$, without lost of generality, let $x=x_1$ and $y=x_2$, then $$z_e = xy + (1-x)(1-y) \qquad (EQ\ 5)$$

From (EQ 5), one can see that z is a "sum product" of the variables x and y. To transform the "sum product" calculation to being only a "product" calculation, the following map may be employed:

$$F(x) = 2x-1 \qquad (EQ\ 6)$$

With this appropriately defined map, (EQ 5) is then transformed to the following:

$$F(z) = F(x)F(y) \qquad (EQ\ 7)$$

To prove (EQ 7), the following is provided:

$$F(z) = 2xy + 2(1-x)(1-y) - 1 = 4xy - 2x - 2y + 1 \qquad (EQ\ 8)$$
$$= (2x-1)(2y-1) = F(x)F(y)$$

In general, let $e=(i_1, j)$, denote $$z_{n-1} = Pr\left(\sum_{k \neq 1, k=0}^{n-2} b_{i_k} = 0\right),$$

then $$z_e = z_{n-1} x_{n-1} + (1-z_{n-1})(1-x_{n-1}) \qquad (EQ\ 9)$$

Therefore, the following is also true.

$$F(z_e) = F(z_{n-1})F(x_{n-1}) = \prod_{k \neq 1} F(x_k) \qquad (EQ\ 10)$$

With equation (EQ 10), the probability estimation of check node, $F(z_e)$, is just the product of terms function of its corresponded bit nodes probability estimations, $F(x_k)$. Here the "sum" part in the conventional decoder (e.g. that employs the SPA approach as described above) is eliminated. By using the appropriate mapping as described above, the calculations that are needed to perform updating of edge messages may be performed using only multiplication (or log domain addition). In short, the updating of the estimation of the check nodes may be implemented as a product of terms function only. Within the log domain, this may be implemented as using a sum of terms function.

The bit node estimate is now described below with respect to this diagram.

A bit node i is now considered. Let $E_b(i)=\{(i,j_k), k=0,\ldots, m-1\}$ be the set of edges connected from this bit node to its corresponding check nodes. Let $S_{j_0},\ldots,S_{j_{m-1}}$ be the check equations that correspond the check node $j_0,\ldots,j_{m-1}$. Let $b=(b_0,\ldots,b_{n-1})$ be a codeword, then the following probability calculation is true:

$$Pr(b_I=0, b \text{ is a codeword}) = Pr(b_i=0, S_{j_k}=0, k=0,\ldots m-1) \qquad (EQ\ 11)$$

Denote $T_k = S_{j_k} + b_i$ (where + means binary addition). In the BP (Belief Propagation) decoding approach, the probability calculation presented above within (EQ 11) is replaced by the following calculation:

$$x = \text{metric}(i) \prod_{k=0}^{m-1} Pr(T_k = 0) \qquad (EQ\ 12)$$

The bit metric metric(i) is computed from the received signal. The second part of the (EQ 12) is the product of terms function of the value $z_e, e \in E_b(i)$, defined in (EQ 4) above. Since the values of $F(z_e)$, whose calculation is shown above, is passed from the check nodes, the following calculation can be made here at the bit nodes:

$$x = \text{metric}(i) \prod_{e \in E_b(i)} z_e = \text{metric}(i) \prod_{e \in E_b(i)} \left(\frac{F(z_e)+1}{2}\right) \qquad (EQ\ 13)$$

However, since (EQ 12) is not exactly equivalent to (EQ 16), the following relationship is presented:

$$1-x \neq Pr(b_i=1, b \text{ is a codeword}) \qquad (EQ\ 14)$$

In order to carry the computation on the check nodes (which is presented above with respect to this diagram), the probability of $b_i=0$ needs to be passed to the check nodes. Two alternative approaches of generating this information are given below;
they are the likelihood approach and the likelihood ratio approach.

Likelihood Approach

Estimate $Pr(b_i=1, b$ is a codeword) using $$y = \qquad (EQ\ 15)$$
$$(1-\text{metric}(i)) \prod_{e \in E_b(i)} (1-z_e) = (1-\text{metric}(i)) \prod_{e \in E_b(i)} \left(\frac{1-F(z_e)}{2}\right)$$

then normalize x and y to get $x/(x+y)$ which can be considered as $Pr(b_i=0)$ in the check node estimation that is presented above.

Likelihood Ratio Approach

Estimate the probability ratio at the bid node, i.e.

$$r = \frac{1-\text{metric}(i)}{\text{metric}(i)} \prod_{e \in E_b(i)} \left(\frac{1-z_e}{z_e}\right) = \frac{1-\text{metric}(i)}{\text{metric}(i)} \prod_{e \in E_b(i)} \left(\frac{1-F(z_e)}{1+F(z_e)}\right)$$

Since r is an estimate of the ratio, $$\frac{Pr(b_i = 1)}{Pr(b_i = 0)},$$

if $x=Pr(b_i=0)$, the following relationship holds true:

$$F(x) = \frac{2Pr(b_i = 0)}{Pr(b_i = 1) + Pr(b_i = 0)} - 1 = \frac{Pr(b_i = 0) - Pr(b_i = 1)}{Pr(b_i = 1) + Pr(b_i = 0)} = \frac{1-r}{1+r}$$

therefore, $$F(x) = \frac{1-r}{1+r}$$

will be passed to the check nodes.

Various alternatives to performing decoding processing of LDPC coded signals according to the invention are presented below with respect to the FIG. 26 and the FIG. 27. For each of these two alternative decoding approaches presented below with respect to the FIG. 26 and the FIG. 27, the decoding processing operates on a received vector that is characterized as $y=(y_0, \ldots y_{n-1})$.

Figure 26:
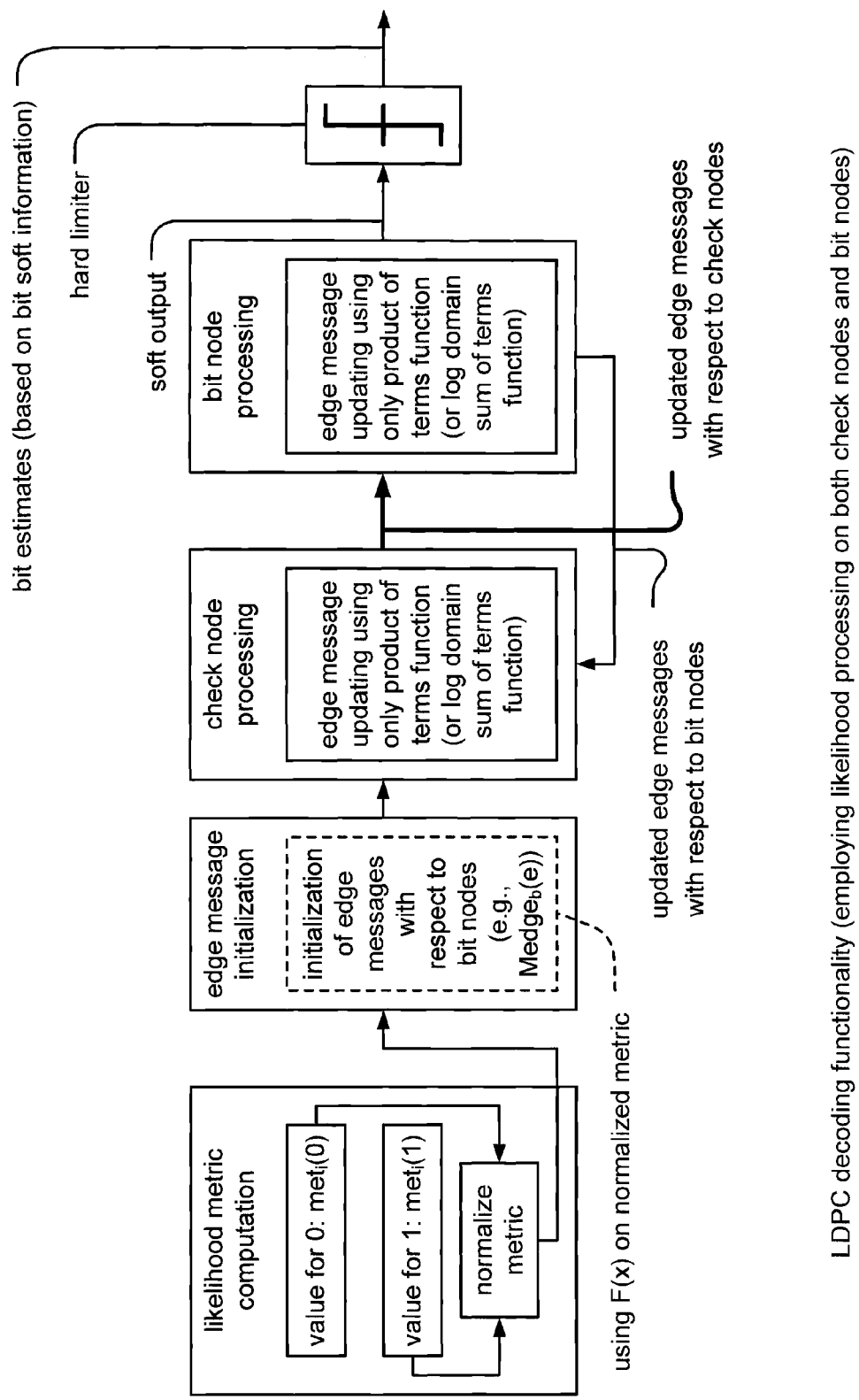
FIG. 26 is a diagram illustrating an embodiment of LDPC decoding functionality (employing likelihood processing on both check nodes and bit nodes) according to the invention.

FIG. 26 is a diagram illustrating an embodiment of LDPC decoding functionality (employing likelihood processing on both check nodes and bit nodes) according to the invention. This decoding processing may be viewed as being performed in 4 separate steps.

Step 1. Compute the metrics $met_i(0), met_i(1)$ for every position $i=0, \ldots n-1$ using y and according to the Gaussian distribution. Each of these metric values, $met_i(0), met_i(1)$, correspond to the supposed values of the received bit as being 1 and as being zero. For example, $met_i(0)$ corresponds to the value for 0, and $met_i(1)$ corresponds to the value for 1. Once each of these metric values are calculated, then the metric is normalized as follows to generate the following normalized metric, metric(i):

$$\text{metric}(i) = \frac{met_i(0)}{met_i(0) + met_i(1)}.$$

Step 2. For every edge e, the edge messages with respect to the bit nodes, $Medge_b(e)$, are initialized. This is performed by using the function, $F(x)$, that is described in more detail above and is shown mathematically as follows:

$Medge_b(e)=F(\text{metric}(b(e)))$.

Step 3. This step directs how edge messages with respect to the check nodes, $Medge_c(e)$, are updated within the iterative decoding processing describe herein. For every check node j, let $E_c(j)$ be the set of all edges connected from the check node j to its corresponding bit nodes. This step then operates to update the edge messages with respect to check nodes, $Medge_c(e)$, using only a product of terms function (or a log domain sum of terms function) that operates on the edge messages with respect to the bit nodes, $Medge_b(e)$. During the first decoding iteration, this updating of the edge messages with respect to check nodes, $Medge_c(e)$, operates by using the initialized edge messages with respect to the bit nodes, $Medge_b(e)$, that are initialized within the Step 2 above. Afterwards, during subsequent decoding iterations, this updating is performed using the subsequently updated edge messages with respect to the bit nodes, $Medge_b(e)$, that have been updated as is described in more detail below with respect to Step 4. The product of terms function used to update the edge messages with respect to the check nodes, $Medge_c(e)$, using the edge messages with respect to the bit nodes, $Medge_b(e)$, is shown mathematically below. Each edge message with respect to the check nodes, $Medge_c(e)$, is updated for every $e \in E_c(j)$ as follows:

$$Medge_c(e) = \prod_{f \in E_c(j) \setminus \{e\}} Medge_b(f) \qquad \text{(EQ 16)}$$

Step 4. This step directs how edge messages with respect to the bit nodes, $Medge_b(e)$, are updated within the iterative decoding processing describe herein. For every bit node i, let $E_b(i)$ be the set of all edges connected from the bit node i to its corresponding check nodes. Compute the following threshold functions:

$$P_i(0) = \text{metric}(i) \prod_{e \in E_b(i)} \left(\frac{Medge_c(e) + 1}{2}\right), \text{ and} \qquad \text{(EQ 17)}$$

$$P_i(1) = (1 - \text{metric}(i)) \prod_{e \in E_b(i)} \left(\frac{1 - Medge_c(e)}{2}\right)$$

For every $e \in E_{b(i)}$, compute the following functions:

$$q_0(e) = \frac{P_i(0)}{\left(\frac{Medge_c(e) + 1}{2}\right)}, q_1(e) = \frac{P_i(0)}{\left(\frac{1 - Medge_c(e)}{2}\right)} \qquad \text{(EQ 18)}$$

The edge messages with respect to the bit nodes, $Medge_b(e)$, are updated using the previously defined function, $F(x)$, as indicated below using the intermediate functions, $q_0(e)$ and $q_1(e)$.

$$Medge_b(e) = F\left(\frac{q_0(e)}{q_0(e) + q_1(e)}\right) \qquad \text{(EQ 19)}$$

If the current decoding iteration is the last decoding iteration (e.g., a final decoding iteration), then this decoding functionality operates by outputting soft information corresponding to the most recently updated edge messages with respect to the bit nodes, $Medge_b(e)$, and making subsequent hard decisions thereon to make a best estimate of the at least one information bit contained within the originally received vector, $y=(y_0, \ldots y_{n-1})$. It is noted that the received vector, $y=(y_0, \ldots y_{n-1})$, is extracted from a received continuous time signal received by a communication device (after having undergone any appropriate preprocessing such as filtering, sampling, demodulation and symbol mapping, and so on). If the current decoding iteration is not in fact the last decoding iteration, then this decoding functionality operates to go back to the Step 3 indicated above. The Step 3 and the Step 4 can continue to operate alternatively to perform iterative decoding processing of updating edge messages with respect to the check nodes, $Medge_c(e)$, and updating edge messages with respect to the bit nodes, $Medge_b(e)$, respectively.

After having performed a last decoding iteration, and when hard decisions are to be made, the hard decisions (e.g., best estimates) that are output for the bit of concern are made using the above-calculated threshold functions as follows:

Output best estimate for bit as $b_i=0$ if $P_i(0) \geq P_i(1)$;

Output best estimate for bit as $b_i=1$ otherwise.

These earlier calculated functions, $P_i(0)$ and $P_i(1)$, may be viewed as being the thresholds by which the final hard decisions are to be made with respect to the bits as being of a value of 0 and a value of 1, respectively.

It is also noted the decoding functionality of this diagram may alternatively be implemented within the log domain as well without departing from the scope and spirit of the invention. This procedure is described below when converted to the log domain. To operate the LDPC decoding according to this particular aspect of the invention within the log domain, the function, $\ln(F(x))$, which is the natural log of $F(x)$, needs to be computed. Since the variable x is the probability, it has a range of $[0,1]$. Therefore, the function $F(x)$ has a range $[-1,1]$. Because of this, the calculations involved within the iterative decoding processing need to deal with the logarithm of a negative number. This may be dealt with as depicted below.

Define a sign function as follows:

$$\text{sign}(x) = \begin{cases} 1 & x \geq 0 \\ -1 & x < 0 \end{cases} \quad \text{(EQ 20)}$$

According to the definition of the natural logarithm, ln, if $x \neq 0$, then the following relationship is true:

$$\ln(x) = \frac{(\text{sign}(x)-1)}{2}\pi i + \ln(|x|) \quad \text{(EQ 21)}$$

Moreover, the following relationship is also employed:

$$\exp(k\pi i) = \begin{cases} -1 & k \text{ is odd} \\ -1 & k \text{ is even} \end{cases}.$$

Then, the following relationship is also true:

$$\ln\left(\sum_{i=1}^{n} x_i\right) = \left(\sum_{i=1}^{n}\left(\frac{\text{sign}(x_i)-1}{2}\right)\right)\pi i + \sum_{i=1}^{n}\ln(|x_i|). \quad \text{(EQ 22)}$$

When actually implementing the calculation of the (EQ 22) shown above, the various components may be separated into two separate parts. For example, a first part that may be calculated is the sign function that is a sum of terms function of the various sign functions, $$\prod_{i=1}^{n} \text{sign}(x_i).$$

A second part that may be calculated is shown as follows:

$$\sum_{i=1}^{n} \ln(|x_i|).$$

When implementing these calculations employed within the iterative decoding processing within the log domain (e.g., within hardware within an actual communication device that performs this LDPC decoding in accordance with these aspects of the invention), the above-provided (EQ 16) may also be separated into two separate parts as well, namely, A and B provided below. That is to say, the total calculation of the (EQ 16) shown above may be replaced by the following two parts.

$$A = \prod_{f \in E_c(j) \setminus \{e\}} \text{sign}(Medge_b(f)), \text{ and}$$

$$B = \sum_{f \in E_c(j) \setminus \{e\}} \ln(Medge_b(f)).$$

A may be viewed as being a product of terms function of the sign functions of the appropriate edge messages with respect to the bit nodes, $Medge_b(e)$; and B may be viewed as being a sum of terms function of the natural log functions of the appropriate edge messages with respect to the bit nodes, $Medge_b(e)$.

Therefore, the actual calculations to perform the updating of the edge messages with respect to the check nodes, $Medge_c(e)$, may be a very straight-forward calculation of these two intermediate values A and B as shown below.

$Medge_c(e) = A\exp(B)$.

Since the function, $F(x)$, has the range $$[-1,1], \frac{F(x)+1}{2},$$

has the range $[0,1]$. Thus the logarithm conversion of the (EQs 17-19) shown above can be carried out over positive values.

An alternative approach to supporting LDPC decoding functionality according to the invention may be provided using the employing the LR (Likelihood Ratio) processing on the bit nodes.

Figure 27:
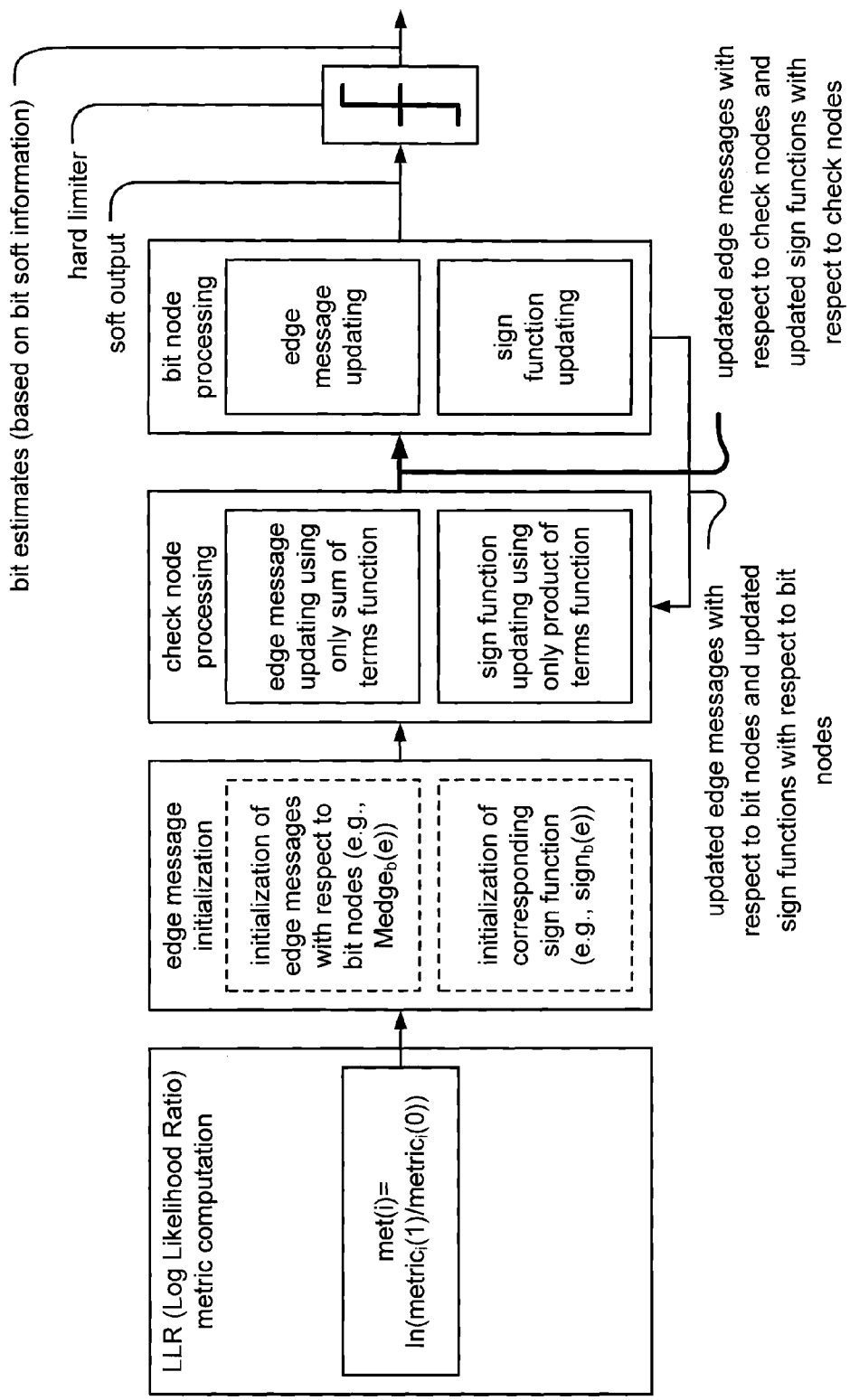
FIG. 27 is a diagram illustrating an embodiment of LDPC decoding functionality (employing LR (Likelihood Ratio) processing on bit nodes) implemented in log domain according to the invention.

FIG. 27 is a diagram illustrating an embodiment of LDPC decoding functionality (employing LR (Likelihood Ratio) processing on bit nodes) implemented in log domain according to the invention. Somewhat analogously to the embodiment described above, the decoding processing of this embodiment may also be viewed as being performed in 4 separate steps. Only the log domain version by which this decoding functionality may be implemented is presented below. Of course, a non-log domain version could also be implemented without departing from the scope and spirit of the invention.

Step 1. the LLR (Log-Likelihood Ratio) metric is calculated as shown below:

$\text{met}(i) = \ln(\text{metric}_i(1)/\text{metric}_i(0))$

This is performed for every position $i=0,\ldots,n-1$ using the received vector y (e.g., $y=(y_0,\ldots y_{n-1})$) and according to the Gaussian distribution.

Step 2. For every edge e, the corresponding edge messages with respect to the bit nodes, $Medge_b(e)$, are initialized. In addition, the sign functions with respect to the bit nodes are also initialized, $sign_b(e)$. These calculations are performed as follows:

$$Medge_b(e) = \ln\left|\frac{1-\exp(met(i))}{1+\exp(met(i))}\right|, sign_b(e) = sign(met(i)). \quad (EQ\ 23)$$

Step 3. For every check node j that is communicatively coupled to its corresponding bit nodes, $E_c(j)$ is the set of all edges connected to that check node j. The decoding processing operates by updating the edge messages with respect to the bit nodes, $Medge_c(e)$, for every $e \in E_c(j)$. These calculations are performed as provided below:

$$Medge_c(e) = \sum_{f \in E_c(j) \setminus \{e\}} Medge_b(f), sign_c(e) = \prod_{f \in E_c(j) \setminus \{e\}} sign_b(f) \quad (EQ\ 24)$$

Step 4. For every bit node i that is communicatively coupled to its corresponding check nodes, $E_b(i)$ is the set of all edges connected to that bit node i. the following threshold function is then computed:

$$P(i) = sign(met(i))\ln\left|\frac{1-\exp(met(i))}{1+\exp(met(i))}\right| += \sum_{e \in E_b(i)} sign_c(e)\ln\left|\frac{1-\exp(Medge_c(e))}{1+\exp(Medge_c(e))}\right| \quad (EQ\ 25)$$

For every $e \in E_b(i)$, compute the following function:

$$q(e) = P(i) - sign_c(e)\ln\left|\frac{1-\exp(Medge_c(e))}{1+\exp(Medge_c(e))}\right| \quad (EQ\ 26)$$

The edge messages with respect to the bit nodes, $Medge_b(e)$, are updated using the intermediate function, q(e), calculated below.

$$Medge_b(e) = \ln\left|\frac{1-\exp(q(e))}{1+\exp(q(e))}\right|, sign_b(e) = -sign(q(e)).$$

If the current decoding iteration is the last decoding iteration, then this decoding functionality operates by outputting soft information corresponding to the most recently updated edge messages with respect to the bit nodes, $Medge_b(e)$, and making subsequent hard decisions thereon to make a best estimate of the at least one information bit contained within the originally received vector, $y=(y_0, \ldots y_{n-1})$. It is noted that the received vector, $y=(y_0, \ldots y_{n-1})$, is extracted from a received continuous time signal received by a communication device (after having undergone any appropriate preprocessing such as filtering, sampling, demodulation and symbol mapping, and so on). If the current decoding iteration is not in fact the last decoding iteration, then this decoding functionality operates to go back to the Step 3 indicated above. The Step 3 and the Step 4 can continue to operate alternatively to perform iterative decoding processing of updating edge messages with respect to the check nodes, $Medge_c(e)$, and updating edge messages with respect to the bit nodes, $Medge_b(e)$, respectively.

After having performed a last decoding iteration, and when hard decisions are to be made, the hard decisions (e.g., best estimates) that are output for the bit of concern are made using the above-calculated threshold functions as follows:

Output best estimate for bit as $b_i=1$ if $P(i) \geq 0$.

Output best estimate for bit as $b_i=0$ otherwise.

This earlier calculated function, P(i), may be viewed as being a threshold by which the final hard decisions are to be made with respect to the bits as being of a value of 0 and a value of 1, respectively.

Figure 28:
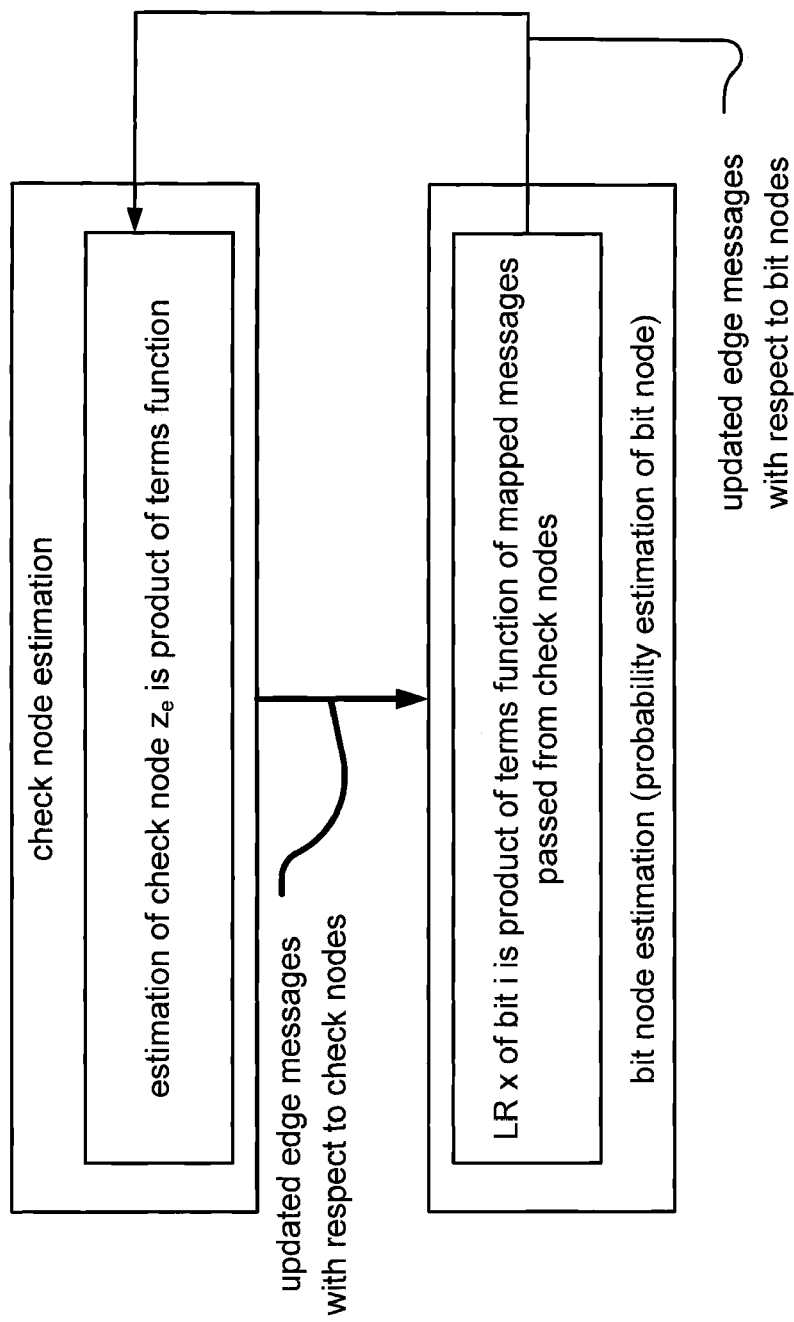
FIG. 28 is a diagram illustrating an embodiment of check node and bit node estimation functionality (employing LR (Likelihood Ratio) decoding at check node side) according to the invention.

FIG. 28 is a diagram illustrating an embodiment of check node and bit node estimation functionality (employing LR (Likelihood Ratio) decoding at check node side) according to the invention. As also described above with respect to the FIG. 25, the manner in which check node estimation and bit node estimation are performed in accordance with the likelihood decoding, the functionality employed when estimating the bit node and estimating the check node within the LDPC decoding processing employed according LR decoding as shown with respect to this diagram. The check node estimate is initially described below.

This description is provided when considering the check node i. $E_c(j)=\{(i_k,j)|k=0,\ldots,n-1\}$ is the set of all edges connecting this check node i to its corresponding bit nodes. The codeword that is being decoded is provided as $b=(b_0, \ldots, b_{N-1})$. By the definition of the parity check according to the LDPC code being employed, the following relationship is true:

$$\sum_{k=0}^{n-1} b_{i_k} = 0 \quad (EQ\ 27)$$

For every edge $e \in E_c(j)$, (which may be represented as $e=(i_0, j)$ for convenience), then the following probability function is calculated $$d_e = Pr\left(\sum_{k=0}^{n-1} b_{i_k} = 0 \mid b_{i_0} = 0\right) = Pr\left(\sum_{k=1}^{n-1} b_{i_k} = 0\right) \quad (EQ\ 28)$$

and $a_k = Pr(b_{i_k}=0)$. Then their respective ratios are provided as follows:

$$z_e = \frac{1-d_e}{d_e} \text{ and } x_k = \frac{1-a_k}{a_k}.$$

When n=3, without lost of generality, let $a=a_1$, $b=a_2$, $x=x_1$ and $y=x_2$, and, then $$z = \frac{(1-a)b+(1-b)a}{ab+(1-a)(1-b)} = \frac{(1-a)/a+(1-b)/b}{1+(1-a)(l-b)/(ab)} = \frac{x+y}{1+xy} \quad (EQ\ 29)$$

The following map, F(x), is defined as follows:

$$F(x) = \frac{1-x}{1+x}, x \neq 1.$$

Based on this definition of the map, F(x), then the map of the variable z if provided as follows (where z is defined in terms of x and y above).

$$F(z) = \frac{1+xy-x-y}{1+xy+x+y} = \left(\frac{1-x}{x+1}\right)\left(\frac{1-y}{1+y}\right) = F(x)F(y) \quad \text{(EQ 30)}$$

In general, let $$e = (i_1, j), d_{n-1} = Pr\left(\sum_{k=0, k\neq l}^{n-1} b_{i_k} = 0\right),$$

and
$z_{n-1} = (1-d_{n-1})/d_{n-1}$, then the following relationship is also true:

$$z_e = \frac{z_{n-1} + x_{n-1}}{z_{n-1}x_{n-1} + 1} \text{ and} \quad \text{(EQ 31)}$$

$$F(z_e) = F(z_{n-1})F(x_{n-1}) = \prod_{k \neq l} F(x_k)$$

As can be seen, the estimate of the check node, $z_c$, is reduced to being a product of terms function within the (EQ 31). This is achieved borrowing on the simplicity in calculation complexity provided by the map, F(x).

In the BP (Belief Propagation) decoding approach, the LR (Likelihood Ratio) x of bit i can be computed by the LR of its corresponding check nodes $z_c$, $e \in E_b(i)$. This LR of the bit i may be calculated using a product of terms function as provided below:

$$x = \prod_{e \in E_b(i)} z_e.$$

Since the edge messages passed from the check nodes are $u_c = F(z_c)$, and since the following relationship is true, $$F(F(u)) = \frac{1 - \frac{1-u}{1+u}}{1 + \frac{1-u}{1+u}} = u \quad \text{(EQ 32)}$$

then, the following simplified calculation may be employed to calculate the LR of bit i (which is represented as x).

$$x = F\left(\prod_{e \in E_b(i)} u_e\right) = \prod_{e \in E_b(i)} F(u_e). \quad \text{(EQ 33)}$$

Again, the LR of the bit i may be calculated using a product of terms function that is also a function of the map, F(x).

Figure 29:
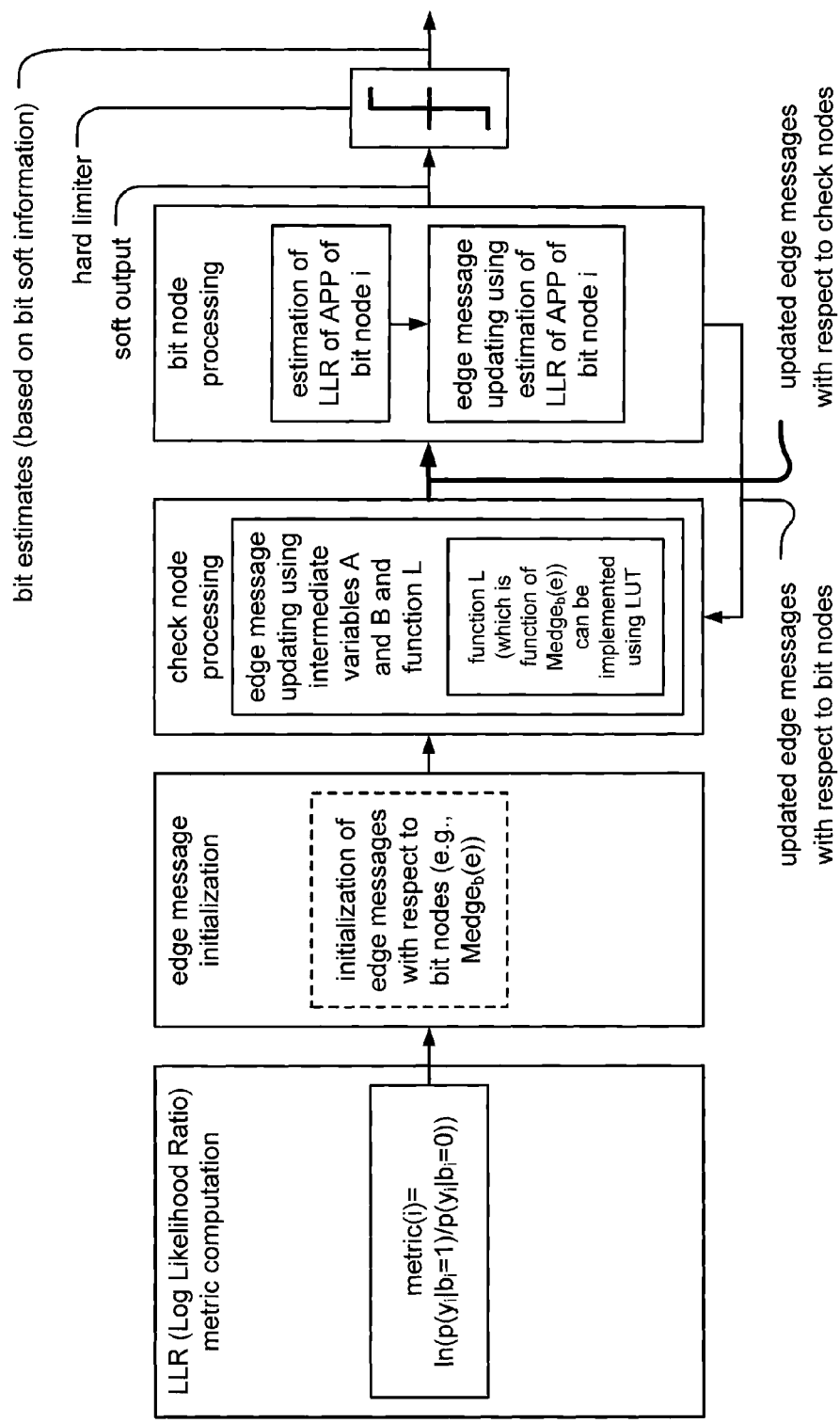
FIG. 29 is a diagram illustrating an embodiment of LDPC decoding functionality (employing LLR (Log Likelihood Ratio) processing) according to the invention.

FIG. 29 is a diagram illustrating an embodiment of LDPC decoding functionality (employing LLR (Log Likelihood Ratio) processing) according to the invention. Again, somewhat analogously to the other decoding embodiments described above, the decoding processing of this particular embodiment may also be viewed as being performed in 4 separate steps. As also within one of the particular embodiments describe above, the log domain version by which this decoding functionality may be implemented is presented below. Of course, a non-log domain version could also be implemented without departing from the scope and spirit of the invention.

To perform the computations involved with this embodiment within the log domain, it is once again necessary to accommodate the logarithm of a negative value as is also discussed above within another embodiment.

In the following description, only the LLR (Log-Likelihood Ratio) decoding approach is presented. A LR (Likelihood Ratio) decoding approach may similarly be employed as is described with respect to the diagram and accompanying description of the FIG. 27.

Before the decoding procedure corresponding to this embodiment is presented within greater detail, a new function, L, is defined. This new function, L, is a function of the edge messages with respect to the bit nodes, Medge$_b$(e). This new function, L, is presented below:

$$L(x) = \ln\left|\frac{1-\exp(x)}{1+\exp(x)}\right| \quad \text{(EQ 34)}$$

In a hardware implementation (e.g., within an actual communication device that performs decoding according to this approach), this function, L, can be realized by a LUT (look-up table). This LUT may be implemented using any of a variety of means including ROM (Read Only Memory) and/or various other types of memory.

Moreover, the following intermediate variables, A and B, are defined as follows:

$A=\text{sign}(F(x))$, and $B=\ln|F(x)|$.

Using these intermediate variables, A and B, the map, F(x), may be calculated as follows:

$F(x)=A \exp(B)$. Since $0 \leq x \leq 1$, then the map, F(x), has the following range $|F(x)| \leq 1$. Therefore, the intermediate variable, B, has the following range $B<0$. Then, the following relationship is also true.

$$\ln(F(F(x))) = \quad \text{(EQ 35)}$$
$$\ln\left|\frac{1 - A\exp(B)}{1 + A\exp(B)}\right| = A \times L(B) = \text{sign}(F(x)) \times L(\ln|F(x)|)$$

The LLR (Log-Likelihood Ratio) decoding procedure is provided below with respect to this diagram. Again, as within other embodiments, the decoding processing may be viewed as being performed in 4 separate steps. As also within other embodiments described above, the decoding processing of this embodiment operates on a received vector y (e.g., where $y=(y_0, \ldots y_{N-1})$ is the received vector).

Step 1. The LLR metric is computed for every position $i = 0, \ldots, n-1$ using the received vector, y, and according to the Gaussian distribution. For example, this metric may be calculated as follows:

$$\text{metric}(i) = \log\frac{p(y_i \mid b_i = 1)}{p(y_i \mid b_i = 0)} = \frac{2}{\sigma^2}y_i \quad \text{(EQ 36)}$$

Step 2. For every edge e, the edge messages with respect to the bit nodes, $Medge_b(e)$, are initialized using the above-calculated metric as follows:

$$Medge_b(e) = metric(b(e)).$$

Step 3. For every check node j, $E_c(j)$ is the set of all of the edges connected from the check node j to its corresponding bit nodes. The following intermediate variables, A and B, are calculated as follows:

$$A = \prod_{e \in E_c(j)} sign(Medge_b(e)), \text{ and } B = \sum_{e \in E_c(j)} L(Medge_b(e)).$$

The edge messages with respect to the check nodes, $Medge_c(e)$, are updated for every $e \in E_c(j)$ as follows:

$$Medge_c(e) = A \times sign(Medge_b(e)) \times L(B - L(Medge_b(e))) \qquad (EQ\ 37)$$

Step 4. For every bit node i, let $E_b(i)$ be the set of all edges connected from this bit node i to its corresponding check nodes. The estimate of the LLR, $r_i$, and the APP (a posteriori probability) of the bit node i may be calculated as follows:

$$r_i = metric(i) + \sum_{e \in E_b(i)} Medge_c(e) \qquad (EQ\ 38)$$

The estimate of the LLR, $r_i$, may be viewed as being a threshold function for subsequent hard decision making of individual bits of a codeword.

The edge messages with respect to the bit nodes, $Medge_b(e)$, are updated for every $e \in E_b(i)$ using the estimate of the LLR, $r_i$, as follows:

$$Medge_b(e) = r_i - Medge_c(e) \qquad (EQ\ 39)$$

If the current decoding iteration is the last decoding iteration, then this decoding functionality operates by outputting soft information corresponding to the most recently updated edge messages with respect to the bit nodes, $Medge_b(e)$, and making subsequent hard decisions thereon to make a best estimate of the at least one information bit contained within the originally received vector, $y=(y_0, \ldots y_{n-1})$. Again, as within other of the embodiments described herein, it is noted that the received vector, $y=(y_0, \ldots y_{n-1})$, is extracted from a received continuous time signal received by a communication device (after having undergone any appropriate preprocessing such as filtering, sampling, demodulation and symbol mapping, and so on). If the current decoding iteration is not in fact the last decoding iteration, then this decoding functionality operates to go back to the Step 3 indicated above. The Step 3 and the Step 4 can continue to operate alternatively to perform iterative decoding processing of updating edge messages with respect to the check nodes, $Medge_c(e)$, and updating edge messages with respect to the bit nodes, $Medge_b(e)$, respectively.

After having performed a last decoding iteration, and when hard decisions are to be made, the hard decisions (e.g., best estimates) that are output for the bit of concern are made using the above-calculated threshold functions as follows:

Output best estimate for bit as $b_i = 1$ if $r_i \geq 0$.

Output best estimate for bit as $b_i = 0$ otherwise.

This earlier calculated estimate of the LLR, $r_i$, may be viewed as being a threshold by which the final hard decisions are to be made with respect to the bits as being of a value of 0 and a value of 1, respectively.

Figure 30:
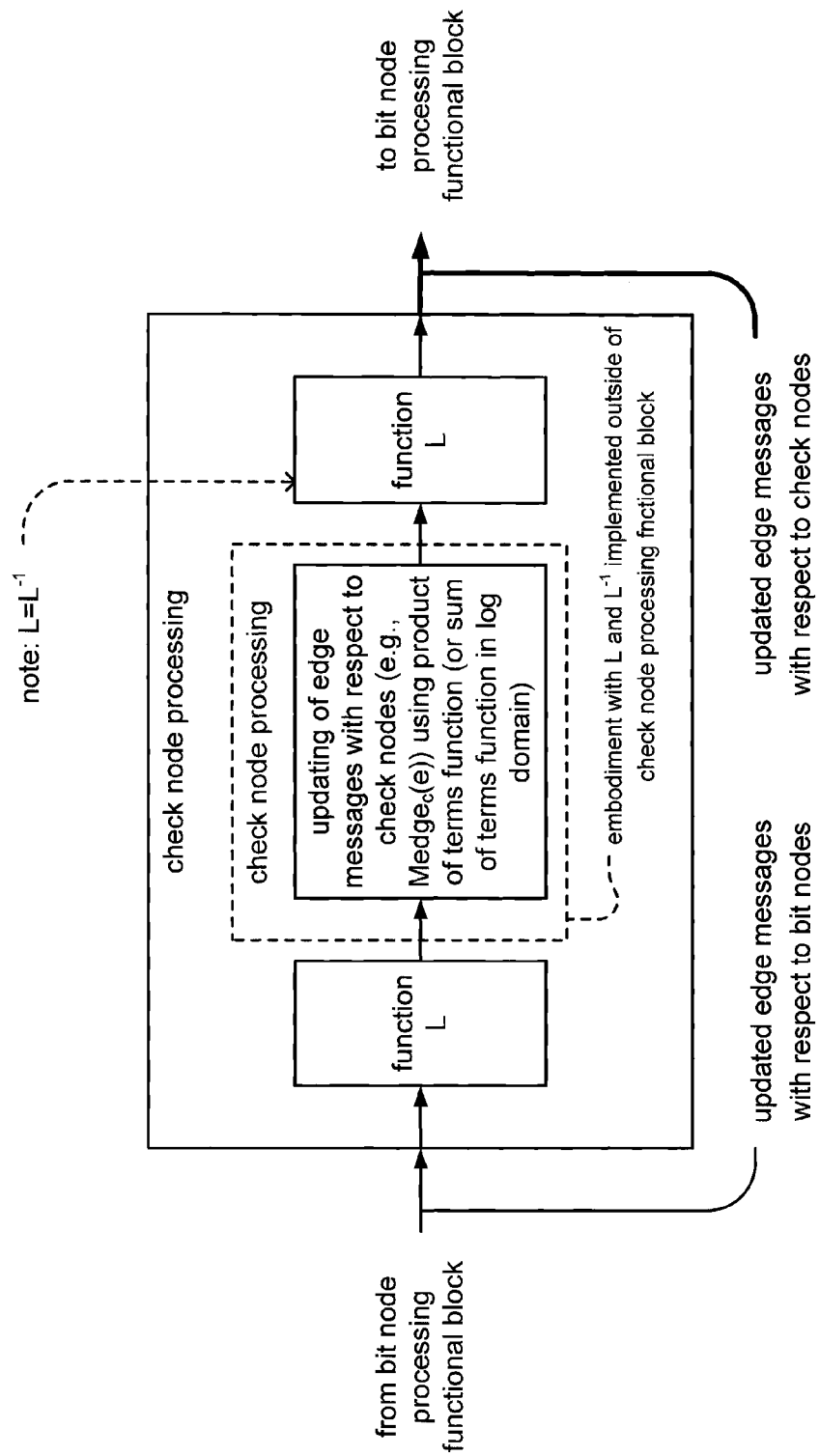
FIG. 30 is a diagram illustrating an embodiment of check node processing functionality employing function L (shown using LDPC decoding employing LLR processing) according to the invention.

FIG. 30 is a diagram illustrating an embodiment of check node processing functionality employing function, L, (shown using LDPC decoding employing LLR processing) according to the invention. This diagram may be viewed with respect to the check node processing functional block shown and described within the preceding diagram. The function, L, operates to transform the incoming edge messages with respect to the bit nodes, $Medge_b(e)$, such that the calculations that are necessary to perform updating of the edge messages with respect to the check nodes, $Medge_c(e)$, may be performed using only a product of terms function. Alternatively, this function, L, operates to transform the incoming edge messages with respect to the bit nodes, $Medge_b(e)$, such that the calculations that are necessary to perform updating of the edge messages with respect to the check nodes, $Medge_c(e)$, may be performed using only a sum of terms function when implemented within the log domain.

After the edge messages with respect to the bit nodes, $Medge_b(e)$, have been transformed using the function, L, the edge messages with respect to the check nodes, $Medge_c(e)$, are updated within the check node processing functional block using the appropriately transformed edge messages with respect to the bit nodes, $Medge_b(e)$. This updating of the edge messages with respect to the check nodes, $Medge_c(e)$, may now be performed using only a product of terms function. Alternatively, this updating of the edge messages with respect to the check nodes, $Medge_c(e)$, may now be performed using only a sum of terms function when implemented in the log domain.

After the edge messages with respect to the check nodes, $Medge_c(e)$, have been updated, then the now-updated edge messages with respect to the check nodes, $Medge_c(e)$, are passed again through the function, L; it is noted that the function L and the inverse of L are the same function e.g., $L = L^{-1}$ (as can also be seen from the description above). Therefore, the functional block portion that is used to implemented the function L may also be used again (when performing the operation of $L^{-1}$) to transform to and from the domain that allows the use of a product of terms function only (or a sum of terms function only, when implemented within the log domain).

It is also noted that the functionality of the function, L, may be implemented within the check node processing functional block or outside of the check node processing functional block. That is to say, when implementing a device to perform the functionality described within this embodiment, the function, L, may be implemented within a processor and/or circuitry that performs the check node processing. Alternatively, the function, L, may be implemented using a different circuitry portion that is external to the check node processing functional block. In whichever implementation, the function, L, enables the use of a product of terms function (or sum of terms function within the log domain) when updating the edge messages with respect to the check nodes, $Medge_c(e)$, within the check node processing functional block.

Figure 31A:
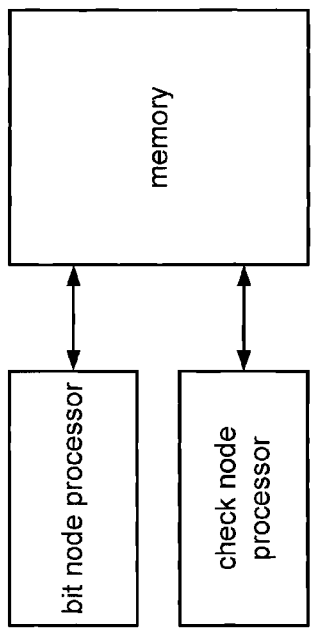
FIG. 31A is a diagram illustrating an embodiment of separate check node processing and bit node processing functional blocks.

FIG. 31A is a diagram illustrating an embodiment of separate check node processing and bit node processing functional blocks. In typical embodiments, two separate circuitry portions are required to perform updating of the edge messages with respect to the check nodes, $Medge_c(e)$, and updating of the edge messages with respect to the bit nodes, $Medge_b(e)$, respectively. More specifically, in most prior art approaches, the use of a single circuitry portion, or bit node processor, operates to perform the updating to the edge messages with respect to the bit nodes, $Medge_b(e)$. Similarly, the use of a single circuitry portion, or check node processor, operates to perform the updating to the edge messages with respect to the check nodes, $Medge_c(e)$. Each of these single circuitry portions, or the bit node processor and the check node processor, is typically communicatively coupled to a memory portion to assist in the memory management of the edge messages that are passed back and forth between each of these two separate circuitry portions, or the bit node processor and the check node processor.

Figure 31B:
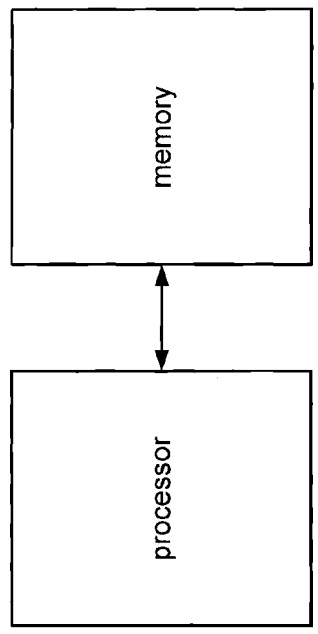
FIG. 31B is a diagram illustrating an embodiment of a single functional block that is operable to perform calculations of both check node processing and bit node processing according to the invention.

FIG. 31B is a diagram illustrating an embodiment of a single functional block that is operable to perform calculations of both check node processing and bit node processing according to the invention. The use of the novel function, L, allows for the use of a single circuitry portion, or processor, to perform the calculations necessary for both bit node processing and check node processing. This single circuitry portion, or processor, may be communicatively coupled to a memory portion to assist in the memory management of the edge messages that are passed back and forth between this single circuitry portion when performing the updating to the edge messages with respect to the check nodes, $Medge_c(e)$, and the updating of the edge messages with respect to the bit nodes, $Medge_b(e)$.

By using this new function, L, the same circuitry portion, or processor, can be used to perform edge message initialization, check node processing, and also bit processing. This is a significant departure from any decoding approach within the prior art for decoding LDPC coded signals. The use of a single circuitry portion can significantly reduce the total hardware that is required to implement a communication device operable to decode LDPC coded signals.

Figure 32:
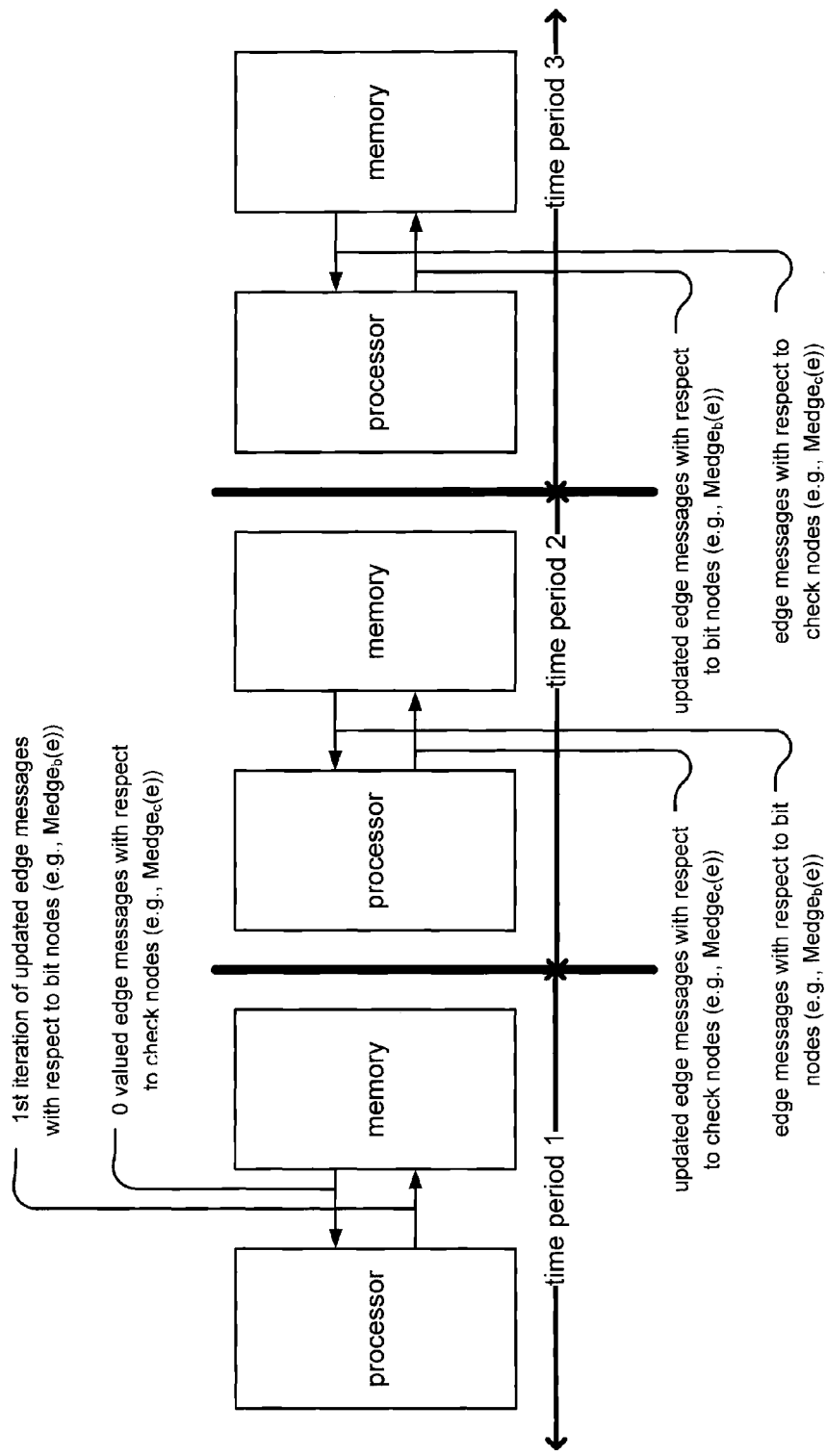
FIG. 32 is a diagram illustrating an embodiment of a single functional block (e.g., processor) that is operable to perform calculations for edge message initialization, check node processing, and bit node processing according to the invention.

FIG. 32 is a diagram illustrating an embodiment of a single functional block (e.g., processor) that is operable to perform calculations for edge message initialization, check node processing, and bit node processing according to the invention. This diagram shows the exchange of data to and from memory and a single circuitry portion, or processor, that is operable to perform calculations for edge message initialization, check node processing, and bit node processing according.

During a first time period, edge message initialization is performed. Zero (e.g., 0) valued edge messages with respect to the check nodes, $Medge_c(e)$, are received by the processor from the memory, and a $1^{st}$ decoding iteration of updating edge messages with respect to the bit nodes, $Medge_b(e)$, is performed. These updated edge messages with respect to the bit nodes, $Medge_b(e)$ are passed back to the memory for subsequent retrieval and use by the processor when performing updating of the edge messages with respect to the check nodes, $Medge_c(e)$.

During a second time period, the recently updated edge messages with respect to the bit nodes, $Medge_b(e)$, are received by the processor from memory. These edge messages with respect to the bit nodes, $Medge_b(e)$, undergo the appropriate transformation by the function, L, so that the updating of the edge messages with respect to the check nodes, $Medge_c(e)$, may be performed using only a product of terms function (or sum of terms function within the log domain). After the edge messages with respect to the check nodes, $Medge_c(e)$, have been updated within the processor, they are again passed through the function, L, before being stored back in memory for subsequent retrieval and use by the processor when performing updating of the edge messages with respect to the bit nodes, $Medge_b(e)$. The processing during this time period may be viewed as being a $1^{st}$ decoding iteration of updating edge messages with respect to the check nodes, $Medge_c(e)$.

During a third time period, the recently updated edge messages with respect to the check nodes, $Medge_c(e)$, are received by the processor from memory. The edge messages with respect to the bit nodes, $Medge_b(e)$, are then updated using the bit node processing functionality within the processor. After the edge messages with respect to the bit nodes, $Medge_b(e)$, have been updated within the processor, they are again passed back to memory for subsequent retrieval and use by the processor when performing updating of the edge messages with respect to the check nodes, $Medge_c(e)$, during the next decoding iteration. The processing during this time period may be viewed as being a $2^{nd}$ decoding iteration of updating edge messages with respect to the bit nodes, $Medge_b(e)$.

It is noted that the processing that is performed during the edge message initialization and the bit node processing is identical with the exception that 0 valued edge messages with respect to the check nodes, $Medge_c(e)$, are employed during edge message initialization. During subsequent decoding iterations of bit node processing, the most recently updated edge messages with respect to the check nodes, $Medge_c(e)$, are employed during bit node processing.

Figure 33:
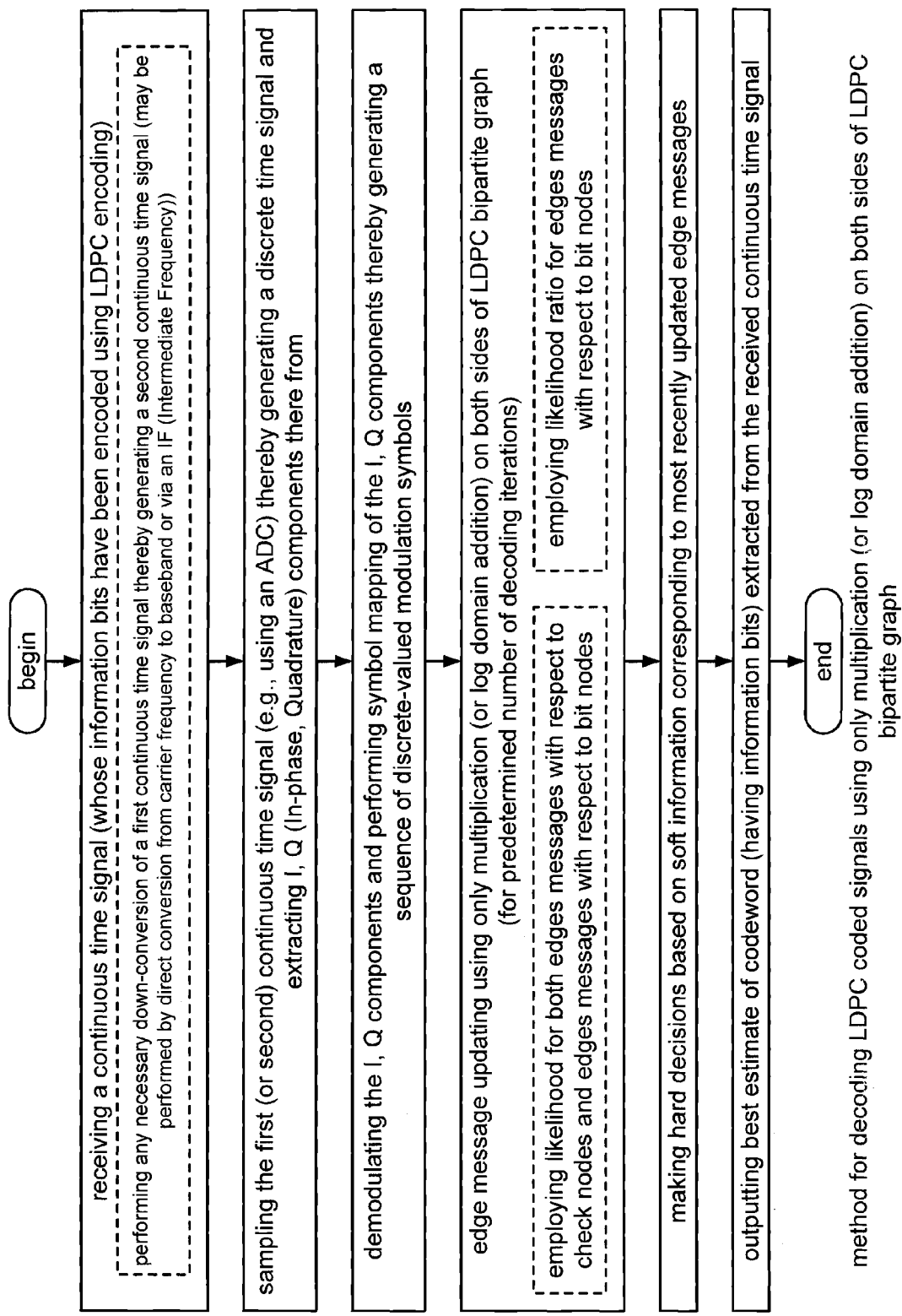
FIG. 33 is a flowchart illustrating an embodiment of a method for decoding LDPC coded signals using only multiplication (or log domain addition) on both sides of LDPC bipartite graph according to the invention.

FIG. 33 is a flowchart illustrating an embodiment of a method for decoding LDPC coded signals using only multiplication (or log domain addition) on both sides of LDPC bipartite graph according to the invention. The method involves receiving a continuous time signal. The information bits that have been encoded within this continuous time signal have been encoded using LDPC encoding. This LDPC encoding may be viewed as being parallel-block LDPC encoding. Upon the receiving of this continuous time signal, it is also noted that the method may involve performing any necessary down-conversion of a first continuous time signal (e.g., the originally received continuous time signal) thereby generating a second continuous time signal. This down conversion may be performed by direct conversion from carrier frequency to baseband, or it may alternatively be performed by passing through an IF (Intermediate Frequency) as well without departing from the scope and spirit of the invention.

The method then involves sampling the first (or second) continuous time signal (e.g., using an ADC) thereby generating a discrete time signal and extracting I, Q (In-phase, Quadrature) components there from. The method then also involves demodulating the I, Q components and performing symbol mapping of the I, Q components thereby generating a sequence of discrete-valued modulation symbols.

The method then involves performing edge message updating using only multiplication (or log domain addition) on both sides of LDPC bipartite graph. This is performed for predetermined number of decoding iterations within this particular embodiment. This updating may be performed a number of ways. For example, the method may involve employing likelihood for both edges messages with respect to check nodes and edges messages with respect to bit nodes. Alternatively, the method may involve employing likelihood ratio for edges messages with respect to bit nodes.

The method also involves making hard decisions based on soft information corresponding to the finally updated edge messages. Using these hard decisions, the method then involves outputting a best estimate of the transmitted codeword (having at least one information bit included therein) that is extracted from the received continuous time signal.

Figure 34:
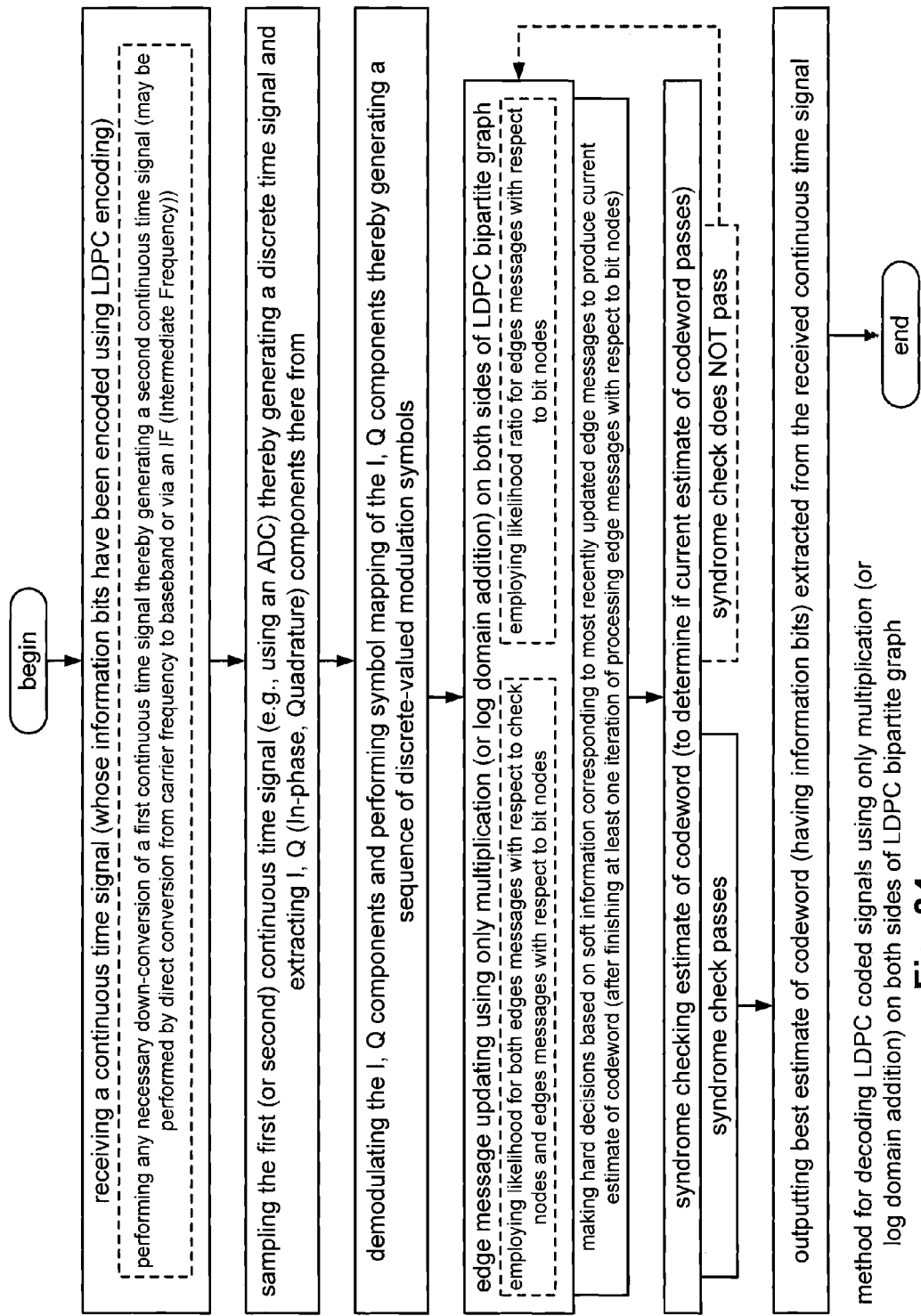
FIG. 34 is a flowchart illustrating an alternative embodiment of a method for decoding LDPC coded signals using only multiplication (or log domain addition) on both sides of LDPC bipartite graph according to the invention.

FIG. 34 is a flowchart illustrating an alternative embodiment of a method for decoding LDPC coded signals using only multiplication (or log domain addition) on both sides of LDPC bipartite graph according to the invention. Initially, this particular method operates very similarly to the embodiment described above with respect to the FIG. 34. The method involves receiving a continuous time signal. The information bits that have been encoded within this continuous time signal have been encoded using LDPC encoding. This LDPC encoding may be viewed as being parallel-block LDPC encoding. Upon the receiving of this continuous time signal, it is also noted that the method may involve performing any necessary down-conversion of a first continuous time signal (e.g., the originally received continuous time signal) thereby generating a second continuous time signal. This down conversion may be performed by direct conversion from carrier frequency to baseband, or it may alternatively be performed by passing through an IF (Intermediate Frequency) as well without departing from the scope and spirit of the invention.

The method then involves sampling the first (or second) continuous time signal (e.g., using an ADC) thereby generating a discrete time signal and extracting I, Q (In-phase, Quadrature) components there from. The method then also involves demodulating the I, Q components and performing symbol mapping of the I, Q components thereby generating a sequence of discrete-valued modulation symbols.

The method then involves performing edge message updating using only multiplication (or log domain addition) on both sides of LDPC bipartite graph. This updating may be performed a number of ways. For example, the method may involve employing likelihood for both edges messages with respect to check nodes and edges messages with respect to bit nodes. Alternatively, the method may involve employing likelihood ratio for edges messages with respect to bit nodes.

However, this method now departs from the operation of the method of the FIG. 33. In this particular embodiment, the method involves making hard decisions based on soft information corresponding to edge messages to produce a current estimate of the codeword. It is noted that this is performed after bit engine processing has finished at least one decoding iteration. After this current estimate of the codeword is made, then the method involves performing syndrome checking of the current estimate of the codeword. This is performed to determine if this current estimate of the codeword indeed passes the syndrome check. If the syndrome check does NOT pass, then the method involves returning to the edge message updating using only multiplication (or log domain addition) on both sides of LDPC bipartite graph. However, if it is found that the syndrome check does in fact pass, then the method involves outputting a best estimate of the transmitted codeword (having at least one information bit included therein) that is extracted from the received continuous time signal.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and thereby enabling division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A decoder that is operable to decode an LDPC (Low Density Parity Check) coded signal, the decoder comprising:

a check node processing module that is operable to update a first check edge message using a plurality of bit edge messages by calculating a product of terms function wherein those terms correspond to the plurality of bit edge messages thereby generating a second check edge message; and a bit node processing module that is operable to update a first bit edge message of the plurality of bit edge messages using a plurality of check edge messages, that includes the second check edge message, thereby generating a second bit edge message; and wherein:

the second bit edge message is employed to make a soft estimate of at least one information bit encoded within the LDPC coded signal.

2. The decoder of claim 1, wherein:
the bit edge message is an initialized bit edge message.

3. The decoder of claim 1, wherein:
the first bit edge message corresponds to a first edge that couples a first bit node to a first check node within an LDPC bipartite graph that corresponds to an LDPC code by which the LDPC coded signal is generated; and the first check edge message corresponds to a second edge that couples a second check node to a second bit node within the LDPC bipartite graph that corresponds to the LDPC code by which the LDPC coded signal is generated.

4. The decoder of claim 1, wherein:
the check node processing module and the bit node processing module are implemented within a single processor that is operable to perform both check node processing and bit node processing.

5. The decoder of claim 1, wherein:
the check node processing module and the bit node processing module are implemented within a single processor that is operable to perform both check node processing and bit node processing; and the single processor is operable to generate the first bit edge message which is an initialized bit edge message.

6. The decoder of claim 1, further comprising:
a hard limiter that is operable to make a hard estimate of the soft estimate of at least one information bit encoded within the LDPC coded signal; and a syndrome calculator module that is operable to employ the hard estimate to determine whether each syndrome of a plurality of syndromes associated with the LDPC code is equal to zero; and wherein:

when, during a decoding iteration, the syndrome calculator determines that each syndrome of the plurality of syndromes associated with the LDPC code is equal to zero, then the decoding iteration is a final decoding iteration; and when, during the decoding iteration, the syndrome calculator determines that each syndrome of the plurality of syndromes associated with the LDPC code is not equal to zero, then the decoder is operable to perform at least one additional decoding iteration.

7. The decoder of claim 1, wherein:
the bit node processing module is operable to perform likelihood processing when updating the first bit edge message; and the check node processing module is operable to perform likelihood processing when updating the first check edge message.

8. The decoder of claim 1, wherein:
the decoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

9. A decoder that is operable to decode an LDPC (Low Density Parity Check) coded signal, the decoder comprising:
   a check node processing module that is operable to update a first check edge message using a plurality of bit edge messages while operating in a logarithmic domain by calculating a sum of terms function wherein those terms correspond to the plurality of bit edge messages thereby generating a second check edge message; and
   a bit node processing module that is operable to update a first bit edge message of the plurality of bit edge messages using a plurality of check edge messages, that includes the second edge message, thereby generating a second bit edge message; and wherein:
   the second bit edge message is employed to make a soft estimate of at least one information bit encoded within the LDPC coded signal.

10. The decoder of claim 9, wherein:
    the first bit edge message corresponds to a first edge that couples a first bit node to a first check node within an LDPC bipartite graph that corresponds to an LDPC code by which the LDPC coded signal is generated; and
    the first check edge message corresponds to a second edge that couples a second check node to a second bit node within the LDPC bipartite graph that corresponds to the LDPC code by which the LDPC coded signal is generated.

11. The decoder of claim 9, wherein:
    the check node processing module and the bit node processing module are implemented within a single processor that is operable to perform both check node processing and bit node processing.

12. The decoder of claim 9, wherein:
    the check node processing module and the bit node processing module are implemented within a single processor that is operable to perform both check node processing and bit node processing; and
    the single processor is operable to generate the first bit edge message which is an initialized bit edge message.

13. The decoder of claim 9, further comprising:
    a hard limiter that is operable to make a hard estimate of the soft estimate of at least one information bit encoded within the LDPC coded signal; and
    a syndrome calculator module that is operable to employ the hard estimate to determine whether each syndrome of a plurality of syndromes associated with the LDPC code is equal to zero; and wherein:
    when, during a decoding iteration, the syndrome calculator determines that each syndrome of the plurality of syndromes associated with the LDPC code is equal to zero, then the decoding iteration is a final decoding iteration; and
    when, during the decoding iteration, the syndrome calculator determines that each syndrome of the plurality of syndromes associated with the LDPC code is not equal to zero, then the decoder is operable to perform at least one additional decoding iteration.

14. The decoder of claim 9, wherein:
    the bit node processing module is operable to perform likelihood processing when updating the first bit edge message; and
    the check node processing module is operable to perform likelihood processing when updating the first check edge message.

15. The decoder of claim 9, wherein:
    the decoder is implemented within a communication device; and
    the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

16. A method for decoding an LDPC (Low Density Parity Check) coded signal, the method comprising:
    performing check node processing that includes updating a first check edge message using a plurality of bit edge messages by calculating a product of terms function wherein those terms correspond to the plurality of bit edge messages thereby generating a second check edge message; and
    performing bit node processing that includes updating a first bit edge message of the plurality of bit edge messages using a plurality of check edge messages, that includes the second check edge message, thereby generating a second bit edge message; and
    employing the second bit edge message to make a soft estimate of at least one information bit encoded within the LDPC coded signal.

17. The method of claim 16, wherein:
    the check node processing and the bit node processing are both performed within a single processor.

18. The method of claim 16, wherein:
    the first bit edge message corresponds to a first edge that couples a first bit node to a first check node within an LDPC bipartite graph that corresponds to an LDPC code by which the LDPC coded signal is generated; and
    the first check edge message corresponds to a second edge that couples a second check node to a second bit node within the LDPC bipartite graph that corresponds to the LDPC code by which the LDPC coded signal is generated.

19. The method of claim 16, further comprising:
    making a hard estimate of the soft estimate of at least one information bit encoded within the LDPC coded signal;
    employing the hard estimate to determine whether each syndrome of a plurality of syndromes associated with the LDPC code is equal to zero;
    when, during a decoding iteration, it is determined that each syndrome of the plurality of syndromes associated with the LDPC code is equal to zero, identifying the decoding iteration as a final decoding iteration; and
    when, during the decoding iteration, it is determined that each syndrome of the plurality of syndromes associated with the LDPC code is not equal to zero, performing at least one additional decoding iteration.

20. The method of claim 16, wherein:

the method is performed within a decoder;

the decoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

* * * * *